United States Patent [19]

Omura et al.

[11] Patent Number: 5,548,150
[45] Date of Patent: Aug. 20, 1996

[54] FIELD EFFECT TRANSISTOR

[75] Inventors: Ichiro Omura, Yokohama; Akio Nakagawa, Hiratsuka; Tadashi Sakai, Yokohama; Masayuki Sekimura; Hideyuki Funaki, both of Tokyo, all of Japan

[73] Assignee: Kabushiki Kaisha Toshiba, Kawasaki, Japan

[21] Appl. No.: 425,246

[22] Filed: Apr. 17, 1995

Related U.S. Application Data

[63] Continuation of Ser. No. 207,849, Mar. 9, 1994, abandoned.

[30]  Foreign Application Priority Data

| Mar. 10, 1993 | [JP] | Japan | 5-049537 |
| Mar. 12, 1993 | [JP] | Japan | 5-079114 |
| Sep. 13, 1993 | [JP] | Japan | 5-227064 |
| Sep. 17, 1993 | [JP] | Japan | 5-231281 |

[51] Int. Cl.$^6$ .................... H01L 27/01; H01L 27/12
[52] U.S. Cl. .................... 257/349; 257/340; 257/339; 257/342; 257/343; 257/386; 257/397; 257/520; 257/901; 257/66; 257/347
[58] Field of Search .................... 257/340, 343, 257/137, 138, 162, 141, 401, 353, 354, 386, 407, 397, 520, 524, 342, 901, 349, 66, 347, 342, 339

[56]  References Cited

U.S. PATENT DOCUMENTS

| 3,673,471 | 6/1972 | Klein et al. | 257/407 |
| 4,042,945 | 8/1977 | Lin et al. | 257/407 |
| 4,922,327 | 5/1990 | Mena et al. | 257/342 |
| 4,982,263 | 1/1991 | Spratt et al. | 257/524 |
| 5,068,700 | 11/1991 | Yamaguchi et al. | 257/343 |
| 5,113,236 | 5/1992 | Arnold et al. | 257/492 |
| 5,160,989 | 11/1992 | Houston | 257/349 |
| 5,241,210 | 8/1993 | Nakagawa et al. | 257/520 |
| 5,241,211 | 8/1993 | Tashiro | 257/347 |
| 5,276,338 | 1/1994 | Beger et al. | 257/524 |
| 5,315,134 | 5/1994 | Ogura et al. | 257/137 |
| 5,329,142 | 7/1994 | Kitagawa et al. | 257/137 |

FOREIGN PATENT DOCUMENTS

| 56-150854 | 11/1981 | Japan | 257/407 |
| 61-18165 | 1/1986 | Japan | 257/66 |
| 1-238062 | 9/1989 | Japan | 257/343 |
| 1-238066 | 9/1989 | Japan | 257/354 |
| 2-214165 | 8/1990 | Japan | 257/347 |

OTHER PUBLICATIONS

"Highly Efficient 1.5GHz Si Power MOSFET for Digital Cellular Front End", Isao Yoshida et al., Proceedings of 1992 International Symposium on Power Semiconductor Devices & ICs, pp. 156–157, May 19, 1992.

"3-D High-Voltage CMOS ICS By Recrystallized SOI Merged With Bulk Control-Unit, S. Kawamura, et al., IEDM" 87 Technical Digest, 33.1:758–761, 1987.

*Primary Examiner*—Jerome Jackson
*Assistant Examiner*—John Guay
*Attorney, Agent, or Firm*—Finnegan, Henderson, Farabow, Garrett & Dunner, L.L.P.

[57]  ABSTRACT

A high-resistant p-silicon layer is formed on a silicon substrate through a silicon oxide film. N-source and n-drain layers are selectively formed in the surface of the high-resistant p-silicon layer. A gate electrode is formed through a gate insulating film on a channel region between the source and drain layers. To induce an n-inverted layer under the gate electrode, a p-base layer is formed in the high-resistant p-silicon layer. A depletion layer extending from a pn junction between the n-drain layer and the high-resistant p-silicon layer reaches the silicon oxide film in a thermal equilibrium state. Part of the high-resistant p-silicon layer extends into a channel region between the drain and base layers. The drain and base layers are connected to each other through part of the depletion layer in the thermal equilibrium state. A field effect transistor having a high-speed operation is provided.

20 Claims, 50 Drawing Sheets

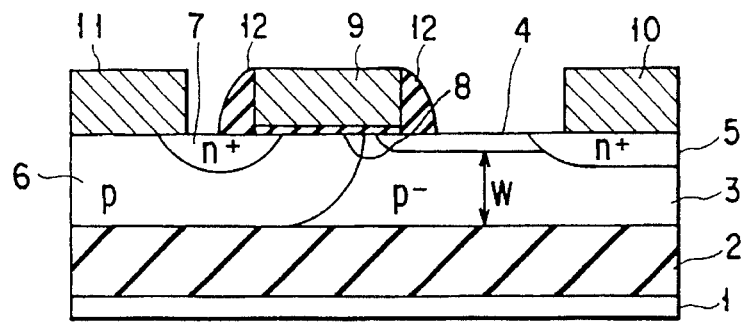
F I G. 1
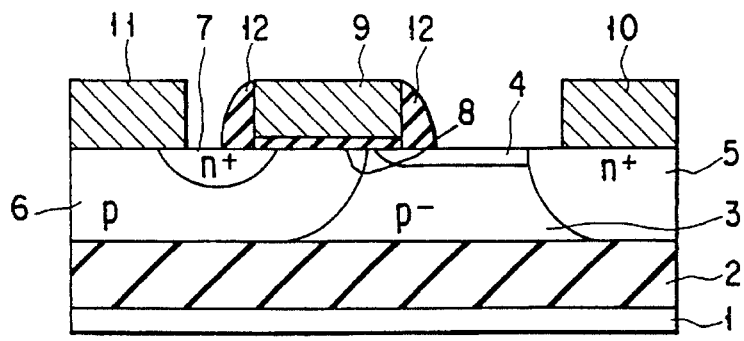
F I G. 2
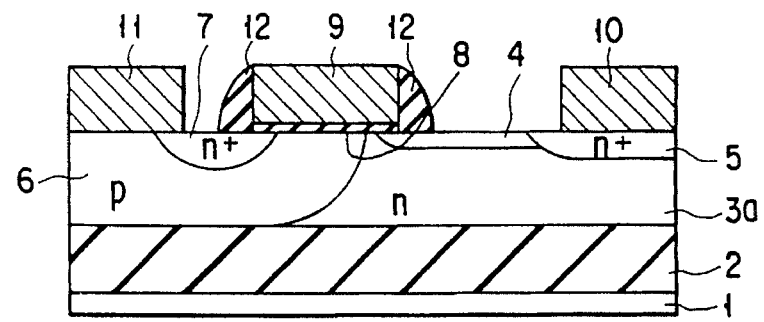
F I G. 3
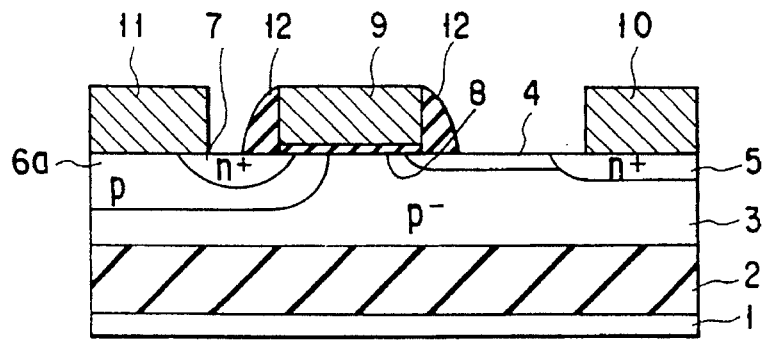
F I G. 4

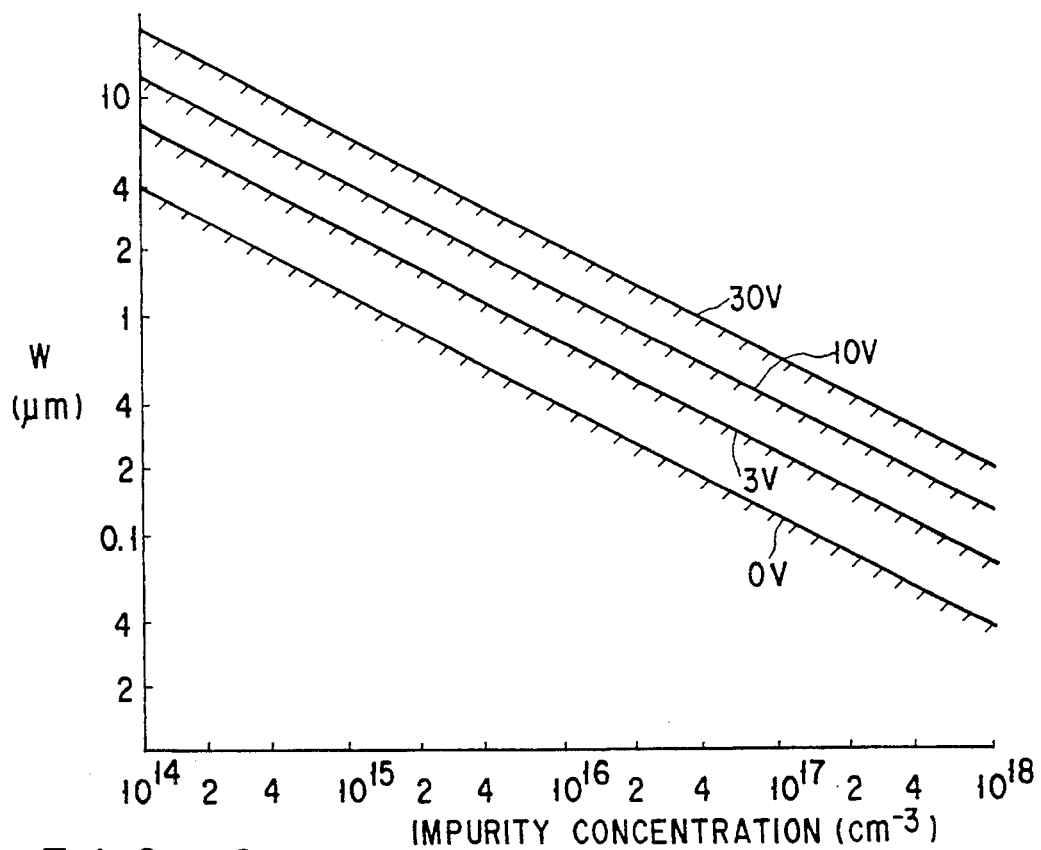
F I G. 8
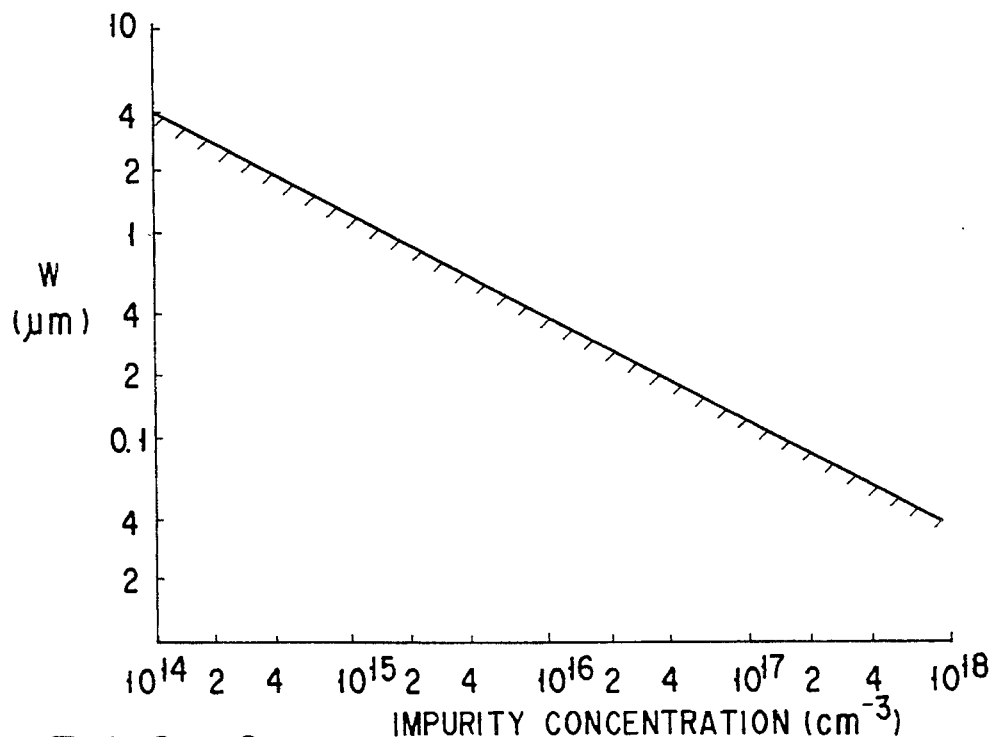
F I G. 9

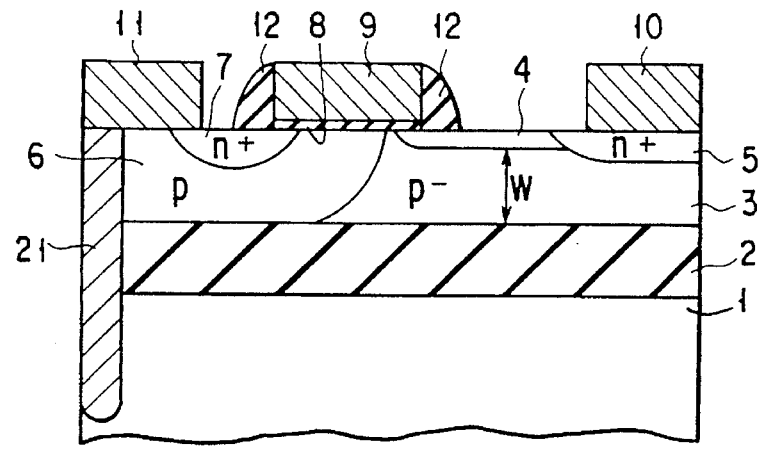
F I G. 12
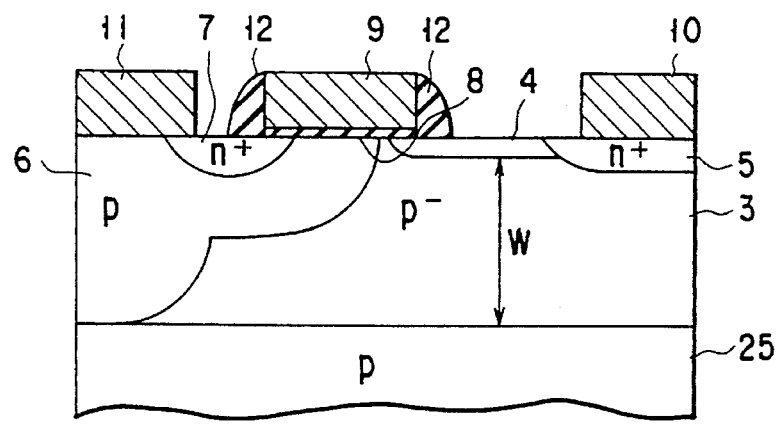
F I G. 13

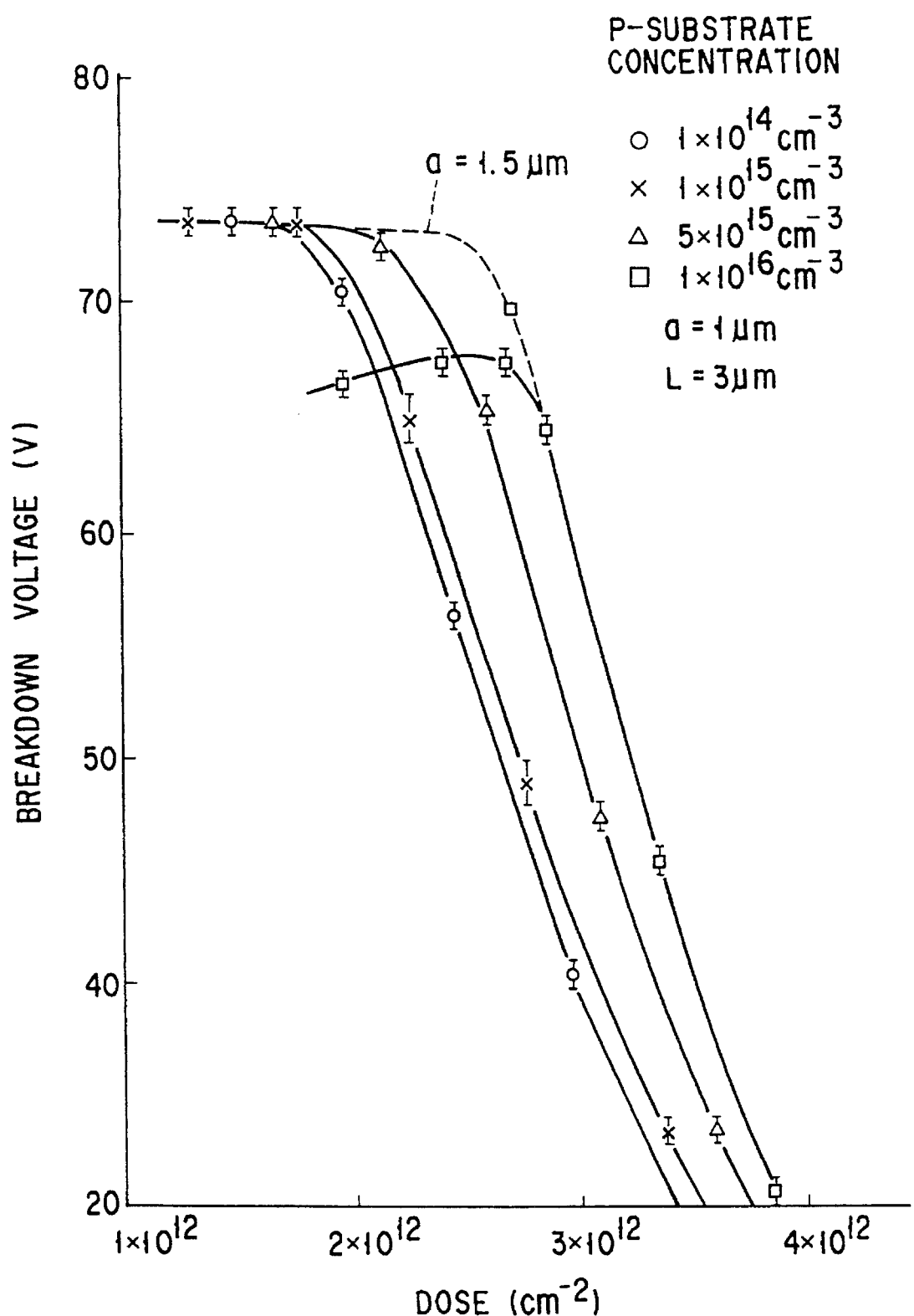
F I G. 21

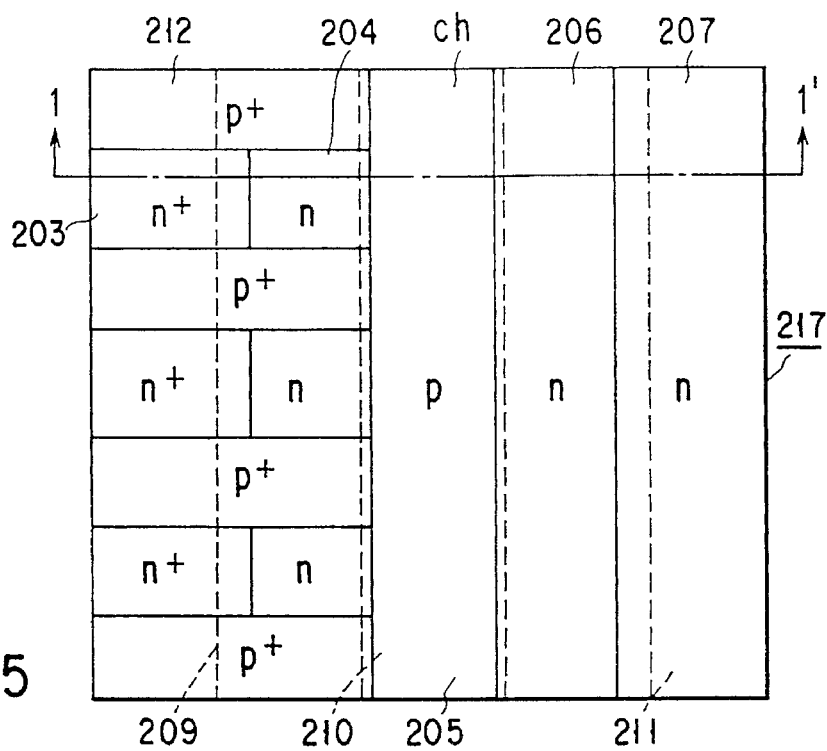
F I G. 25
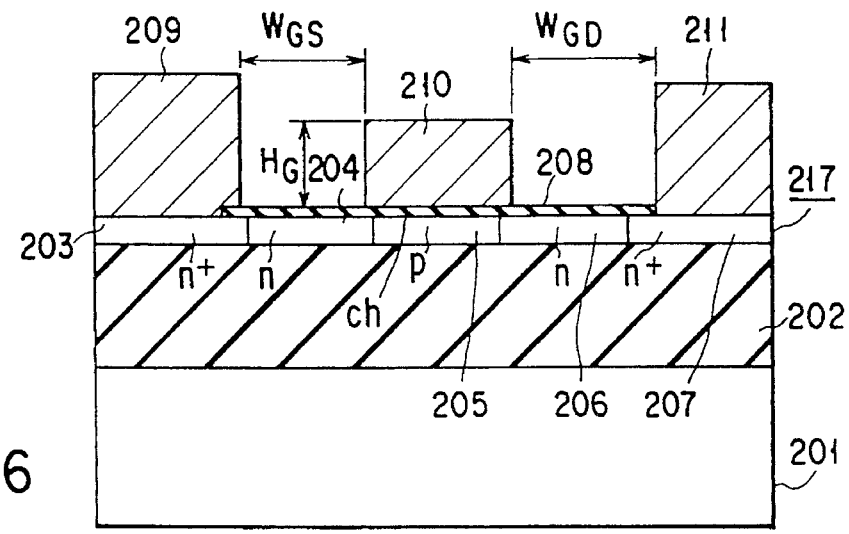
F I G. 26

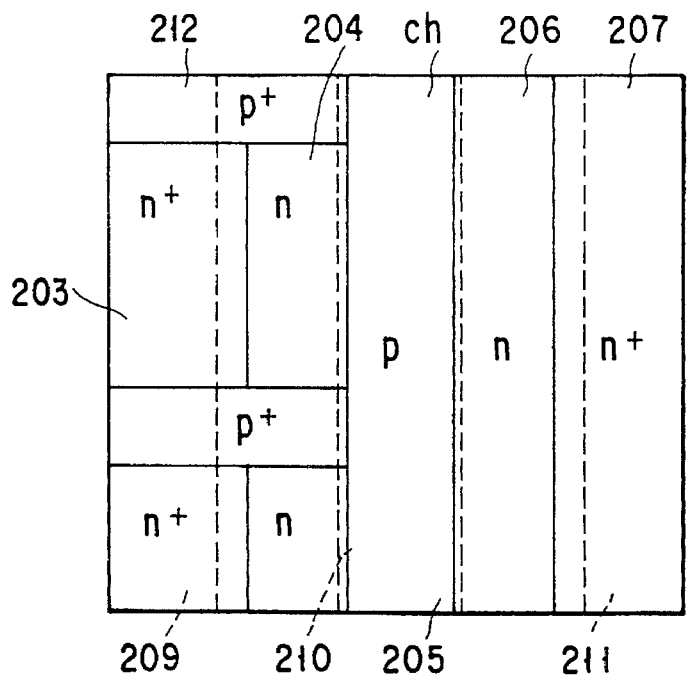
F I G. 31
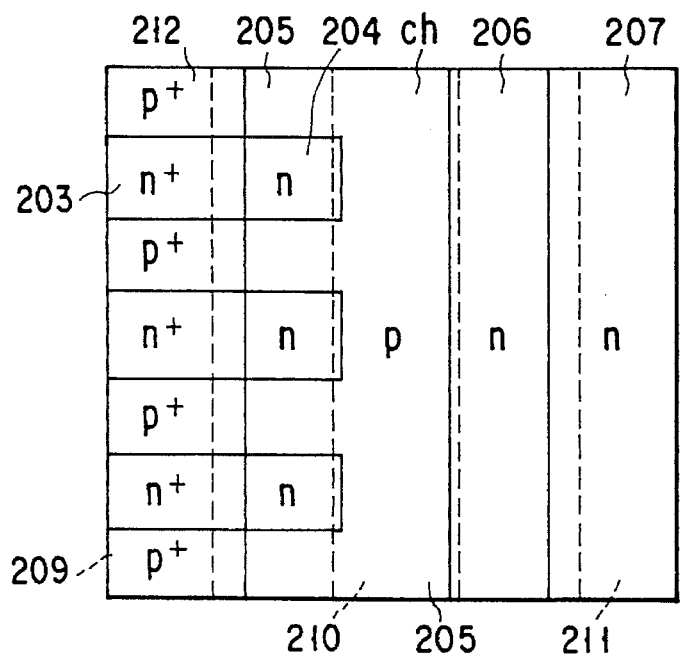
F I G. 32

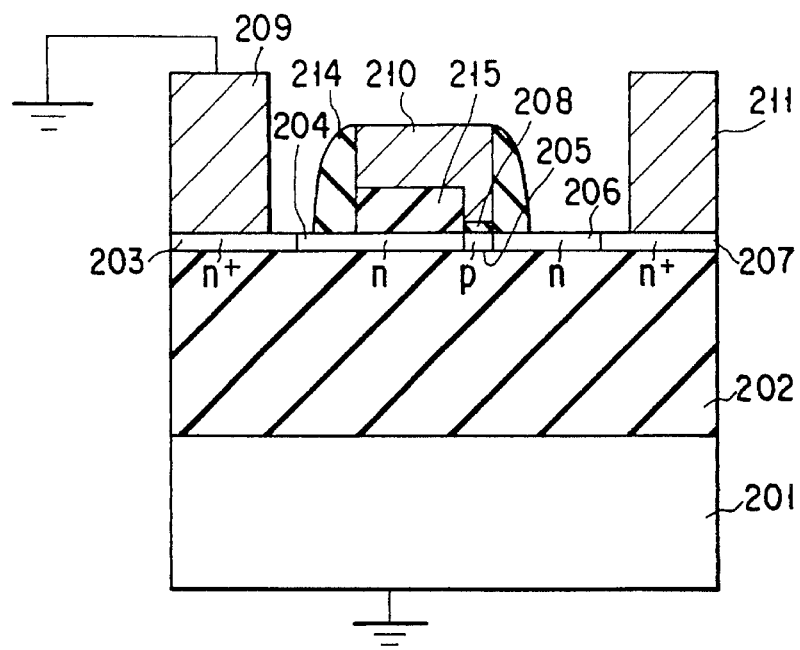
F I G. 35
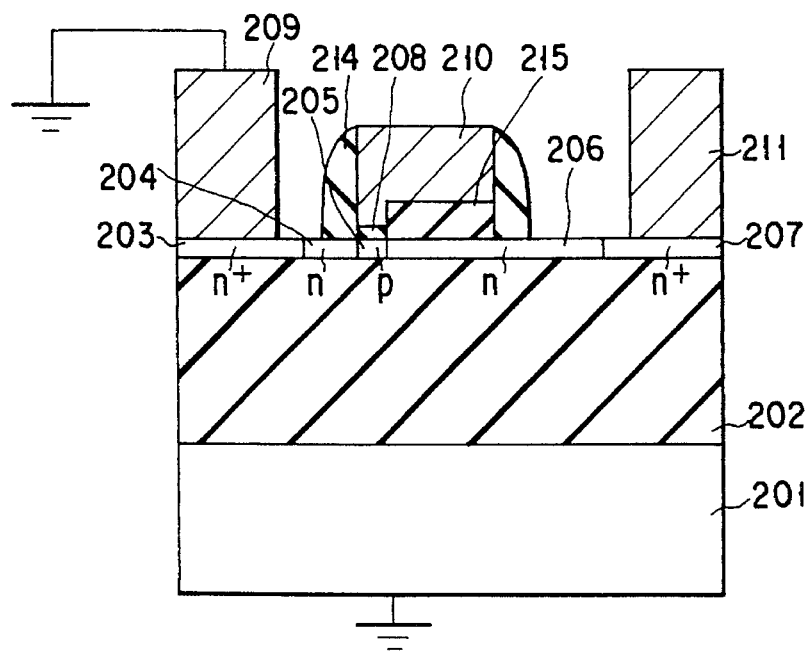
F I G. 36

F I G. 37A
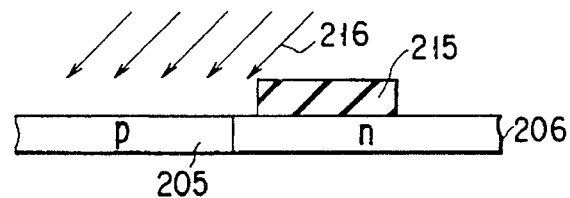
F I G. 37B
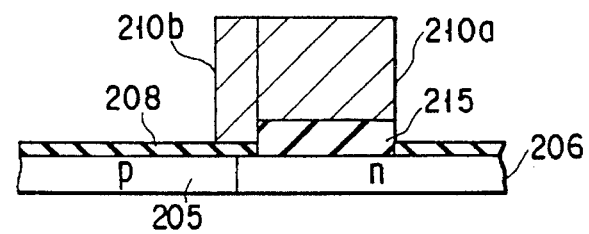
F I G. 37C
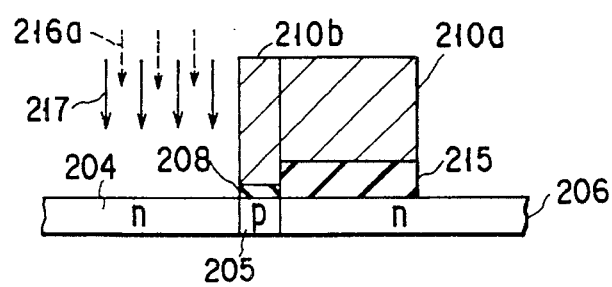
F I G. 37D
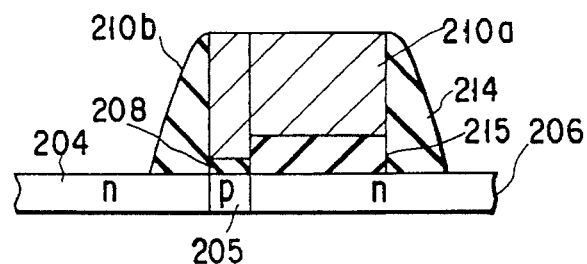
F I G. 37E
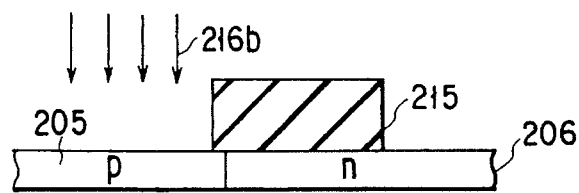
F I G. 38A
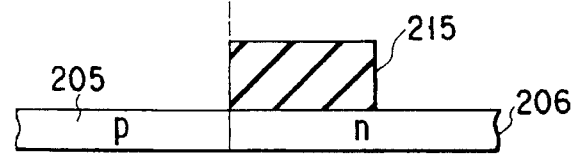
F I G. 38B

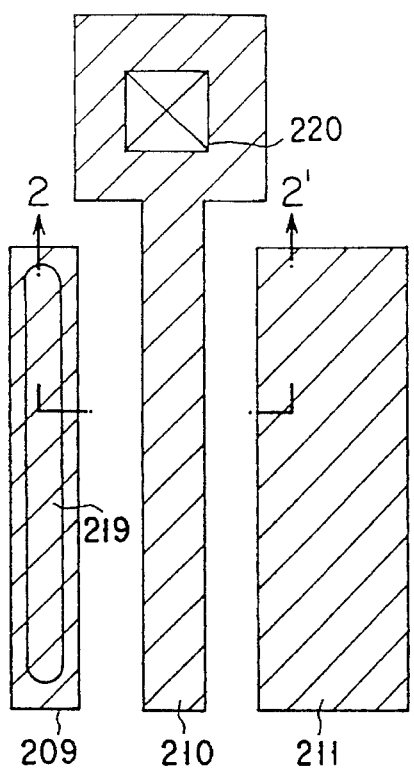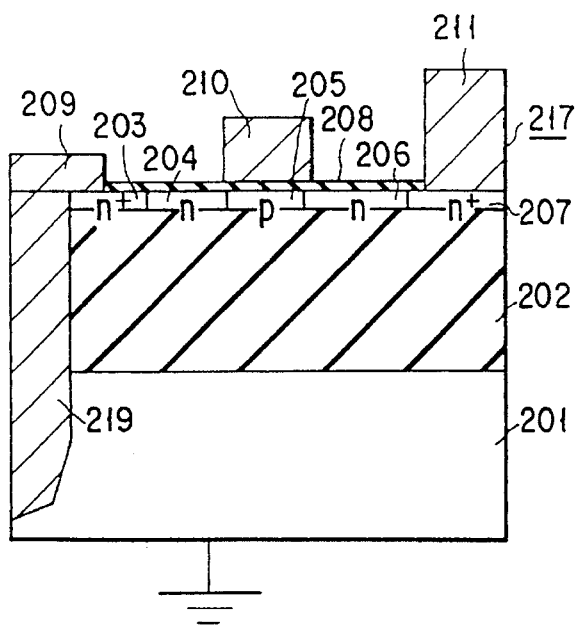
FIG. 39A          FIG. 39B
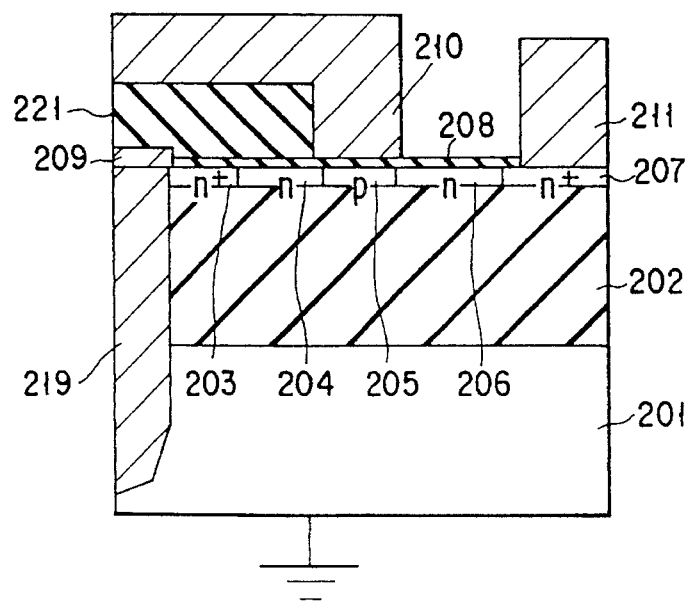
FIG. 40

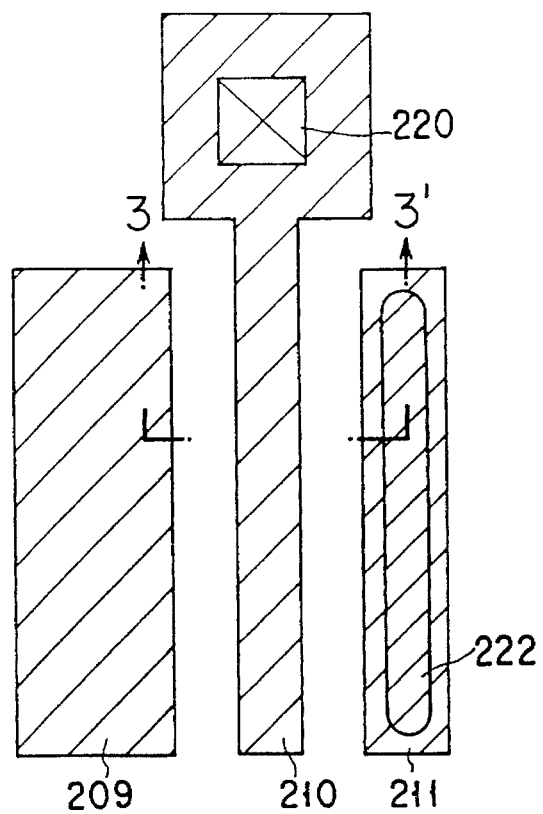
F I G. 41A
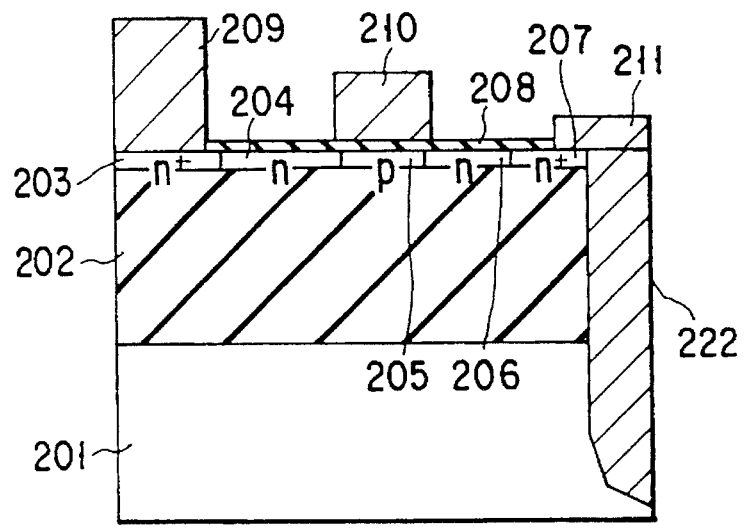
F I G. 41B

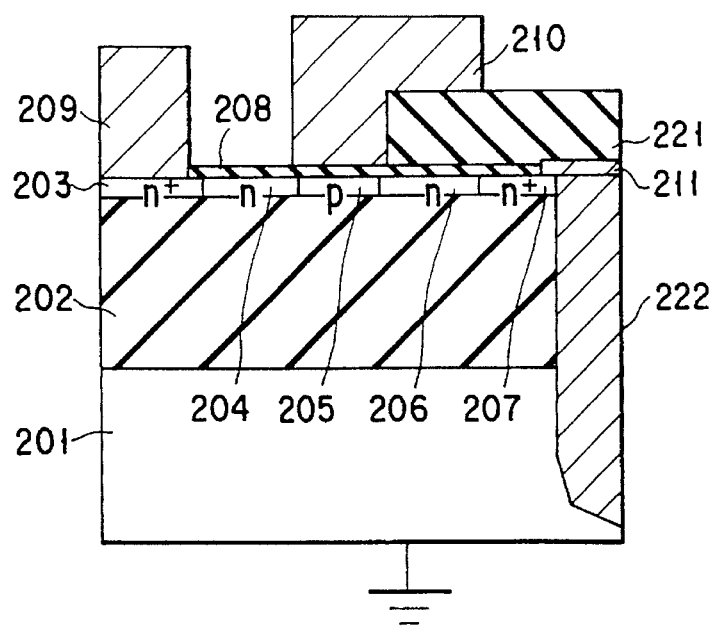
F I G. 44
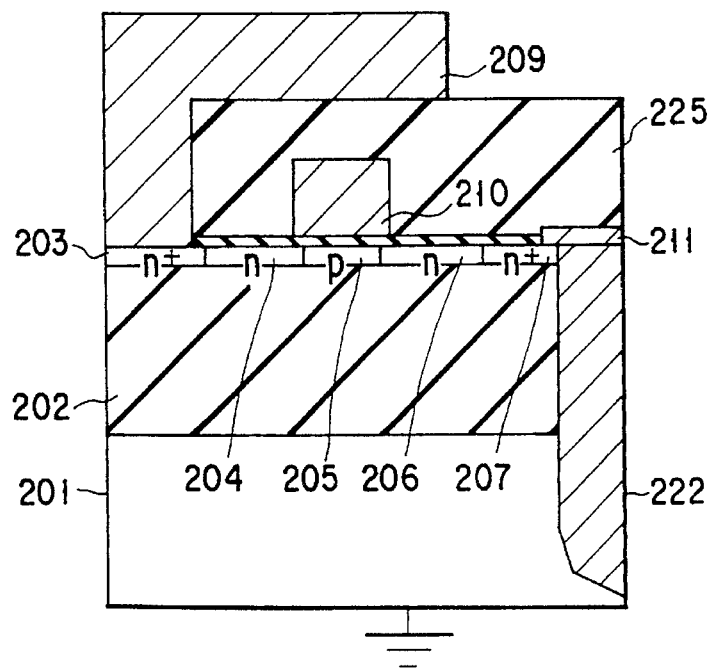
F I G. 45

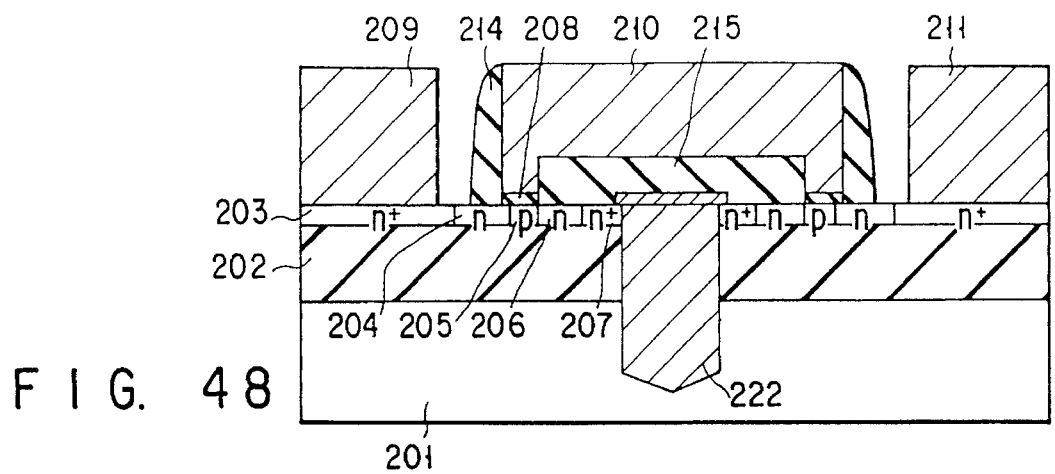
F I G. 48
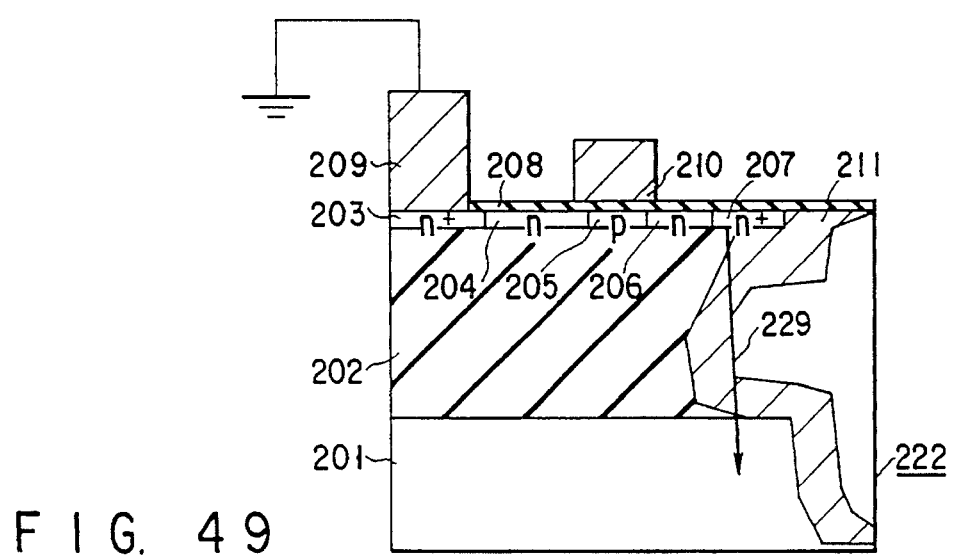
F I G. 49
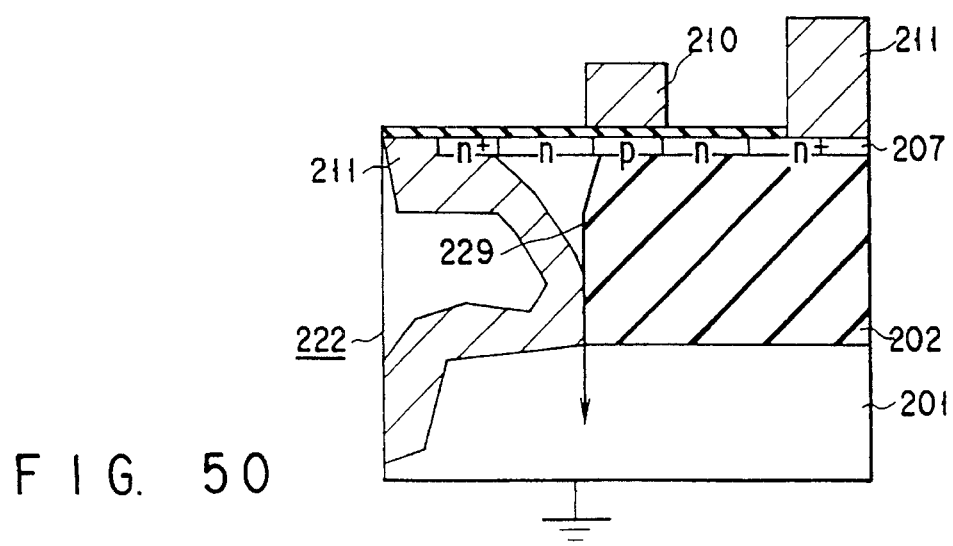
F I G. 50

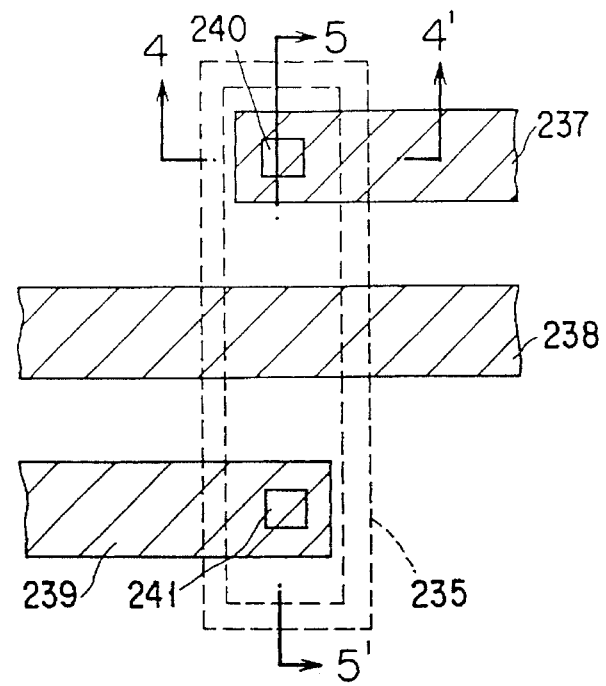
F I G. 5 1
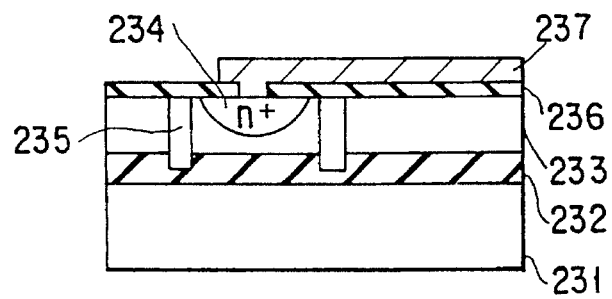
F I G. 5 2 A
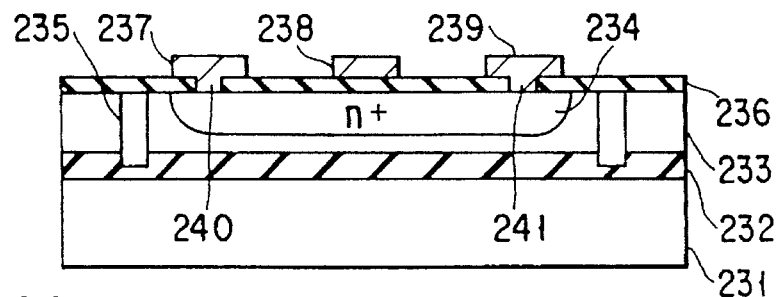
F I G. 5 2 B

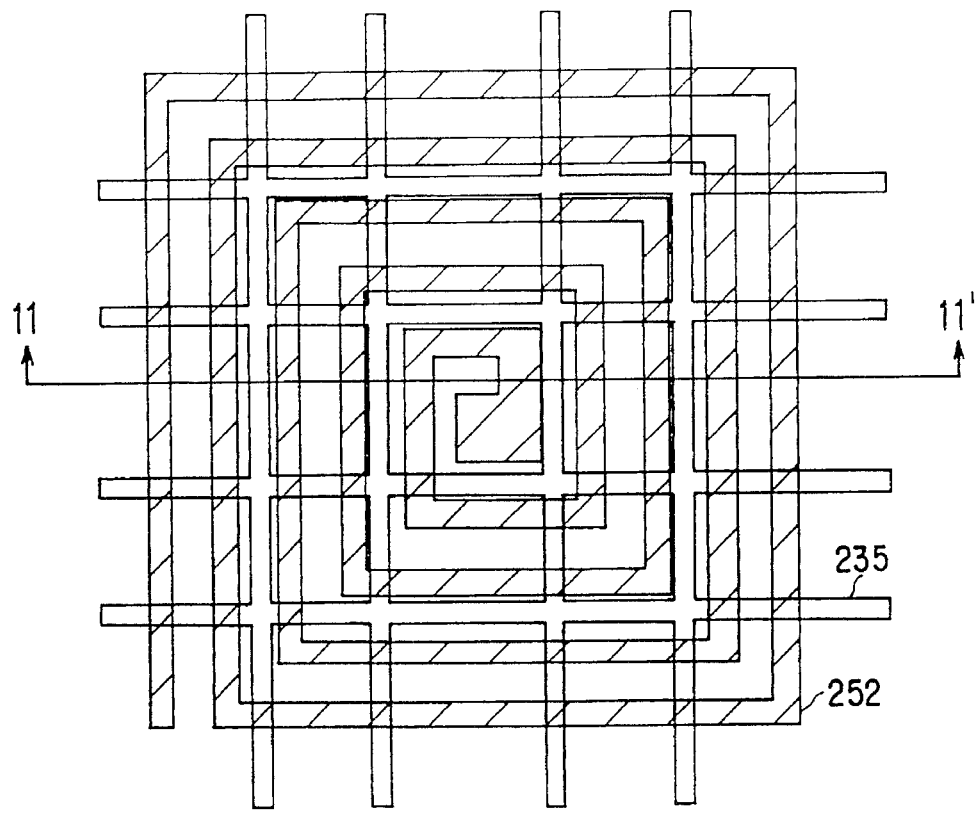
F I G. 62A
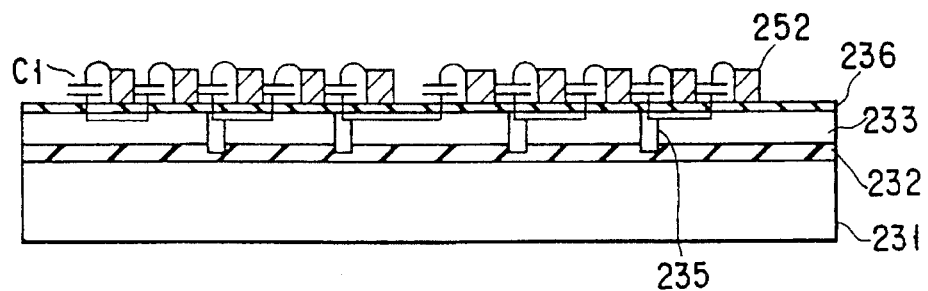
F I G. 62B
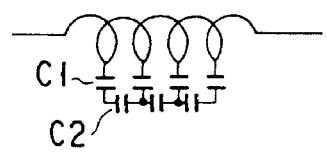
F I G. 63

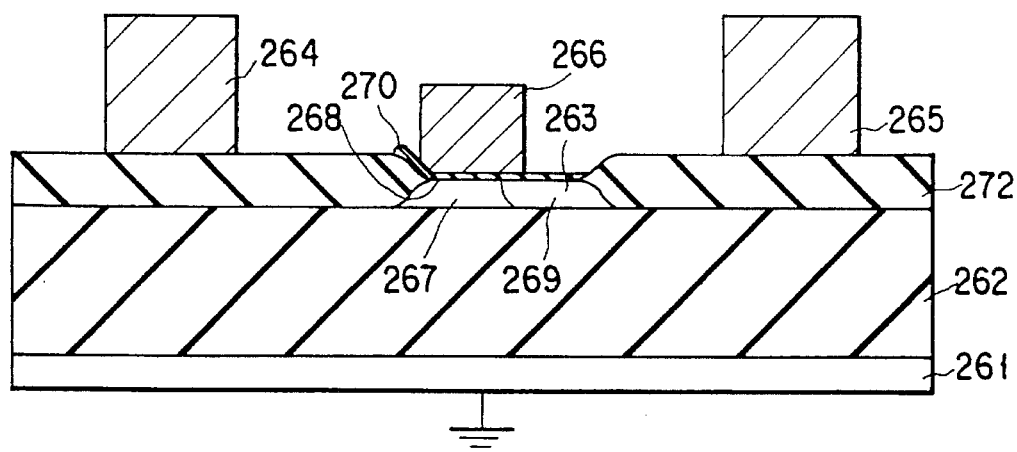
F I G. 68A
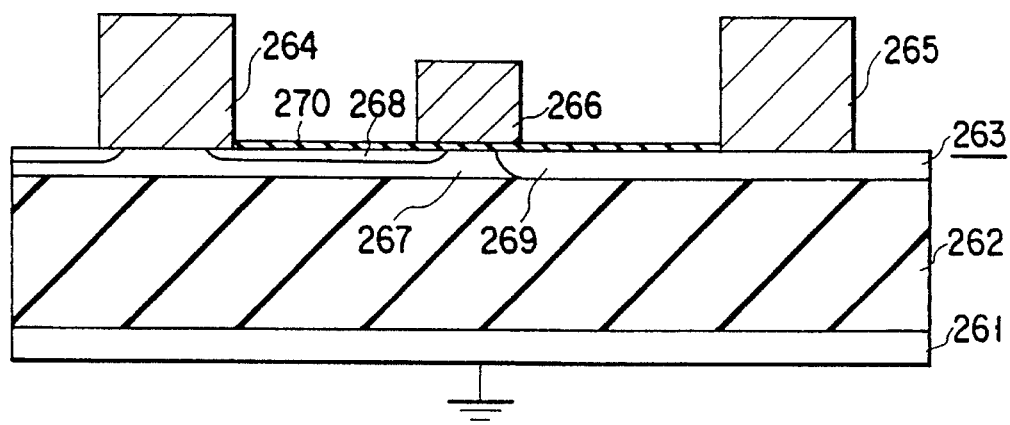
F I G. 68B
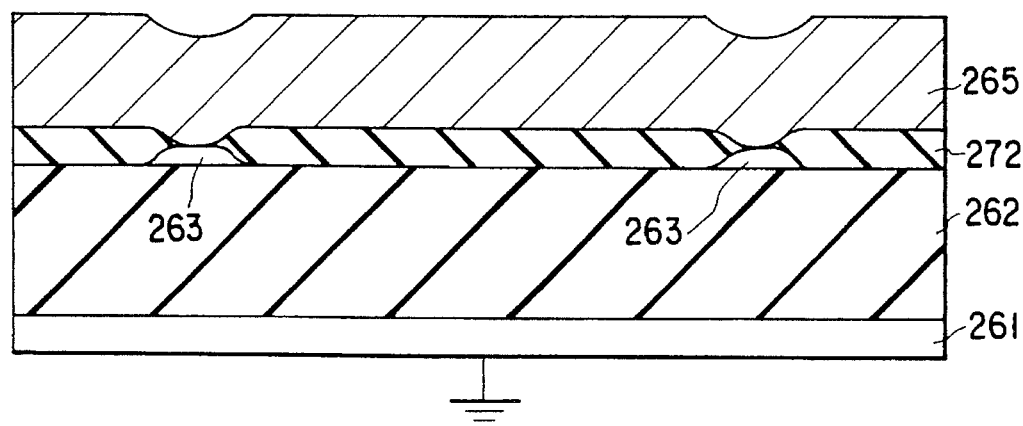
F I G. 68C

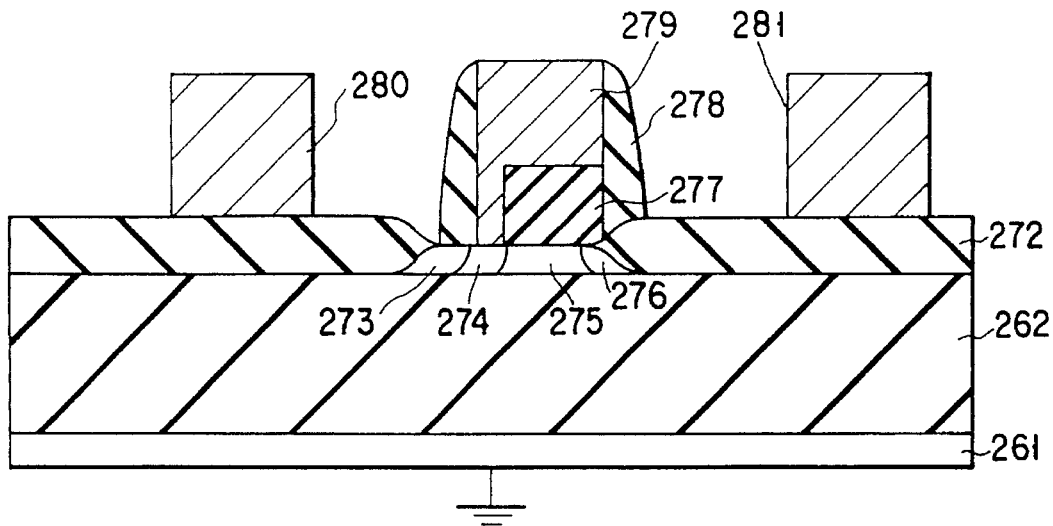
F I G. 69A
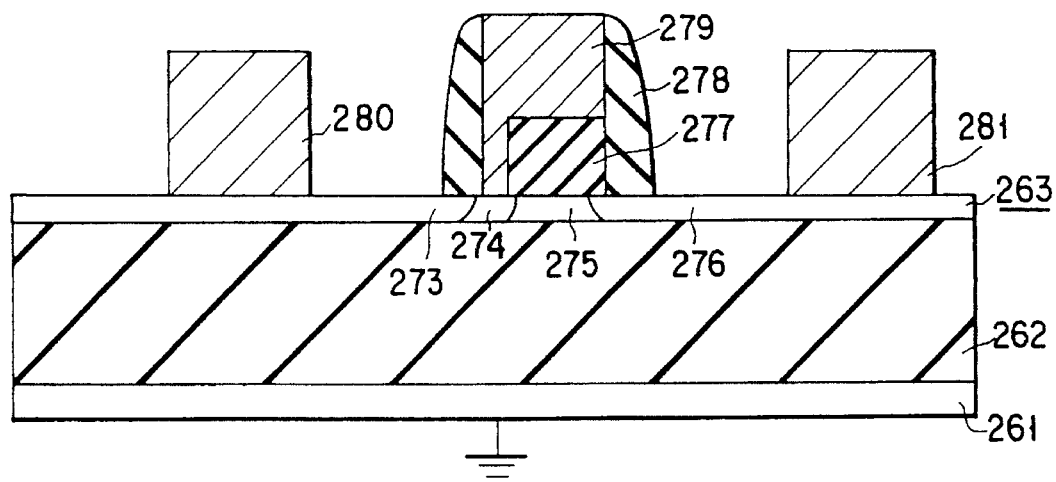
F I G. 69B

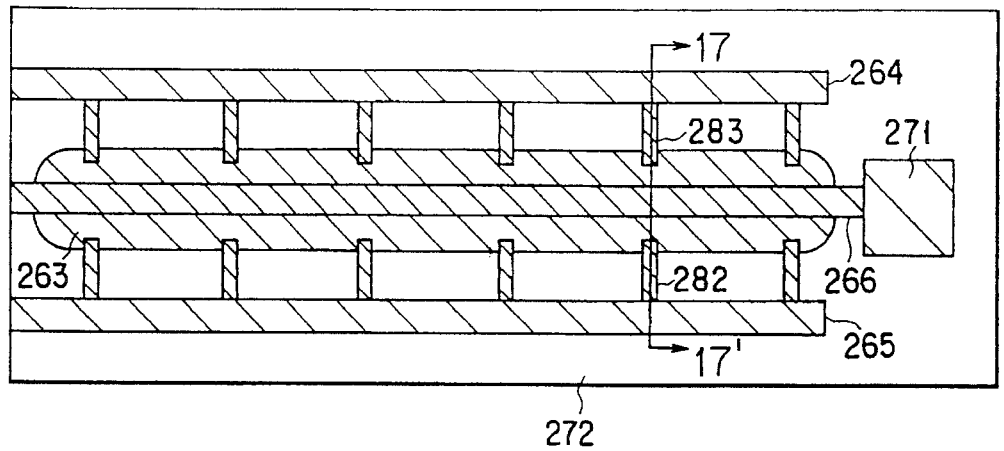
F I G. 70A
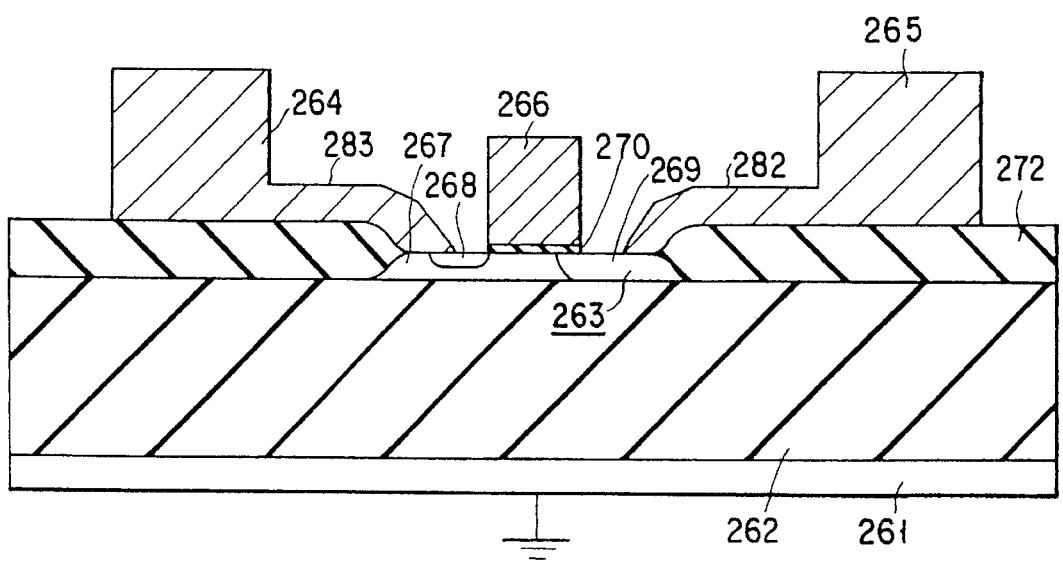
F I G. 70B

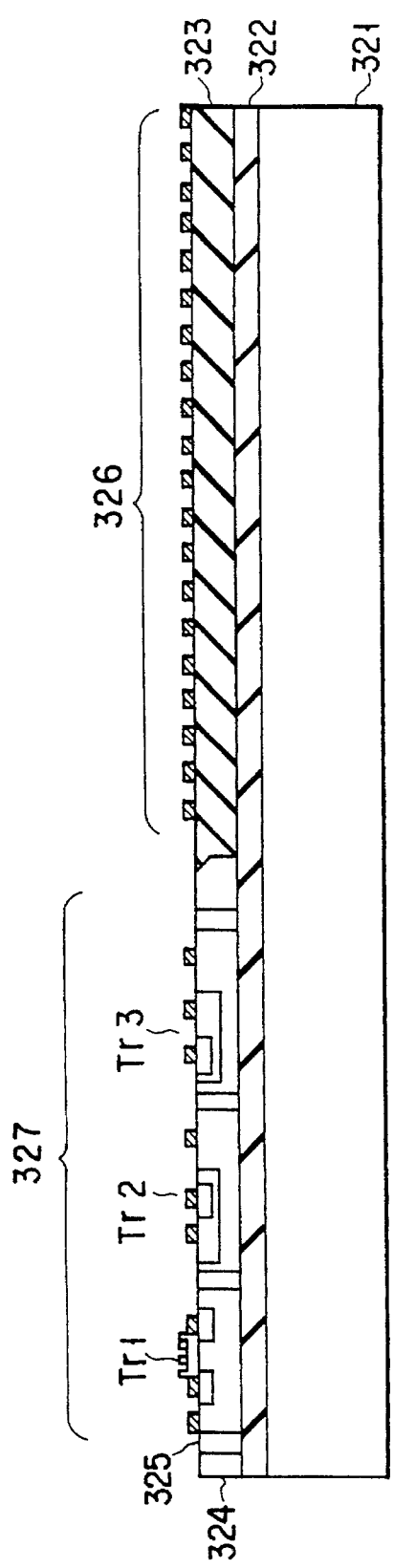
F I G. 78
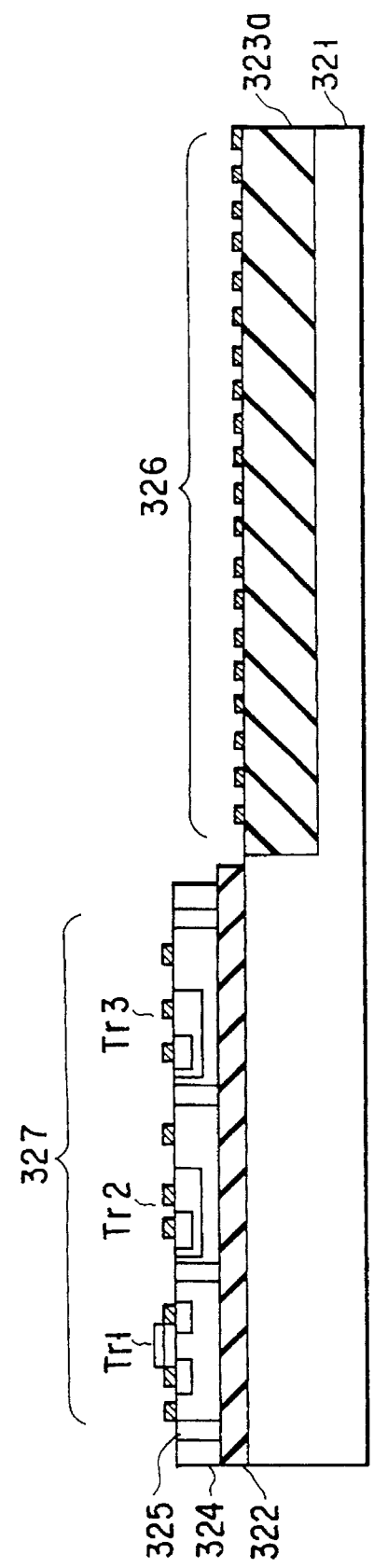
F I G. 79

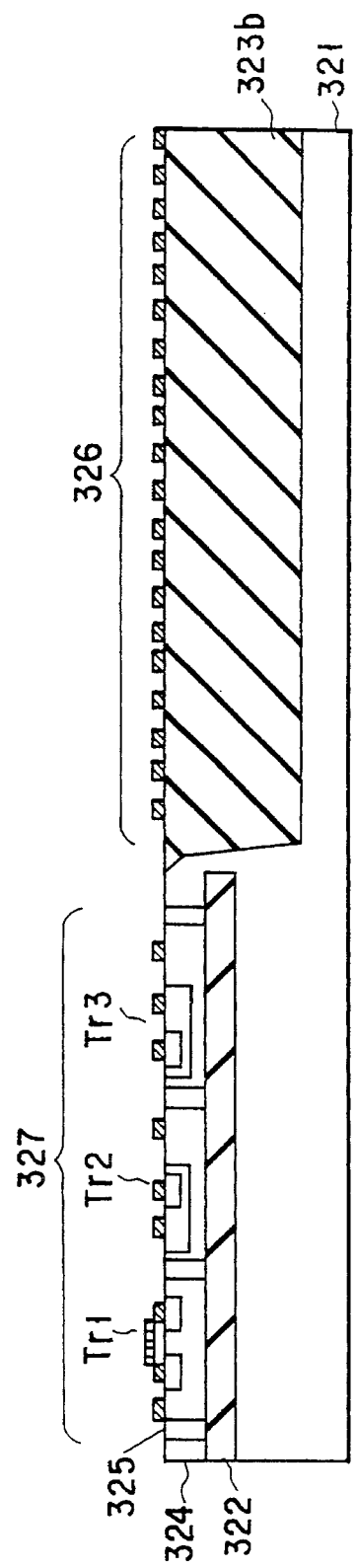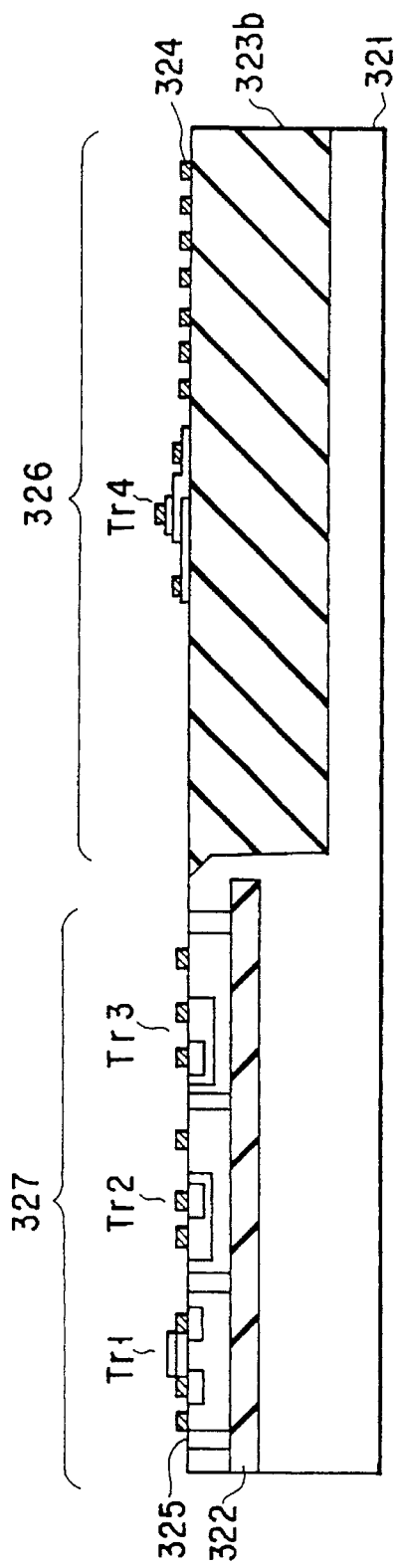
FIG. 80
FIG. 81

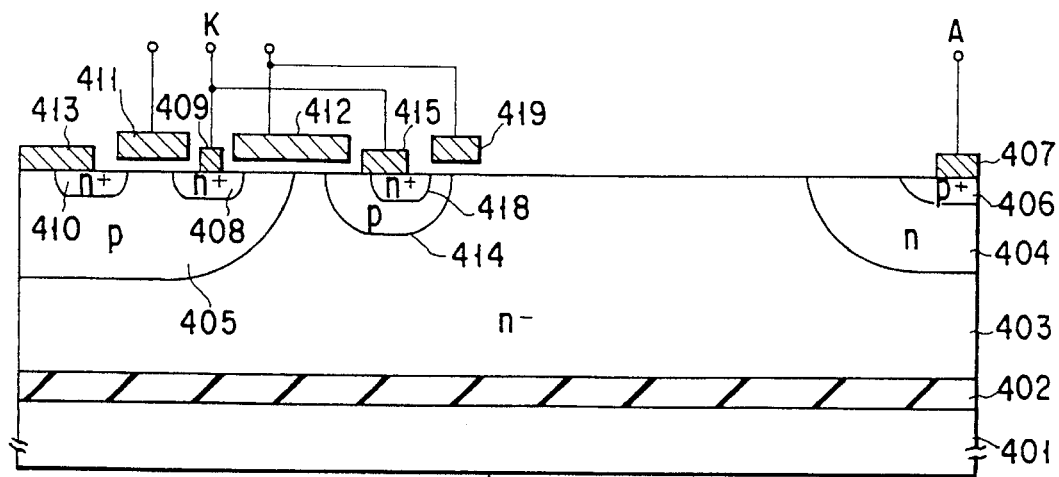
F I G. 85
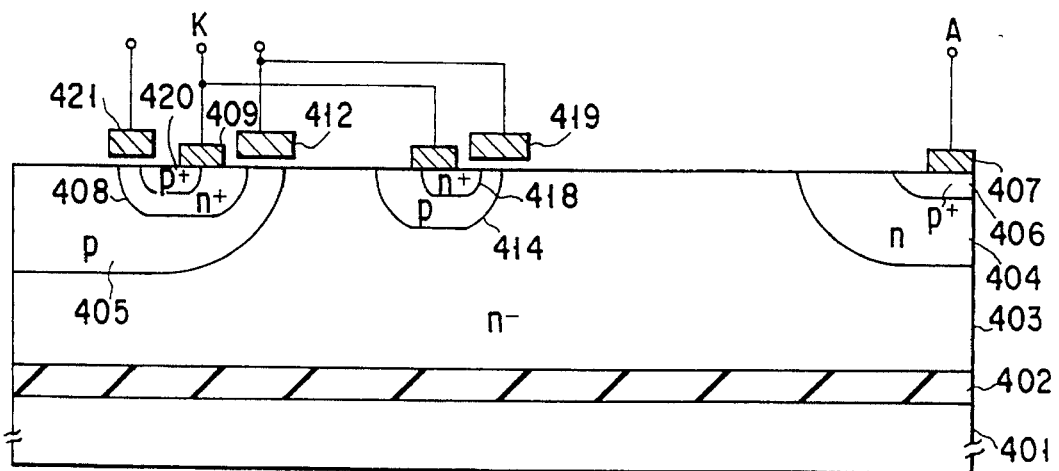
F I G. 86
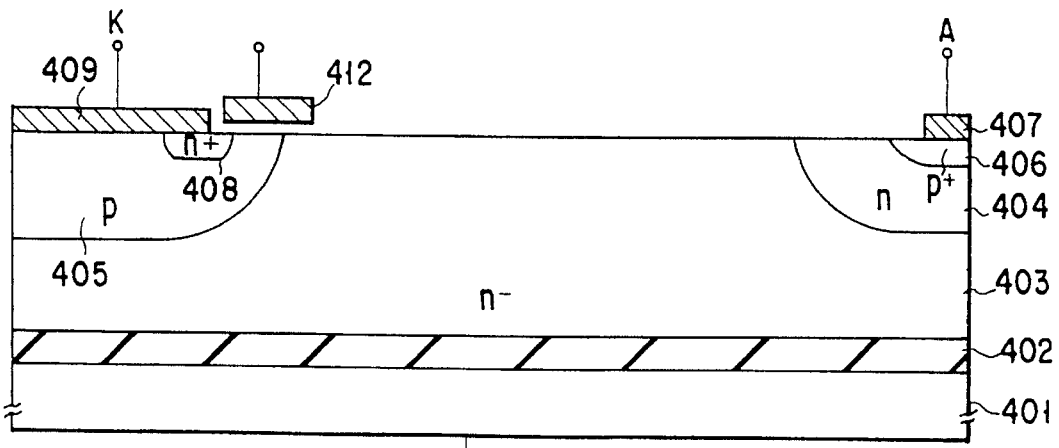
F I G. 88

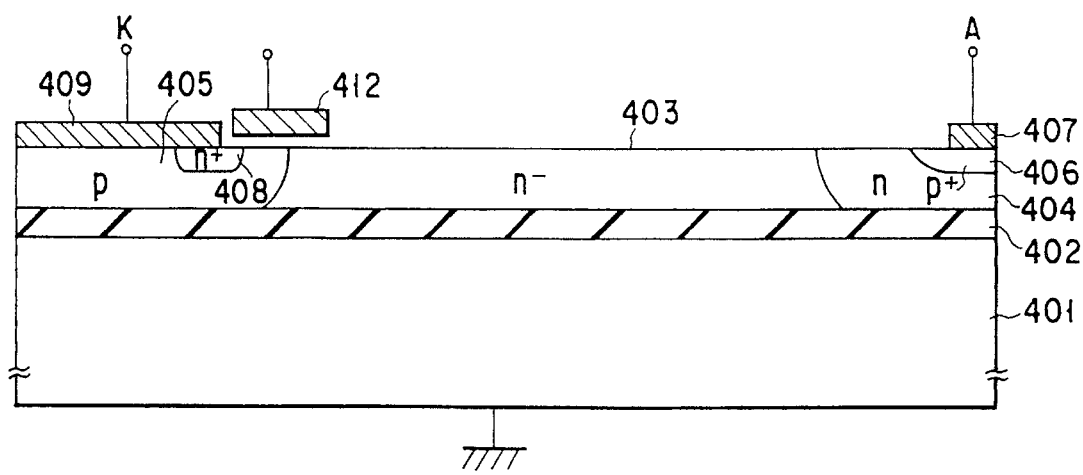
F I G. 90
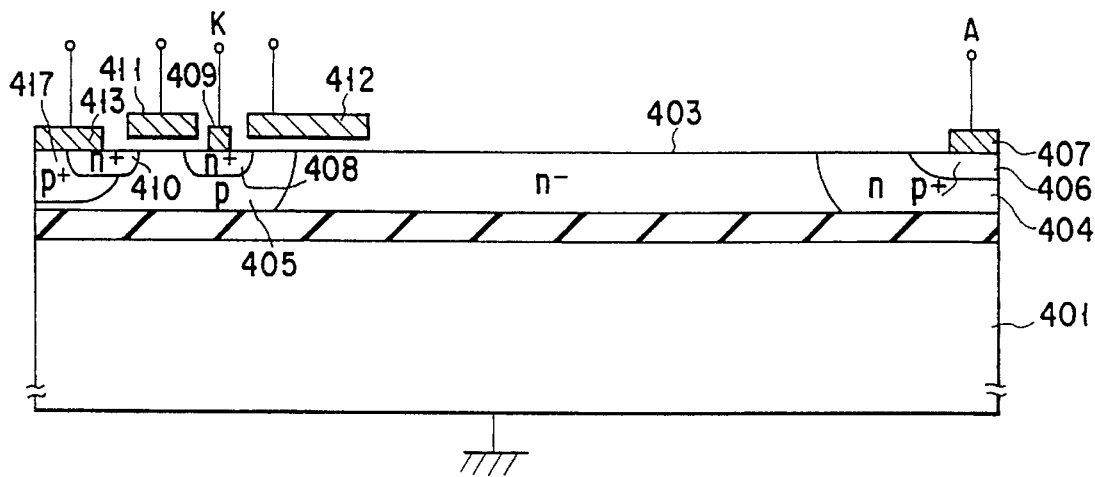
F I G. 91
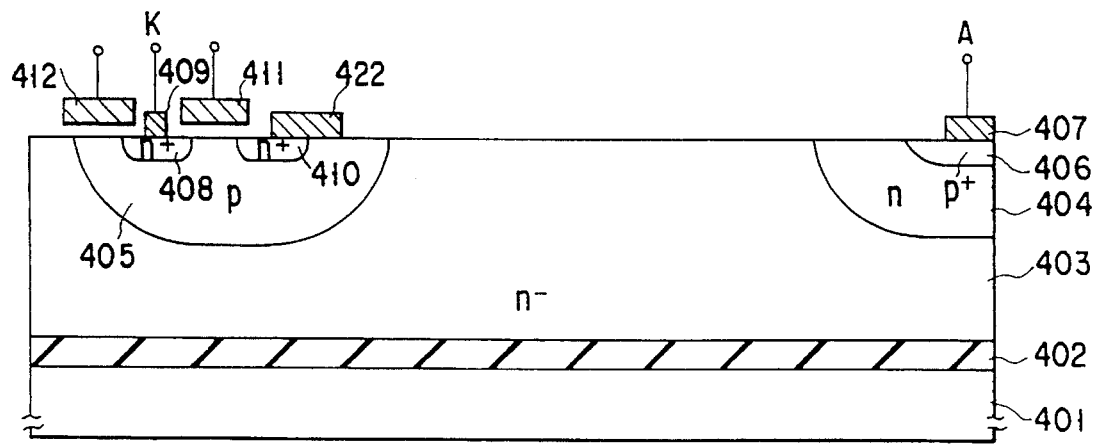
F I G. 92

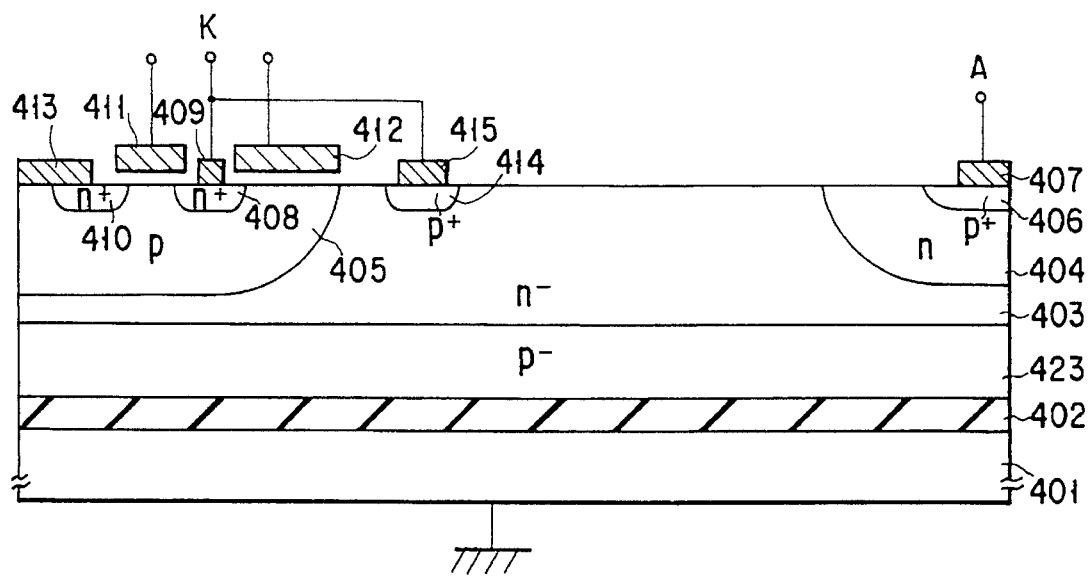
F I G. 93

FIELD EFFECT TRANSISTOR

This application is a continuation of application Ser. No. 08/207,849, filed Mar. 9, 1994, now abandoned.

BACKGROUND OF THE INVENTION

1. Field of the Invention

The present invention relates to a MOS field effect transistor (MOSFET).

2. Description of the Related Art

In recent years, a large-scale integrated circuit (LSI) in which a large number of transistors and resistors and the like are connected to obtain electrical circuits and integrated on a single chip has been frequently used in the important portion of a computer or a communication equipment. For this reason, the performance of the entire equipment greatly depends on the performance of the LSI itself. The performance of the LSI itself can be improved such that the integration density of semiconductor devices is increased by micropatterning to achieve a high-speed operation. A MOSFET is one of the most important semiconductor devices.

In a conventional high-frequency MOSFET, high-speed operation cannot be performed due to the parasitic capacitance between a semiconductor substrate and a drain region.

In a conventional high-breakdown-voltage MOSFET, although a necessary breakdown voltage can be assured, dielectric isolation between the devices is not sufficient. When the MOSFET is used as a high-side switch, a depletion layer extends in the device to undesirably increase the ON resistance.

In a conventional MOSFET formed on an SOI (semiconductor or silicon on insulator) substrate, when the main silicon layer of the SOI substrate is thin to increase the maximum operating frequency, the resistance between a channel region and a source electrode increases. In the worst case, the potential in the channel floats to make it impossible to assure a normal device operation.

SUMMARY OF THE INVENTION

It is an object of the present invention to provide a MOSFET capable of realizing a high-speed operation.

It is another object of the present invention to provide a MOSFET capable of increasing a breakdown voltage, achieving excellent dielectric isolation, and decreasing the ON resistance at once.

It is still another object of the present invention to provide a MOSFET formed on an SOI substrate and free from a device operation error caused by an abnormal potential of a channel region even if the main silicon layer of the SOI substrate is thin.

According to the present invention, there is provided a field effect transistor comprising:

a holding layer;

an active layer formed on the holding layer and essentially consisting of a semiconductor;

a source layer of a first conductivity type formed in a surface of the active layer;

a source electrode connected to the source layer;

a drain layer of the first conductivity type formed in the surface of the active layer so as to be out of contact with the source layer;

a drain electrode connected to the drain layer;

a channel region formed in the surface of the active layer between the source and drain layers;

a gate electrode formed on the channel region through a gate insulating film; and a base layer of a second conductivity type formed in the channel region in the surface of the active layer so as to induce an inverted layer of the first conductivity type in the channel region, wherein a depletion layer is formed in the active layer to extend from the drain layer to the holding layer in an operation of the transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing a high-frequency MOSFET according to an embodiment of the present invention;

FIG. 2 is a sectional view showing a high-frequency MOSFET according to another embodiment of the present invention;

FIG. 3 is a sectional view showing a high-frequency MOSFET according to still another embodiment of the present invention;

FIG. 4 is a sectional view showing a high-frequency MOSFET according to still another embodiment of the present invention;

FIG. 8 is a graph showing conditions for forming a depletion layer reaching a silicon oxide film in a high-resistant $p^-$-semiconductor layer in an operative state;

FIG. 9 is a graph showing conditions for forming a depletion layer reaching a silicon oxide film in a high-resistant $p^-$-semiconductor layer in a thermal equilibrium state;

FIG. 12 is a sectional view showing a high-frequency MOSFET according to still another embodiment of the present invention;

FIG. 13 is a sectional view showing a high-frequency MOSFET according to still another embodiment of the present invention;

FIG. 21 is a graph showing the relationship between the breakdown voltage and the dose to an offset layer when the concentration of a p-substrate is used as a parameter in the embodiment shown in FIG. 15;

FIG. 25 is a plan view showing a high-frequency MOSFET according to still another embodiment of the present invention;

FIG. 26 is a sectional view taken along the line A—A' of FIG. 25;

FIG. 31 is a plan view showing a MOSFET according to still another embodiment of the present invention;

FIG. 32 is a plan view showing a MOSFET according to still another embodiment of the present invention;

FIG. 35 is a sectional view showing a MOSFET according to still another embodiment of the present invention;

FIG. 36 is a sectional view showing a MOSFET according to still another embodiment of the present invention;

FIGS. 37A to 37E are sectional views showing manufacturing steps in order according to the embodiment shown in FIG. 35;

FIGS. 38A and 38B are sectional views showing other manufacturing steps according to the embodiment shown in FIG. 35;

FIG. 39A is a plan view showing a MOSFET according to still another embodiment of the present invention, and FIG. 39B is a sectional view taken along the line B—B' of FIG. 39A;

FIG. 40 is a sectional view showing a MOSFET according to still another embodiment of the present invention;

FIG. 41A is a plan view showing a MOSFET according to still another embodiment of the present invention, and FIG. 41B is a sectional view taken along the line C—C' of FIG. 41A;

FIG. 44 is a sectional view showing a MOSFET according to still another embodiment of the present invention;

FIG. 45 is a sectional view showing a MOSFET according to still another embodiment of the present invention;

FIG. 48 is a sectional view showing a MOSFET according to still another embodiment of the present invention;

FIG. 49 is a sectional view showing a MOSFET according to still another embodiment of the present invention;

FIG. 50 is a sectional view showing a MOSFET according to still another embodiment of the present invention;

FIG. 51 is a plan view showing a wiring structure according to still another embodiment of the present invention;

FIGS. 52A and 52B are sectional views taken along the lines D—D' and E—E' of FIG. 51, respectively;

FIG. 62A is a plan view showing an inductor formed in an SOI substrate according to still another embodiment of the present invention, and FIG. 62B is a sectional view taken along the line K—K' of FIG. 62A;

FIG. 63 is an equivalent circuit diagram of the inductor shown in FIG. 62A;

FIGS. 68A to 68C are sectional views taken along the lines N—N', O—O', and P—P', respectively;

FIGS. 69A and 69B are sectional views showing structures of bipolar transistors according to still another embodiment of the present invention;

FIG. 70A is a plan view showing a MOSFET according to still another embodiment of the present invention, and FIG. 70B is a sectional view taken along the line Q—Q' of FIG. 70A;

FIG. 78 is a sectional view showing the main part of a semiconductor integrated circuit using an SOI substrate according to still another embodiment of the present invention;

FIG. 79 is a sectional view showing the main part of a semiconductor integrated circuit using an SOI substrate according to still another embodiment of the present invention;

FIG. 80 is a sectional view showing the main part of a semiconductor integrated circuit using an SOI substrate according to still another embodiment of the present invention;

FIG. 81 is a sectional view showing the main part of a semiconductor integrated circuit using an SOI substrate according to still another embodiment of the present invention;

FIG. 85 is a sectional view showing a lateral MCT according to still another embodiment of the present invention;

FIG. 86 is a sectional view showing a lateral MCT according to still another embodiment of the present invention;

FIG. 88 is a sectional view taken along the line A—A' of FIG. 87;

FIG. 90 is a sectional view taken along the line C—C' of FIG. 89;

FIG. 91 is a sectional view taken along the line D—D' of FIG. 89;

FIG. 92 is a sectional view showing a lateral high-breakdown-voltage semiconductor device according to still another embodiment of the present invention;

FIG. 93 is a sectional view showing a lateral high-breakdown-voltage semiconductor device according to still another embodiment of the present invention.

DETAILED DESCRIPTION OF THE PREFERRED EMBODIMENTS

Figure 14:
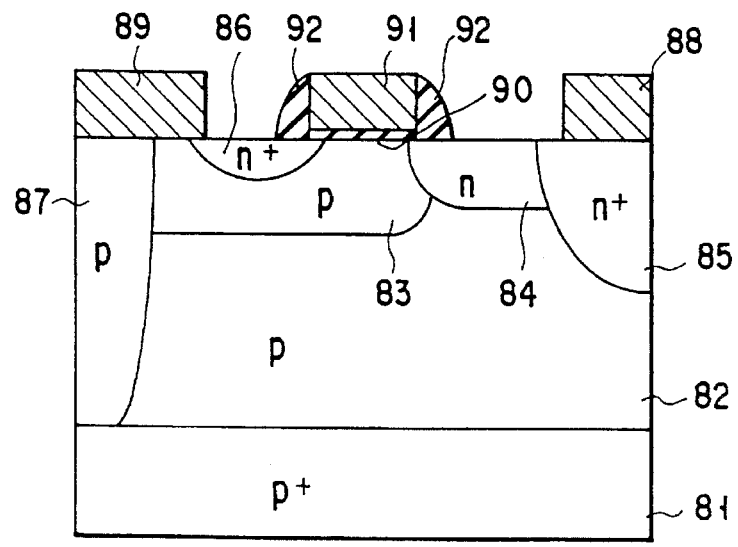
FIG. 14 is a sectional view showing a conventional high-frequency MOSFET.

FIG. 14 is a sectional view showing a conventional high-frequency MOSFET.

Referring to FIG. 14, reference numeral 81 denotes a p-semiconductor substrate. A p-epitaxial layer 82 is formed on the p-semiconductor substrate 81. A p-well 83 for forming an n-channel is selectively formed in the surface of the p-epitaxial layer 82, and an $n^+$-source layer 86 is selectively formed in the surface of the p-well 83. An n-drain layer 84 is selectively formed in the surfaces of the p-epitaxial layer 82 and the p-well 83.

A gate electrode 91 is formed in the region between the $n^+$-source layer 86 and the n-drain layer 84 through a gate insulating film 90. A side-wall gate insulating film 92 is formed on the side wall of the gate electrode 91. The n-drain layer 84 is connected to a drain electrode 88 through an $n^+$-layer 85 formed in the surface of the p-epitaxial layer 82. A source electrode 89 is formed on the $n^+$-source layer 86 to contact the p-well 83 and a $p^+$-layer 87 which reaches the p-semiconductor substrate 81.

In the MOSFET having the above structure, due to the presence of the parasitic capacitance between the drain region (the n-drain layer 84 and the $n^+$-layer 85) and the p-semiconductor substrate 81, expected high-speed operation cannot be realized.

FIG. 1 is a sectional view showing a high-frequency MOSFET according to an embodiment of the present invention.

Referring to FIG. 1, reference numeral 1 denotes a silicon substrate. A high-resistant p⁻-silicon layer 3 is formed on the silicon substrate 1 through a silicon oxide film 2.

A p-diffusion base layer 6 reaching the silicon oxide film 2 is formed on the high-resistant p⁻-layer 3. An n⁺-source layer 7 as a source region is selectively formed in the surface of the p-base layer 6. A source electrode 11 is formed on the p-layer 6 and the n⁺-source layer 7.

An n-drain layer 4 is selectively formed in the surface of the high-resistant p⁻-layer 3, and is connected to a drain electrode 10 through a low-resistant n⁺-diffusion layer 5 formed in the surface of the high-resistant p⁻-layer 3. The n-drain layer 4 and the low-resistant n⁺-layer 5 constitute a drain region.

A gate electrode 9 is formed in the region between the n-drain layer 4 and the n⁺-source layer 7 through a gate insulating film 8. A side-wall gate insulating film 12 is formed on the side wall of the gate electrode 9.

In the MOSFET having the above structure, a device is formed on the layer 2 consisting of silicon oxide which is a substance having a dielectric constant lower than that of silicon as a semiconductor constituting the layer 3. More particularly, since the device is formed on an SOI substrate, the parasitic capacitance between the silicon substrate 1 and the drain region is decreased to realize a switching speed higher than that of the conventional MOSFET.

In addition, according to this embodiment, the parasitic capacitance can be further reduced due to the presence of the high-resistant p⁻-layer 3 below the drain region. In at least the operating state, and preferably a thermal equilibrium state (drain-source voltage= 0), the impurity concentration and depth of the high-resistant p⁻-layer 3 are preferably selected to cause the depletion layer formed in the high-resistant p⁻-layer 3 to reach the insulating layer 2. When the depletion layer formed in the high-resistant p⁻-layer 3 reaches the silicon oxide film 2, the depletion layer and the silicon oxide film 2 serve as an effective depletion layer below the drain region in the conventional device structure. Therefore, the depletion layer is larger than the conventional depletion layer by the silicon oxide film 2, thereby reducing the parasitic capacitance.

In this embodiment, the p-layer 6 and the p⁻-layer 3 are exposed in the channel region between the n-drain layer 4 and the n⁺-source layer 7. The p⁻-layer 3 in the channel region is depleted in, at least, the operating state, and more preferably, in a thermal equilibrium state. In contrast, when a positive gate voltage is applied to the gate electrode 9, the p-layer 6 forms an n-inverted layer in the surface of the channel region. Accordingly, in the operating state, the current between the source and drain flows through the inverted layer induced from the p-layer 6.

In order to make the depletion layer formed in the high-resistant p⁻-layer 3 reach the silicon oxide film 2, an impurity concentration N and a depth W of the high-resistant p⁻-layer 3 are selected from the lower sides (hatched sides) of the characteristic curves shown in FIG. 8.

Although the drain voltage ranges from 0 to 30 V in FIG. 8, a drain voltage falling outside this range makes it possible to cause the depletion layer formed in the high-resistant p⁻-layer 3 to reach the silicon oxide film 2.

In order to make the depletion layer formed in the high-resistant p⁻-layer 3 reach the silicon oxide film 2 in a thermal equilibrium state (drain-source voltage=0), the impurity concentration N and the depth W of the high-resistant p⁻-layer 3 are selected from the lower side (hatched side) of the characteristic curve shown in FIG. 9.

The above result is summarized as follow:

$$W < \{2\epsilon(V_{bi} - 2kT/q + V)/(qN)\}^{1/2}$$

wherein $\epsilon$ is the dielectric constant of a semiconductor layer, q is an elementary electric charge, k is Boltzmann's constant, V is a drain voltage, and $V_{bi}$ is a built-in potential of the pn junction between n-layer 4 and p⁻-layer 3.

If Si is used, the above condition can be approximated to the following expression:

$$\{2\epsilon(0.8+V)/(qN)\}^{1/2}$$

This expression can be rewritten as follows:

$$W^2 N/(0.8+V) < 2\epsilon/q$$

The $2\epsilon/q$ value is about $1.25 \times 10^7$.

Another embodiment of the present invention will be described below. The same reference numerals in FIGS. 2 to 13 denote the same parts as in the MOSFET shown in FIG. 1, and a detailed description thereof will be omitted.

FIG. 2 is a sectional view showing a high-frequency MOSFET according to another embodiment of the present invention. The MOSFET of this embodiment is the same as that of the embodiment shown in FIG. 1 except that a low-resistant n⁺-layer 5a reaches a silicon oxide film 2.

In practice, the low-resistant n⁺-layer must be often formed deep as in this embodiment due to process limitations and an increase in breakdown voltage. In this case, a depletion layer is not formed below the low-resistant n⁺-layer 5a, but formed in a high-resistant p⁻-layer 3 below an n-drain layer 4. When this depletion layer reaches the silicon oxide film, a high-speed operation can be performed as in the embodiment shown in FIG. 1.

FIG. 3 is a sectional view showing a high-frequency MOSFET according to still another embodiment of the present invention. The MOSFET of this embodiment is the same as that of the embodiment shown in FIG. 1 except that a high-resistant n⁻-layer 3a is used in place of the high-resistant p⁻-layer 3.

According to this embodiment, a depletion layer extends from a p-layer 6 to the high-resistant n⁻-layer 3a. If this depletion layer is made to reach a silicon oxide film 2, the parasitic capacitance between a silicon substrate 1 and a drain region is reduced as in FIG. 1, thereby realizing a high-speed operation.

FIG. 4 is a sectional view showing a high-frequency MOSFET according to still another embodiment of the present invention. The MOSFET of this embodiment is the same as that of the embodiment shown in FIG. 1 except that a p-layer 6a is shortened in the transverse direction (channel length direction).

According to this embodiment, since the impurity in the channel portion is decreased, a carrier mobility and an operation speed increase. In addition, an n-drain layer 4 further extends to a gate electrode 9 to shorten an effective channel length.

Figure 5:
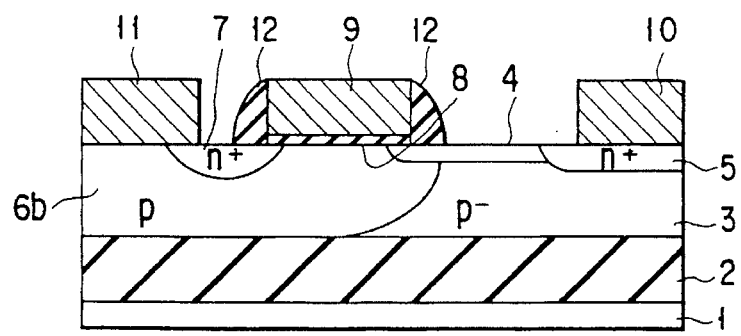
FIG. 5 is a sectional view showing a high-frequency MOSFET according to still another embodiment of the present invention.

FIG. 5 is a sectional view showing a high-frequency MOSFET according to still another embodiment of the present invention. The MOSFET of this embodiment is the same as that of the embodiment shown in FIG. 1 except that a p-layer 6b extends below an n-drain layer 4 to form a RESURF.

According to this embodiment, field concentration at the end portion of a gate electrode is suppressed to increase a breakdown voltage by the RESURF. When the impurity concentration of the n-drain layer 4 in the transverse direction is inclined, the breakdown voltage can be increased. In addition, the average impurity concentration of the n-drain layer 4 is made high and the resistance of the n-drain layer 4 is reduced to improve device characteristics.

Figure 6:
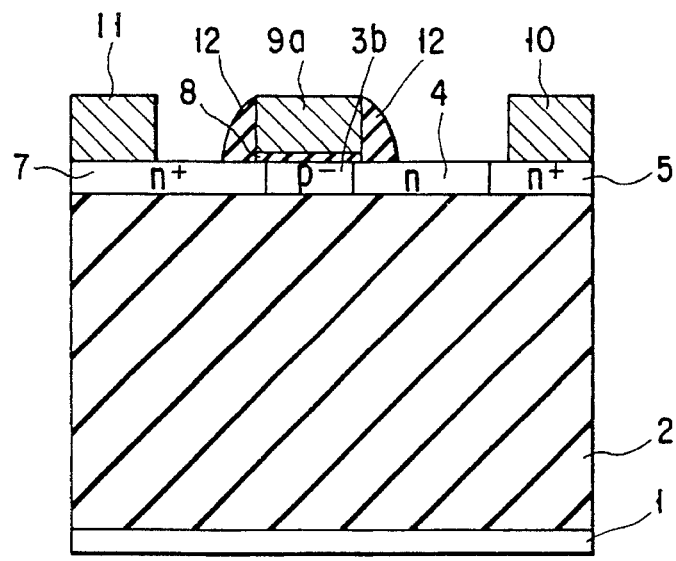
FIG. 6 is a sectional view showing a high-frequency MOSFET according to still another embodiment of the present invention.

FIG. 6 is a sectional view showing a high-frequency MOSFET according to still another embodiment of the present invention.

In the MOSFET of this embodiment, a very thin high-resistant p⁻-layer 3b is used. This embodiment is characterized in that a material having a negative built-in potential such as p⁺-polysilicon is used for a gate electrode 9a.

When a gate voltage is 0 V, the state wherein a negative gate voltage is applied can be realized by the material. Therefore, occurrence of punch-through caused by the electrical floating of the high-resistant p⁻-layer 3b can be prevented.

On the other hand, in order to prevent occurrence of punch-through, a thin silicon oxide film 2 is used in the conventional MOSFET. More particularly, the film thickness is 0.5 μm or less. In this case, the parasitic capacitance between a silicon substrate 1 and a drain region increases, thereby disabling a high-speed operation.

In contrast, since the gate electrode 9a consisting of a material having a negative built-in potential is used to prevent occurrence of punch-through in this embodiment as described above, the silicon oxide film 2 need not be thin, and the silicon oxide film 2 having the film thickness of 1 μm or more can be used. For this reason, the parasitic capacitance between the silicon substrate 1 and the drain region does not increase. In order to reduce the parasitic capacitance, the film thickness of the silicon oxide film 2 is preferably 2 μm or more.

Figure 10:
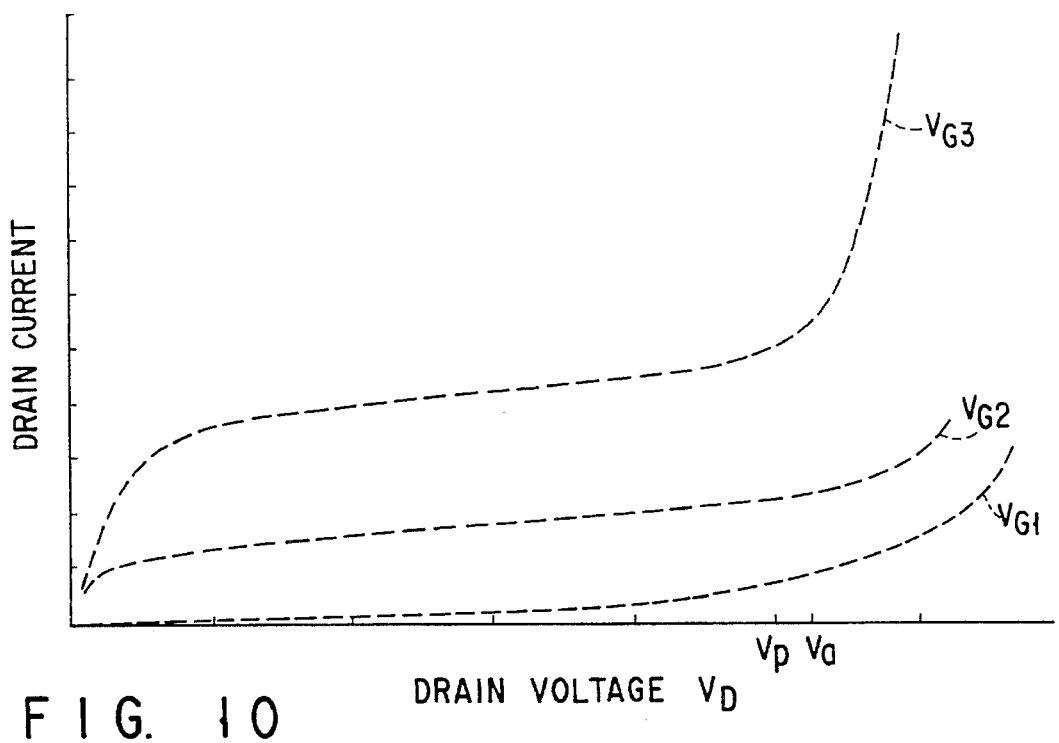
FIG. 10 is a graph showing $V_D$-$I_D$ characteristics of the MOSFET shown in FIG. 6.

FIG. 10 is a graph showing $V_D$-$I_D$ characteristics of the MOSFET according to the embodiment shown in FIG. 6. The thickness of the silicon oxide film 2 is 2 μm, and a ratio of an effective gate length to a silicon active layer is 6:1.

As shown in FIG. 10, punch-through does not occur until a voltage $V_p$ close to an avalanche breakdown voltage $V_a$ regardless of magnitudes of gate voltages ($V_{G1} < V_{G2} < V_{G3}$). The same result can be obtained by increasing the above ratio.

Figure 11:
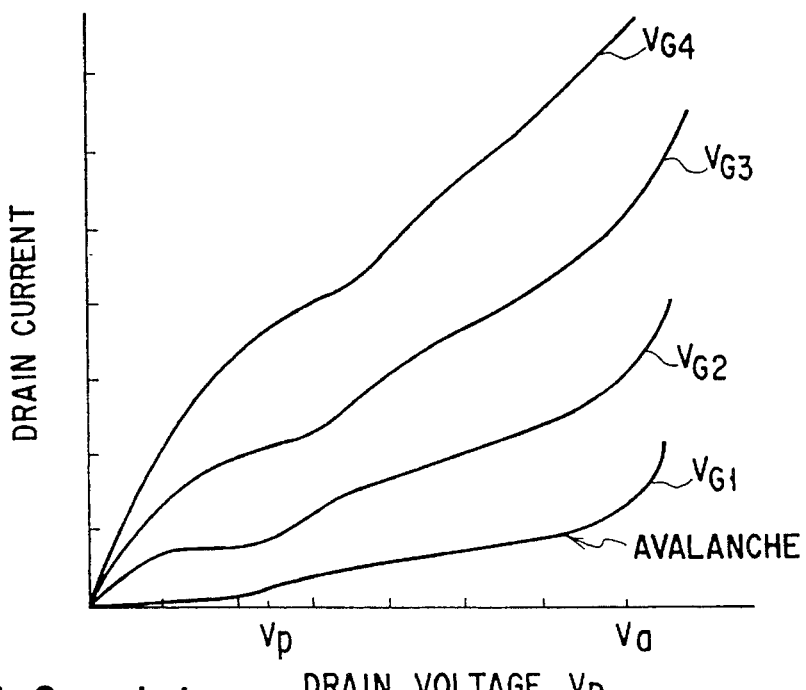
FIG. 11 is a graph showing $V_D$-$I_D$ characteristics of a conventional MOSFET.

On the other hand, it is found that punch-through occurs in the conventional MOSFET at a voltage $V_p$ much lower than an avalanche breakdown voltage $V_a$ regardless of the magnitudes of gate voltages ($V_{G1} < V_{G2} < V_{G3} < V_{G4}$), as shown in FIG. 11.

According to this embodiment, a high-speed MOSFET in which punch-through hardly occurs can be obtained.

Figure 7:
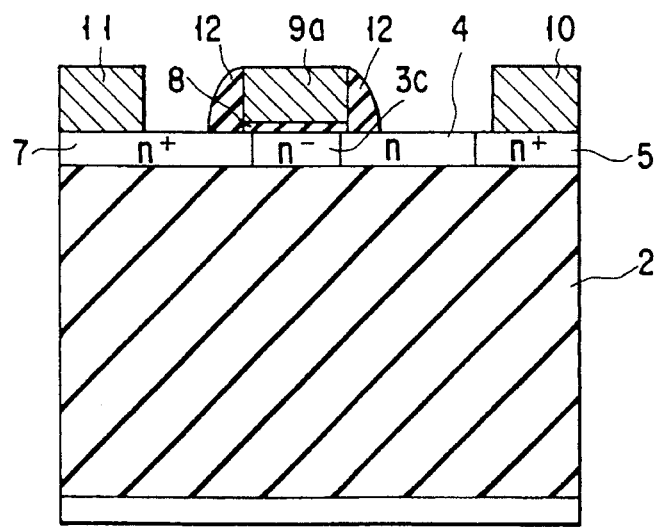
FIG. 7 is a sectional view showing a high-frequency MOSFET according to still another embodiment of the present invention.

FIG. 7 is a sectional view showing a high-frequency MOSFET according to still another embodiment of the present invention. The MOSFET of this embodiment is the same as that of the embodiment shown in FIG. 6 except that a very thin high-resistant n⁻-layer 3c is used instead of a very thin high-resistant p⁻-layer 3b.

More specifically, the MOSFET according to this embodiment is of a depletion type. The thickness of a silicon oxide film 2 can be 1 μm or more, and more preferably, 2 μm or more to greatly reduce a parasitic capacitance. The same effect as in FIG. 6 can be obtained in the MOSFET according to this embodiment.

FIG. 12 is a sectional view showing a high-frequency MOSFET according to still another embodiment of the present invention. The MOSFET of this embodiment is the same as that of the embodiment shown in FIG. 1 except that a trench groove is formed below a source electrode 11.

A trench groove reaching a silicon substrate 1 is formed below the source electrode 11, and is filled with a conductive material 21 having a high thermal conductivity, thereby bringing the source electrode 11 into thermal contact with the silicon substrate 1. In this manner, part of the silicon substrate 1 also serves as the source electrode 11, and the heat dissipation characteristics are improved Since this trench structure is formed to bring the silicon layer 3 as the substrate layer into thermal contact with the silicon substrate 1, a insulating material may be used to fill the trench groove. However, a conductive material is usually used for this purpose. Where a conductive material is used, the substrate 1 can be used as a source electrode.

FIG. 13 is a sectional view showing a high-frequency MOSFET according to still another embodiment of the present invention.

Referring to FIG. 13, reference numeral 25 denotes a low-resistant p⁺-silicon substrate 25. A high-resistant p⁻-silicon layer 3 is formed on the substrate 25. A p-diffusion base layer 6 reaching a silicon oxide film 2 is formed in the high-resistant p⁻-layer 3. An n⁺-source layer 7 as a source region is selectively formed in the surface of the p-base layer 6. A source electrode 11 is formed on the p-layer 6 and the n⁺-source layer 7.

An n-drain layer 4 is selectively formed in the surface of the high-resistant p⁻-layer 3, and is connected to a drain electrode 10 through a low-resistant n⁺-layer 5 formed in the surface of the high-resistant p⁻-layer 3. The n-drain layer 4 and the low-resistant n⁺-layer 5 constitute a drain region.

A gate electrode 9 is formed in the region between the n-drain layer 4 and the n⁺-source layer 7 through a gate insulating film 8. A side-wall gate insulating film 12 is formed on the side wall of the gate electrode 9.

According to this embodiment, a parasitic capacitance can be reduced in the presence of the high-resistant p⁻-layer 3 below the drain region. For example, if a depletion layer formed in the high-resistant p⁻-layer 3 reaches the substrate 25 in the ON operating state or a thermal equilibrium state, the capacitance between the drain electrode 10 and the substrate 25 can be minimized. Furthermore, since the width of the depletion layer does not change during the ON operation, the capacitance does not change either to improve lineality of device characteristics.

Figure 22:
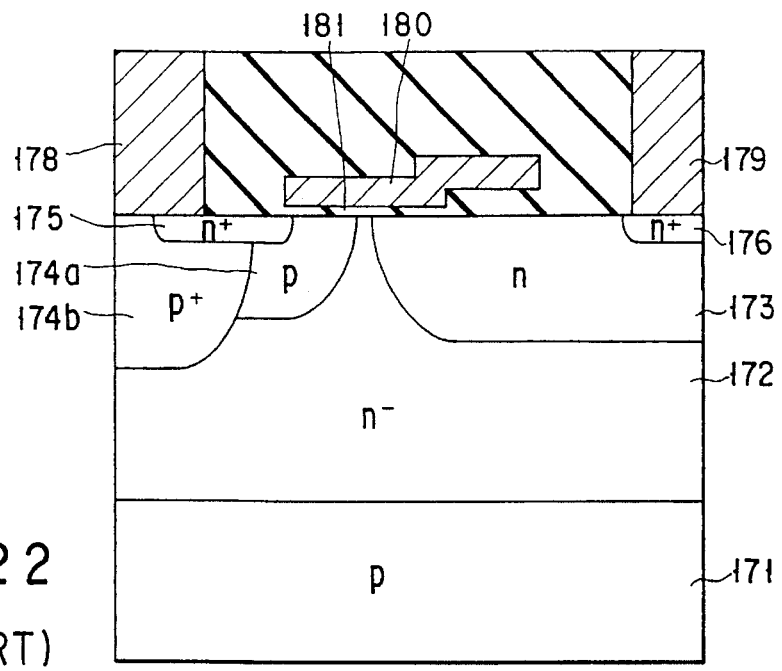
FIG. 22 is a sectional view showing a conventional high-breakdown-voltage MOSFET for an output stage.

FIG. 22 is a sectional view showing a high-breakdown-voltage MOSFET for a conventional output stage.

Referring to FIG. 22, reference numeral 171 denotes a p-semiconductor substrate. A high-resistant n⁻-active layer 172 is epitaxially grown on the p-semiconductor substrate 171. A p-base layer 174a and a p⁺-base layer 174b are selectively formed in the surface of the n⁻-active layer 172. An n⁺-source layer 175 is selectively formed in the surfaces of the base layers 174a and 174b. A source electrode 178 is formed on the p⁺-base layer 174b and the n⁺-source layer 175.

An n-offset layer 173 is selectively formed in the surface of the n⁻-active layer 172, and an n⁺-drain layer 176 is selectively formed in the surface of the n-offset layer 173. A drain electrode 179 is formed on the n⁺-drain layer 176. A gate electrode 180 having a field plate is formed on the region between the n⁺-drain layer 176 and the n⁺-source layer 175 through a gate oxide film 181.

By the above structure, since the n⁺-drain layer 176 is formed in the n-offset layer 173, the high-breakdown-voltage MOSFET of this embodiment has a higher breakdown voltage than that of a normal MOSFET.

In the high-breakdown-voltage MOSFET of this type, however, isolation is obtained by a pn junction between the p-semiconductor substrate 171 and the n⁻-active layer 172. However, sufficient dielectric isolation between the devices cannot be achieved. This MOSFET is susceptible to noise. In addition, when this MOSFET is used as a high-side switch, a power supply voltage is applied between the p-semiconductor substrate 171 and the n⁺-drain layer 176 in an ON state, and a depletion layer extends vertically from a junction between the p-semiconductor substrate 171 and the n⁻-active layer 172, thereby undesirably increasing the ON resistance.

Figure 15:
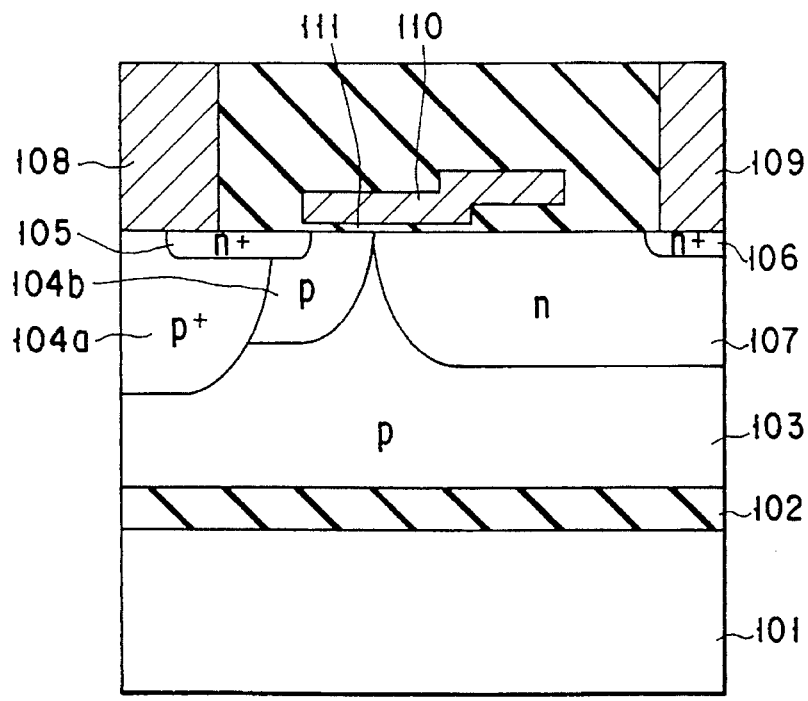
FIG. 15 is a sectional view showing a high-breakdown-voltage MOSFET according to still another embodiment of the present invention.

FIG. 15 is a sectional view showing a high-breakdown-voltage MOSFET according to still another embodiment.

Referring to FIG. 15, reference numeral 101 denotes a semiconductor substrate. A high-resistant p-active layer 103 is formed on the semiconductor substrate 101 through an insulating layer 102. The substrate 101 provided with the insulating and active layers 102 and 103 can be formed by laminating two substrates and abrading one of them. A punch-through preventive low-resistant p⁺-base layer 104a and a p-base layer 104b for forming a p-channel are selectively formed in the surface of the p-active layer 103. An n⁺-source layer 105 is selectively formed in the surfaces of the base layers 104a and 104b. A source electrode 108 is formed on the p⁺-base layer 104a and the n⁺-source layer 105.

An n-offset layer 107 is selectively formed in the surface of the p-active layer 103. Donor ions are implanted at a dose of 2 to $3\times10^{12}$ cm⁻² and annealed to perform shallow diffusion, thereby forming the n-offset layer 107. An n⁺-drain layer 106 is selectively formed in the surface of the n-offset layer 107. A drain electrode 109 is formed on the n⁺-drain layer 106.

A gate electrode 110 is formed in the region between the n⁺-source layer 105 and the n⁺-drain layer 106 through a gate oxide film 111 having a thickness of about 15 nm. The gate electrode 110 has a field plate. This field plate serves to weaken an electric field at the end portion of the gate on the drain side.

By the above structure, since the n⁺-drain layer 106 is formed in the n-offset layer 107, the high-breakdown-voltage MOSFET of this embodiment has a breakdown voltage higher than that of a normal MOSFET. In addition, since the devices are formed on the semiconductor substrate 101 through the insulating layer 102, that is, since the devices are formed on an SOI substrate, perfect isolation between the devices can be performed.

Furthermore, since the impurity concentration and depth of the n-offset layer 107 are selected in the above-described manner, both breakdown voltage and ON resistance characteristics can be improved.

Figure 19:
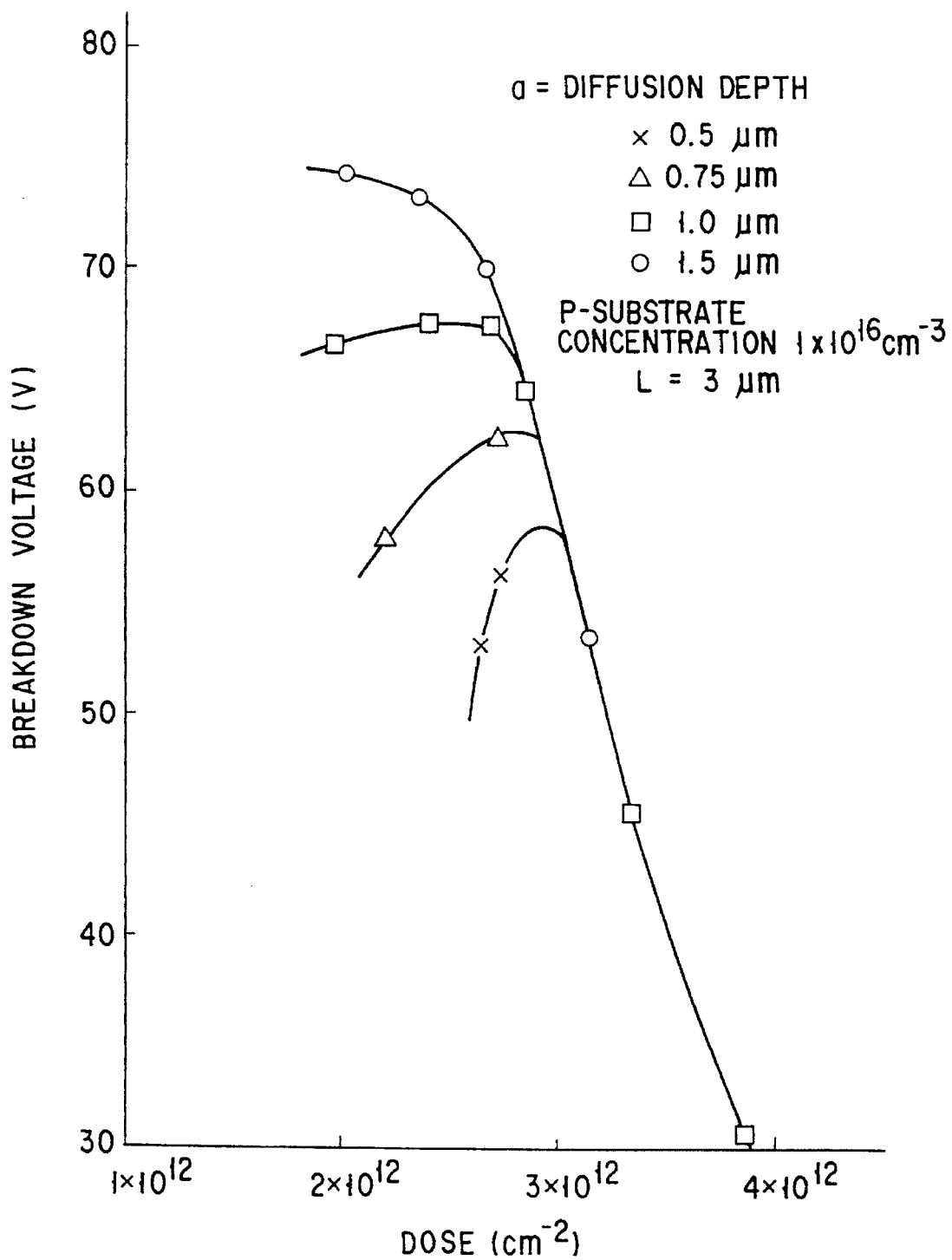
FIG. 19 is a graph showing the relationship between the breakdown voltage and the dose to an offset layer in the embodiment shown in FIG. 15.
Figure 20:
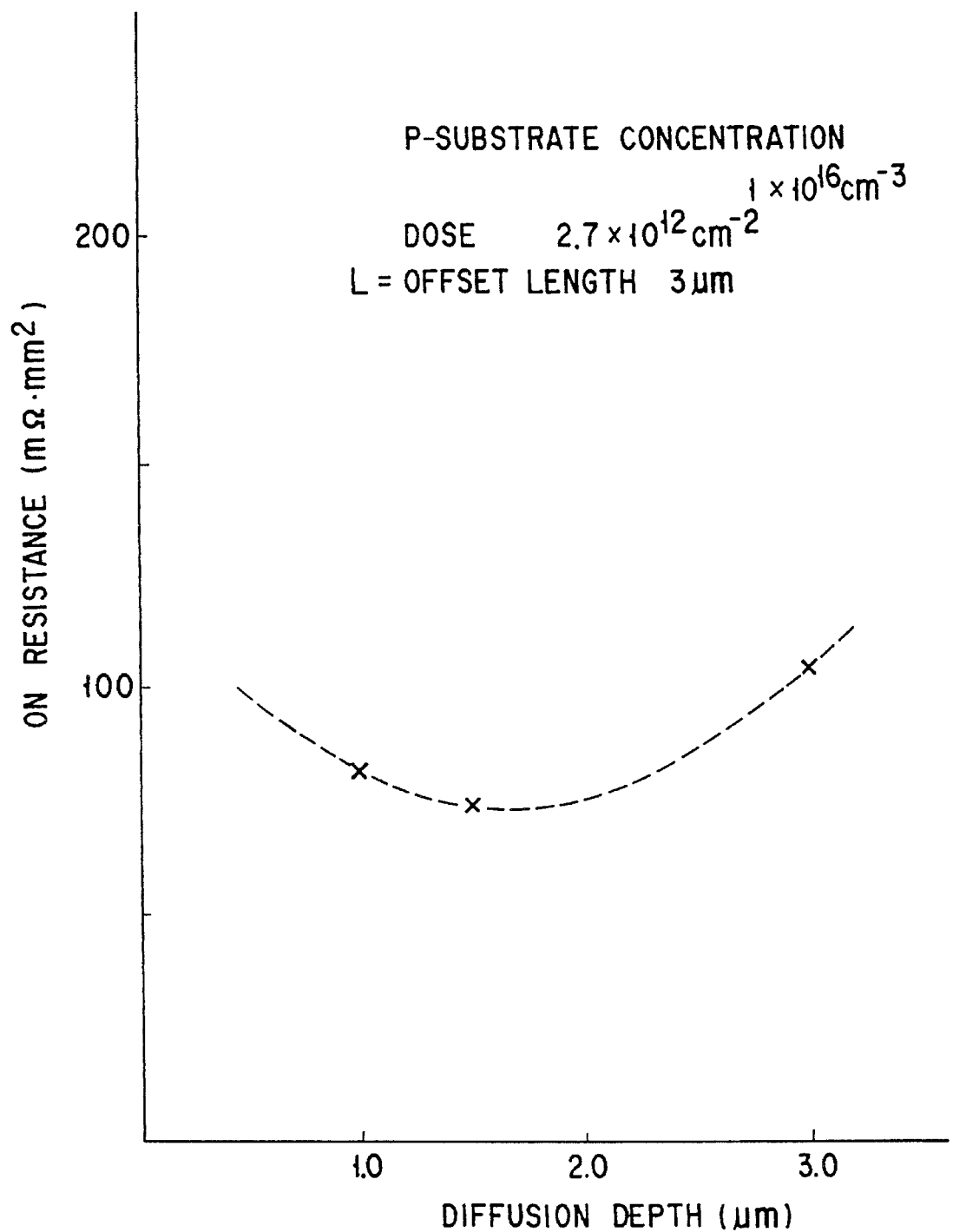
FIG. 20 is a graph showing the relationship between the ON resistance and the diffusion depth of an offset layer in the embodiment shown in FIG. 15.

FIGS. 19 and 20 show experimental data representing this.

FIG. 19 is a graph showing the relationship between the breakdown voltage and the dose to an offset layer when a diffusion depth is used as a parameter. As can be apparent from FIG. 19, when a dose is $3\times10^{12}$ cm⁻² or more, the breakdown voltage abruptly decreases regardless of the diffusion depth. When the diffusion depth is 1 μm or less, the breakdown voltage has a low peak, and the optimal dose range is also narrow. Therefore, to obtain a necessary breakdown voltage, the diffusion depth is required to have at least 1 μm and, more preferably 1.5 μm or more. If the dose falls within the range of 2 to $3\times10^{12}$ cm⁻², a sufficiently high breakdown voltage can be obtained.

FIG. 20 is a graph showing the relationship between the breakdown voltage and the diffusion depth of an offset layer when a dose is $2.7\times10^{12}$ cm⁻². As can be apparent from FIG. 20, as the diffusion depth becomes larger within the range of 1.5 to 2 μm, the ON resistance decreases, but when the diffusion depth exceeds the range, the ON resistance increases.

According to the summary of the above result, if the n-offset layer 107 has a diffusion depth of 1 to 2 μm and a dose of 2 to $3\times10^{12}$ cm⁻², improvements in both the ON resistance and breakdown voltage characteristics can be satisfied.

FIG. 21 shows the relationship between the dose to an offset layer and the breakdown voltage when the concentration of a p-substrate, i.e., the p-active layer 103 is used as a parameter. As the dose exceeds about $2\times10^{12}$ cm⁻², the breakdown voltage abruptly decreases. When the concentration of the p-substrate is increased, the dose by which breakdown voltage decreases can be increased, thereby realizing a reduction in ON resistance. However, if the concentration of the p-substrate exceeds $1\times10^{16}$ cm⁻³, the breakdown voltage decreases, so that the concentration of the p-substrate is preferably about $1\times10^{16}$ cm⁻³.

As has been described above, according to this embodiment, due to employment of an SOI substrate and optimization of the n-offset layer 107, when the MOSFET is used as a high-side switching device, a high-breakdown-voltage MOSFET which achieves a high drain breakdown voltage can be obtained without increasing the ON resistance.

Figure 16:
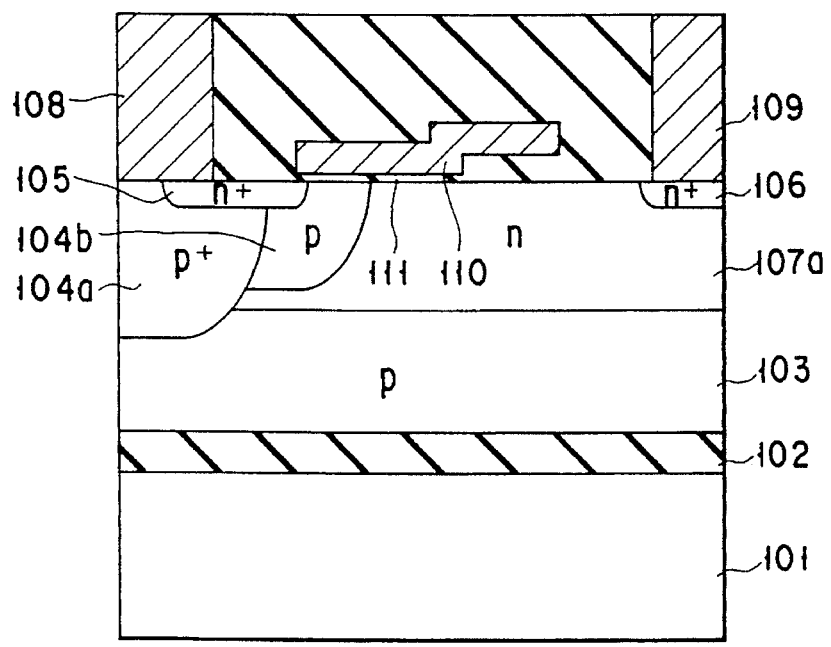
FIG. 16 is a sectional view showing a high-breakdown-voltage MOSFET according to still another embodiment of the present invention.

FIG. 16 is a sectional view showing a high-breakdown-voltage MOSFET according to still another embodiment of the present invention. The high-breakdown-voltage MOSFET of this embodiment is the same as that of the embodiment shown in FIG. 15 except that an n-offset layer 107a extends below a p-base layer 104b. Such an n-offset layer 107a can be easily made by ion implantation in the entire substrate. The same effect as in FIG. 15 can be obtained in the high-breakdown-voltage MOSFET with the above structure.

Figure 17:
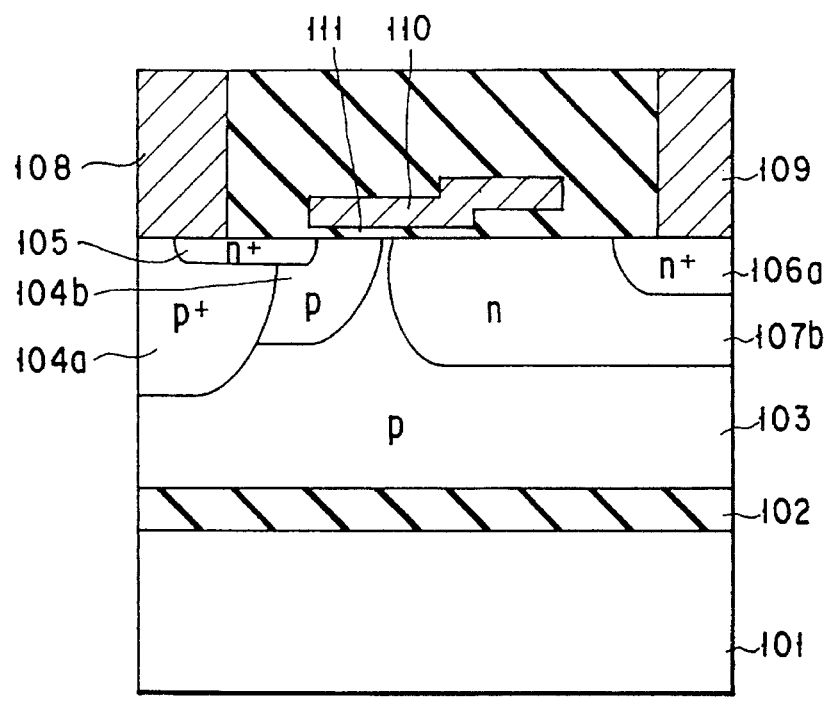
FIG. 17 is a sectional view showing a high-breakdown-voltage MOSFET according to still another embodiment of the present invention.

FIG. 17 is a sectional view showing a high-breakdown-voltage according to still another embodiment of the present invention. The high-breakdown-voltage MOSFET of this embodiment is the same as that of the embodiment shown in FIG. 15 except for the concentration profile of an n-offset layer 107b.

More specifically, the peak of the concentration of the n-offset layer 107b is located at a position deeper than that of the surface. Such an n-offset layer 107b can be formed at high acceleration energy by ion-implantation. Since the peak of the concentration of the n-offset layer 107b becomes deeper, an n⁺-drain layer 106a is formed to be deep. According to this embodiment, a current flows through a region deeper than the surface to eliminate the influence of a surface resistance, so that the ON resistance can be decreased while keeping a high breakdown voltage.

Figure 18:
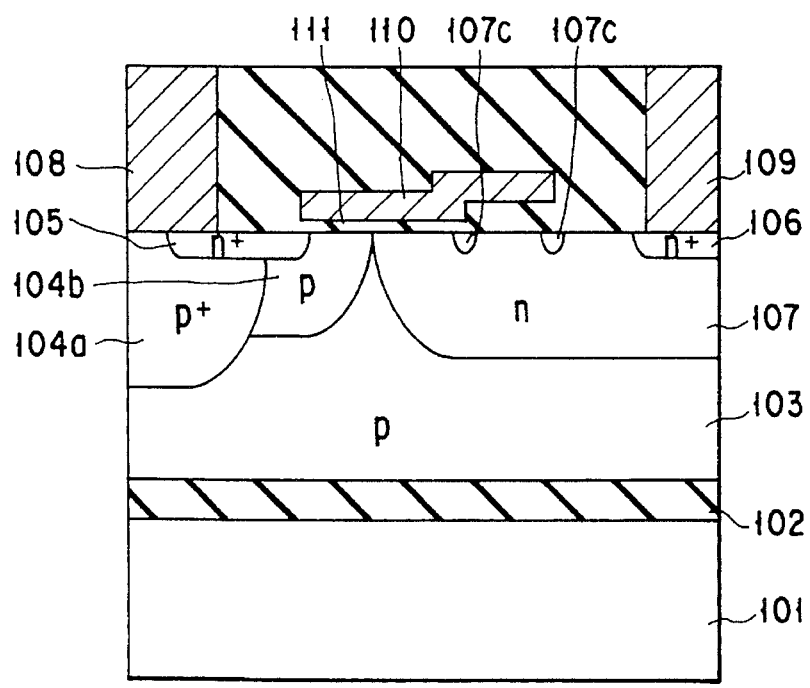
FIG. 18 is a sectional view showing a high-breakdown-voltage MOSFET according to still another embodiment of the present invention.

FIG. 18 is a sectional view showing a high-breakdown-voltage MOSFET according to still another embodiment of the present invention. The high-breakdown-voltage MOSFET of this embodiment is the same as that of the embodiment shown in FIG. 15 except that the n-impurity concentration of an n-offset layer 107c at edge portions of a gate and a field plate becomes lower than that of an n-offset layer 107 at another portion.

The n-offset layer 107 is formed such that ion implantation is performed placing a mask on the n-offset layer 107c. According to this embodiment, the n-offset layer 107c serves as a guard ring, so that the concentration of an n-impurity of the n-offset layer 107 can be increased. Therefore, since the total dose of the n-offset layer 107 can be increased, the ON resistance can be decreased while keeping a high breakdown voltage. A lightly doped p⁻-semiconductor layer may be used instead of the n-offset layer 107c.

According to the embodiments shown in FIGS. 15 to 18, the conductivity types of all semiconductor layers, e.g., the source layer, the drain layer and the like may be reversed. The conductivity type of the active layer may be a p- or n-type regardless of the conductivity types of other semiconductor layers. Still further, the previous embodiments may be combined with each other.

Figure 23A:
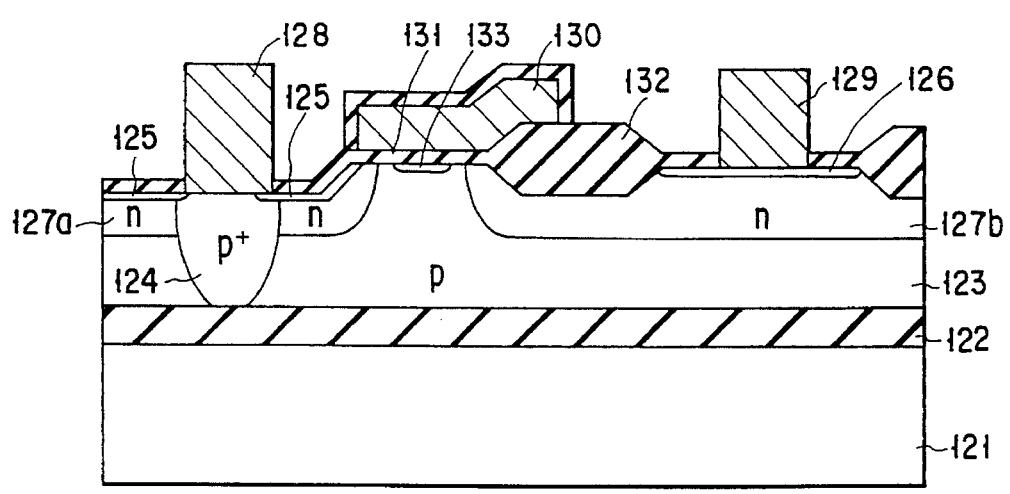
FIG. 23A is a sectional view showing a high-breakdown-voltage MOSFET according to still another embodiment of the present invention.

FIG. 23A is a sectional view of a high-breakdown-voltage MOSFET according to still another embodiment of the present invention.

Referring to FIG. 23A, reference numeral 121 denotes a semiconductor substrate. A high-resistant p-active layer 123 is formed on the semiconductor substrate 121 through an insulating layer 122. The substrate 121 provided with the insulating and active layers 122 and 123 can be formed by laminating two substrates and abrading one of them. First and second n-offset layers 127a and 127b are selectively formed in the surface of the p-active layer 123. Donor ions are implanted at a dose of 2 to $3 \times 10^{12}$ cm$^{-2}$ and annealed to perform shallow diffusion, thereby forming the n-offset layers.

An n⁺-source layer 125 and an n⁺-drain layer 126 are selectively formed in the surfaces of the n-offset layers 127a and 127b, respectively. A punch-through preventive low-resistant p⁺-layer 124 is selectively formed in the p-active layer 123 adjacent to the n-offset layer 127a. A source electrode 128 is formed on the p⁺-layer 124 and the n⁺-source layer 125. A drain electrode 129 is formed on the n⁺-drain layer 126.

A gate electrode 130 is formed between both the n-offset layers 127a and 127b through a gate oxide film 131 having a thickness of about 15 nm. This gate electrode 130 has a field plate extending onto an oxide film 132 formed by LOCOS (localized oxidation of silicon). This field plate serves to weaken an electric field at the gate end portion on the drain side.

A p⁺-base layer 133 for controlling a threshold voltage Vth is formed in the surface of the p-active layer 123 between the n-offset layers 127a and 127b. The impurity concentration of the p⁺-layer 133 is higher than that of the p-active layer 123 and those of the offset layers 127a and 127b.

Boron is ion-implanted to the center of the opening of the oxide film 132 using a mask to form the p⁺-layer 133. In this case, the position of the p⁺-layer 133 is determined not to be brought into contact with the offset layers 127a and 127b. Since the p⁺-layer 133 can be formed by ion implantation required in formation of the CMOSFET, thereby simplifying the manufacturing process as compared with the following comparative example in which a channel region is formed by double diffusion.

The steps in manufacturing the MOSFET shown in FIG. 23A will be generally described below.

The punch-through preventive p-layer 124 is formed in the high-resistant p- (or n-) active layer 123. A silicon nitride film serving as a gate is formed. To form the offset layers 127a and 127b, phosphorus is selectively ion-implanted in the layer 123 at a dose of 2 to $3 \times 10^{12}$ cm$^{-2}$ using this nitride film as a mask. LOCOS is performed until the thickness of the oxide film 132 becomes about 800 nm. At this time, diffusion is performed in the offset layers 127a and 127b to a depth of about 1 to 1.5 μm.

After the nitride film is removed, a resist is applied using a mask to the resultant structure except for the central portion of the opening of the oxide film 132, and boron for controlling the threshold value Vth is ion-implanted at a dose of $1 \times 10^{13}$ to $1 \times 10^{14}$ cm$^{-2}$. Oxidation is performed to obtain a gate oxide film having a thickness of about 15 nm, and then gate electrode 130 is deposited on the gate oxide film. Diffusion is performed such that the n⁺-source layer 125 is self-aligned using the edge of the gate on the source side and the n⁺-drain layer 126 is self-aligned using the opening of the LOCOS oxide film 132. The source and drain electrodes 128 and 129 are then formed.

Figure 23B:
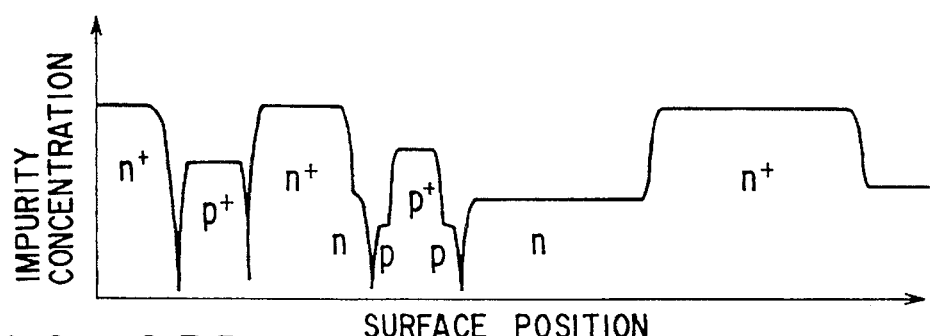
FIG. 23B is a view showing the distribution of an impurity concentration on the surface of the same device.

FIG. 23B shows the impurity concentration profile on the surface of the resultant device. In this embodiment, electrical characteristics were obtained such that the breakdown voltage was 60 V, the ON resistance was 100 mΩ·mm², and Vth was 0.8 V.

Figure 24A:
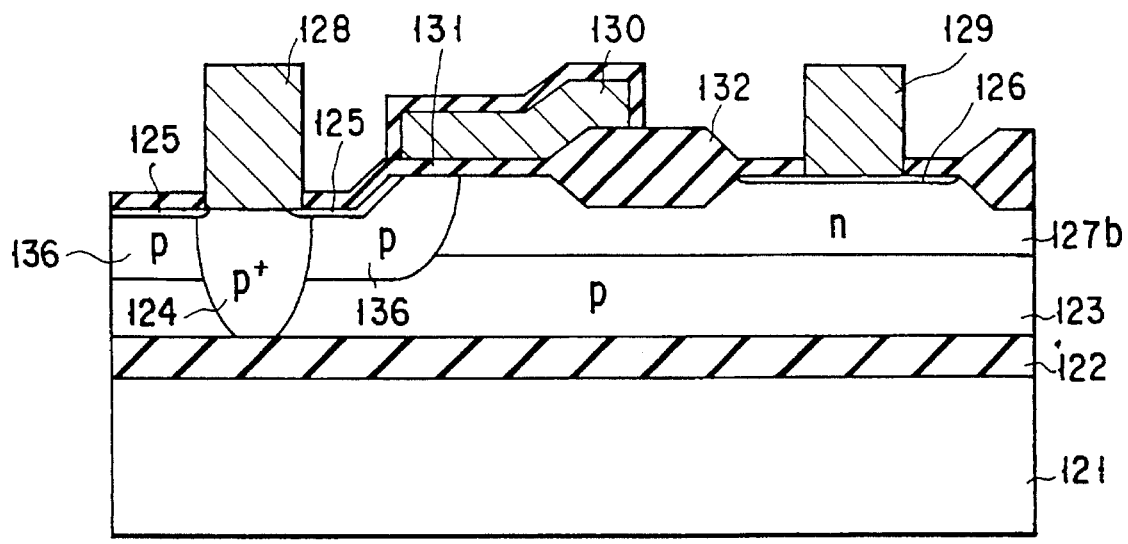
FIG. 24A is a sectional view showing a high-breakdown-voltage MOSFET for comparison with the embodiment shown in FIG. 23A.
Figure 24B:
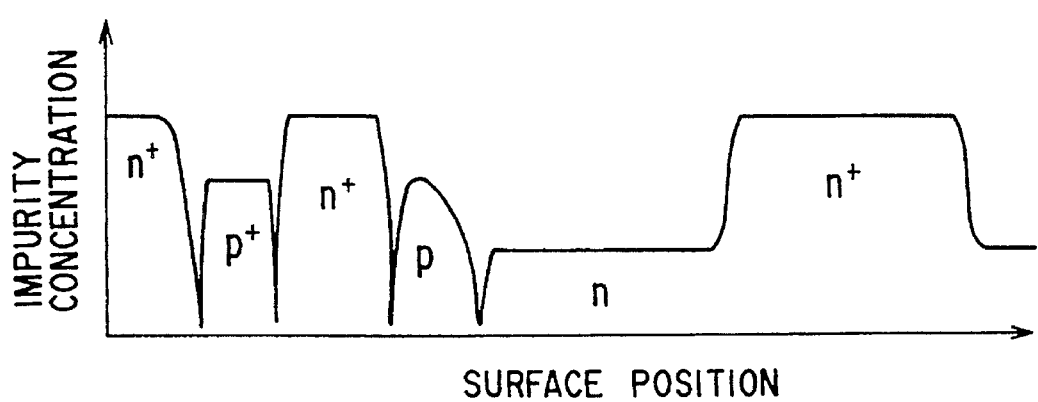
FIG. 24B is a view showing the distribution of an impurity concentration on the surface of the same device.

FIG. 24A is a sectional view showing a high-breakdown-voltage MOSFET for comparison with that of the embodiment shown in FIG. 23A. FIG. 24B shows the impurity concentration profile on the surface of the devices shown in FIG. 24A. The same reference numerals in FIG. 24A denote the same parts corresponding to that of the embodiment shown in FIG. 23A, and a description thereof will be omitted.

In this device, the control of the threshold value Vth of the devices is performed by a p-base layer 136 instead of the p⁺-layer 133. This device has a so-called DMOS structure. The p-base layer 136 and the n-source layer 125 are self-aligned by double diffusion using the gate electrode as a mask.

The element of this comparative example requires a manufacturing process different from a low-breakdown-voltage control circuit and a logic circuit in the same IC, resulting in high device manufacturing cost. To obtain a high breakdown voltage of the device, the impurity concentration of the n-offset layers 127a and 127b must be set low. When the concentration of the offset layers is set lower than that of the channel region, an impurity ion-implanted in the channel region is undesirably diffused to a region except for the gate in the subsequent thermal diffusion, thereby degrading the MOS operation. Therefore, a combination of lightly doped offset layers and a heavily doped channel region cannot be obtained.

In contrast, according to the embodiment shown in FIG. 23A, the channel region, i.e., the p⁺-layer 133 is independently formed by boron ion-implantation. Therefore, while the impurity concentration of the offset layers are low to obtain a device having a high breakdown voltage, an impurity is ion-implanted in the channel region in accordance with the desirable threshold voltage Vth.

In addition, since the p⁺-layer 133 is formed by ion implantation required to form a CMOSFET, this high-breakdown-voltage device can be formed at the same time as a low-breakdown-voltage control circuit and a logic circuit in the same LSI.

The diffusion depth and dose of the offset layers 127a and 127b, and the impurity concentration of the p-active layer 123 in the MOSFET shown in FIG. 23A are selected on the basis of the data indicated in FIGS. 19 to 21, as in that shown in FIG. 15. More specifically, if the offset layers 127a and 127b have a diffusion depth of 1 to 2 μm and a dose of 2 to $3 \times 10^{12}$ cm$^{-2}$, improvements in both the ON resistance and breakdown voltage characteristics can be satisfied. The impurity concentration of the p-active layer 123 is preferably about $1 \times 10^{16}$ cm$^{-3}$.

Figure 82:
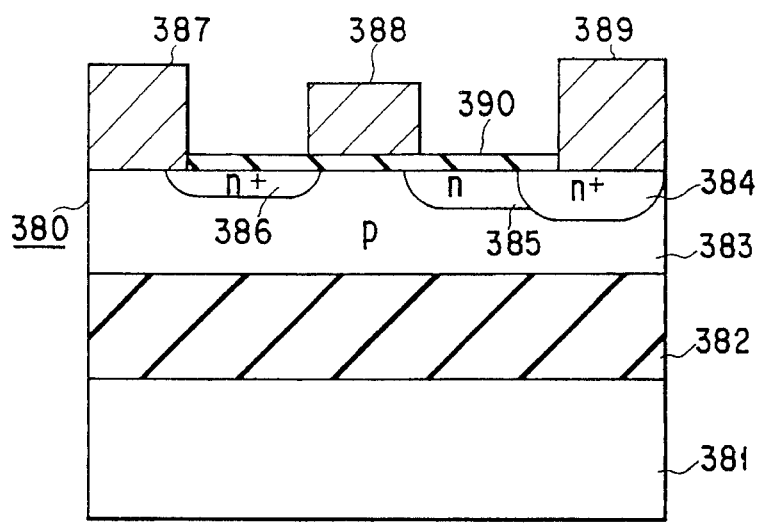
FIG. 82 is a sectional view showing the structure of a conventional MOSFET.

FIG. 82 is a sectional view showing a conventional MOSFET which is known as an advantageous structure for a high-speed operation.

Referring to FIG. 82, reference numeral 381 denotes a silicon support substrate. A single-crystal silicon layer 380 is formed on this silicon support substrate 381 through a silicon oxide film 382. The silicon layer 380 and the silicon oxide film 382 constitute an SOI substrate.

A p-diffusion layer 383 is selectively formed in the surface of the silicon layer 380. A heavily doped $n^+$-diffusion layer 384 is selectively formed in the surface of the p-diffusion layer 383. An n-drain diffusion layer 385 is formed from part of the surface of the $n^+$-diffusion layer 384 to the surface of the p-diffusion layer 383. In addition, another $n^+$-source diffusion layer 386 different from the n-drain diffusion layer 385 is selectively formed in the surface of the p-diffusion layer 383.

A gate electrode 388 is formed on the p-diffusion layer 383 between the n-drain diffusion layer 385 and the $n^+$-source diffusion layer 386 through a gate insulating film 390. In addition, a drain electrode 389 contacting the n-drain diffusion layer 385 through the $n^+$-diffusion layer 384, and a source electrode 387 contacting the $n^+$-source diffusion layer 386 are formed in the p-diffusion layer 383.

The MOSFET having the above structure can perform a high-speed operation because the parasitic capacitance of this MOSFET is smaller than that of a normal MOSFET.

The maximum operating frequency of the MOSFET of this type is limited by the capacitance in the devices, and more particularly, the output capacitance. To decrease the output capacitance, the silicon layer 380 may be made thin because the capacitance of a pn junction occupies a large proportion in the output capacitance.

However, as the silicon layer 380 becomes thinner, the distance between the $n^+$-source diffusion layer 386 and the silicon oxide film 382 becomes shorter, and the resistance between a channel region below the gate electrode 388 and the source electrode 387 undesirably increases.

As the silicon layer 380 becomes further thinner, the $n^+$-source diffusion layer 386 contacts the silicon oxide film 382 at last, and the above channel region is electrically disconnected from the source electrode 387 to float the potential of the channel region, thereby making it impossible to assure a normal device operation.

FIG. 25 is a plan view showing a high-frequency MOSFET according to still another embodiment of the present invention, and FIG. 26 is a sectional view taken along the line A—A' of FIG. 25.

Referring to FIGS. 25 and 26, reference numeral 201 denotes a silicon support substrate. A silicon oxide film 202 is formed on this silicon support substrate 201. A silicon layer 217 is formed on this silicon oxide film 202. A p-diffusion layer 205 reaching the silicon oxide film 202 is selectively formed in this silicon layer 217. An n-drain diffusion layer 206 reaching the silicon oxide film 202 is selectively formed in the p-diffusion layer 205. This n-drain diffusion layer 206 is connected to a drain electrode 211 through a heavily doped $n^+$-diffusion layer 207.

Another n-source diffusion layer 204 reaching to the silicon oxide film 202 and different from the n-drain diffusion layer 206 and the $n^+$-diffusion layer 207 is selectively formed in this p-diffusion layer 205. The n-source diffusion layer 204 is connected to a source electrode 209 through a heavily doped $n^+$-diffusion layer 203.

A gate electrode 210 is formed on the p-diffusion layer 205 in the region between the n-drain diffusion layer 206 and the n-source diffusion layer 204 through a gate insulating film 208. The p-diffusion layer 205 serving as a channel region ch below this gate electrode 210 is connected to the source electrode 209 through a $p^+$-short-circuiting diffusion layer 212 contacting the $n^+$-diffusion layer 203 and the n-source diffusion layer 204.

In the MOSFET having the above structure, since the silicon layer 217 becomes thinner until the semiconductor layers, e.g., the n-source diffusion layer 204, the p-diffusion layer 205, the n-drain diffusion layer 206, and the like contact the silicon oxide film 202, the proportion of the capacitance of a pn junction decreases. Therefore, an output capacitance decreases to obtain a maximum operating frequency higher than that in a conventional MOSFET, thereby realizing a higher-speed operation.

Furthermore, since the p-diffusion layer 205 in the channel region ch is connected to the source electrode 209 through the $p^+$-shortening diffusion layer 212, the channel region ch is kept at a predetermined potential. Thus, the potential of the p-diffusion layer 205 is not floated by forming the silicon layer 217 to be thin, and an abnormal potential of the channel region ch is not generated.

Therefore, according to this embodiment, the MOSFET free from an operation error caused by the abnormal potential of the channel region and having a high operating frequency can be obtained.

Figure 27:
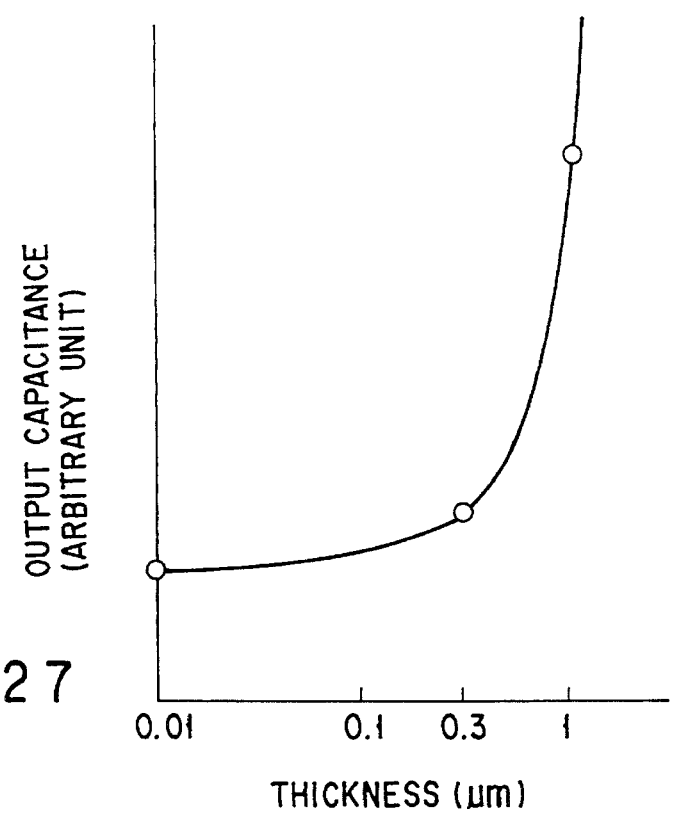
FIG. 27 is a graph showing the relationship between the thickness of a silicon layer and the output capacitance in the embodiment shown in FIGS. 25 and 26.

FIG. 27 is a graph showing the relationship between the thickness of a silicon layer of the SOI substrate and the output capacitance. As can be apparent from FIG. 27, when the thickness of the silicon layer exceeds 0.3 μm, the output capacitance abruptly increases. Therefore, the thickness of the silicon layer is set to 0.3 μm or less to obtain a higher-speed MOSFET.

Figure 28:
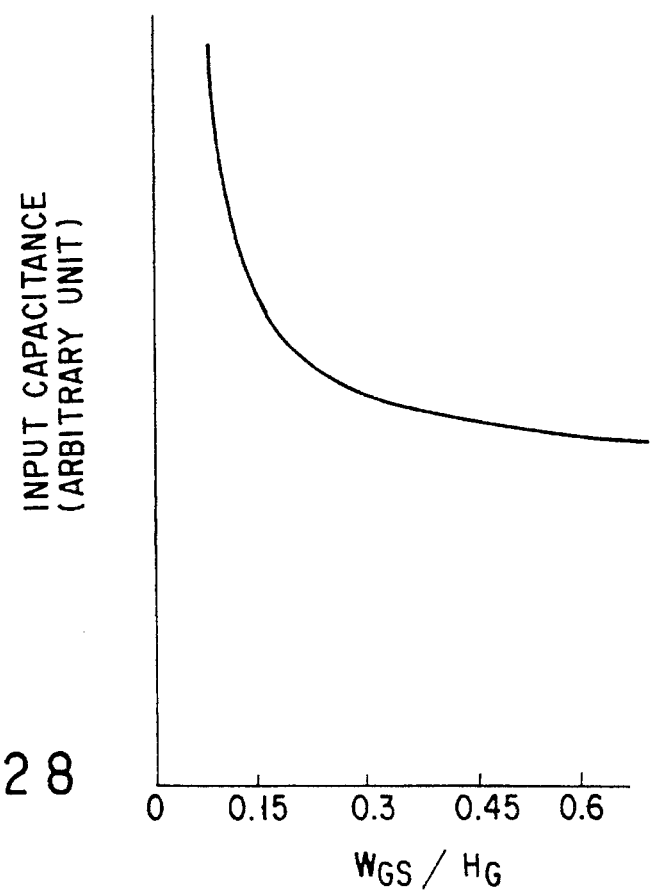
FIG. 28 is a graph showing the relationship between the input capacitance and a value obtained by dividing a distance between source and gate electrodes by the height of the gate electrode in the embodiment shown in FIGS. 25 and 26.

FIG. 28 is a graph showing the relationship between the input capacitance and a value obtained by dividing a distance $W_{GS}$ between the source electrode 9 and the gate electrode 10 by a height $H_G$ of the gate electrode 10. As can be apparent from FIG. 28, if $W_{GS}/H_G \geq 0.15$, e.g., if $H_G$ is about 1 μm or more, the input capacitance abruptly increases at the distance $W_{GS}$ of less than 0.15 μm. Therefore, the distance $W_{GS}$ is preferably set to be 0.15 μm or more.

Figure 29:
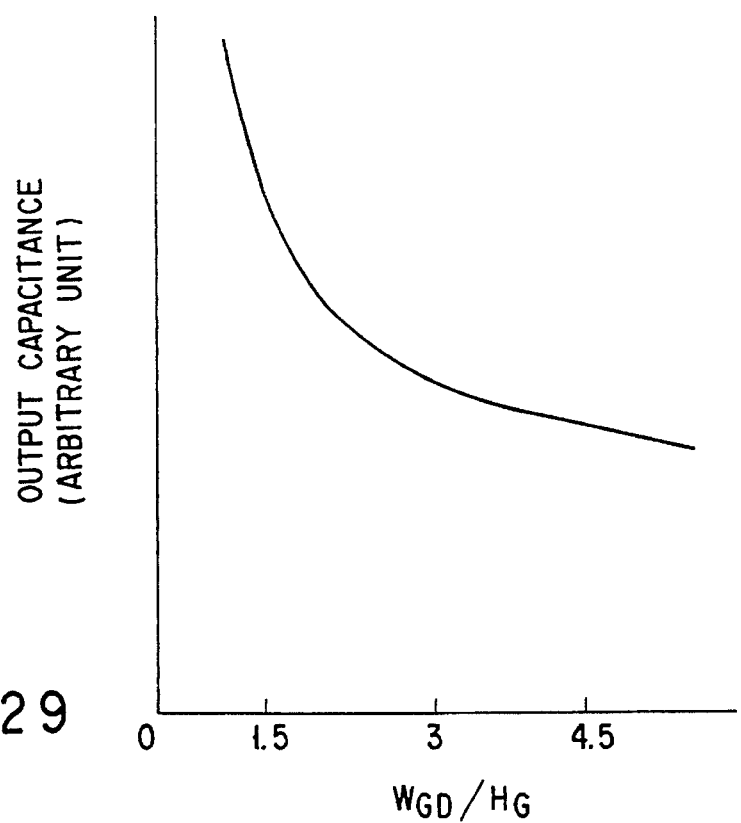
FIG. 29 is a graph showing the relationship between the output capacitance and the value obtained by dividing the distance between the drain and gate electrodes by the height of the gate electrode in the embodiment shown in FIGS. 25 and 26.

FIG. 29 is a graph showing the relationship between the output capacitance and a value obtained by dividing a distance $W_{GD}$ between the drain electrode 11 and the gate electrode 10 by the height $H_G$ of the gate electrode 10. As can be apparent from FIG. 29, if $W_{GD}/H_G \geq 1.5$, e.g., if $H_G$ is about 1 μm or more, the output capacitance abruptly increases at the distance $W_{GD}$ of less than 1.5 μm. Therefore, the distance $W_{GD}$ is preferably set to be 1.5 μm or more.

Figure 30:
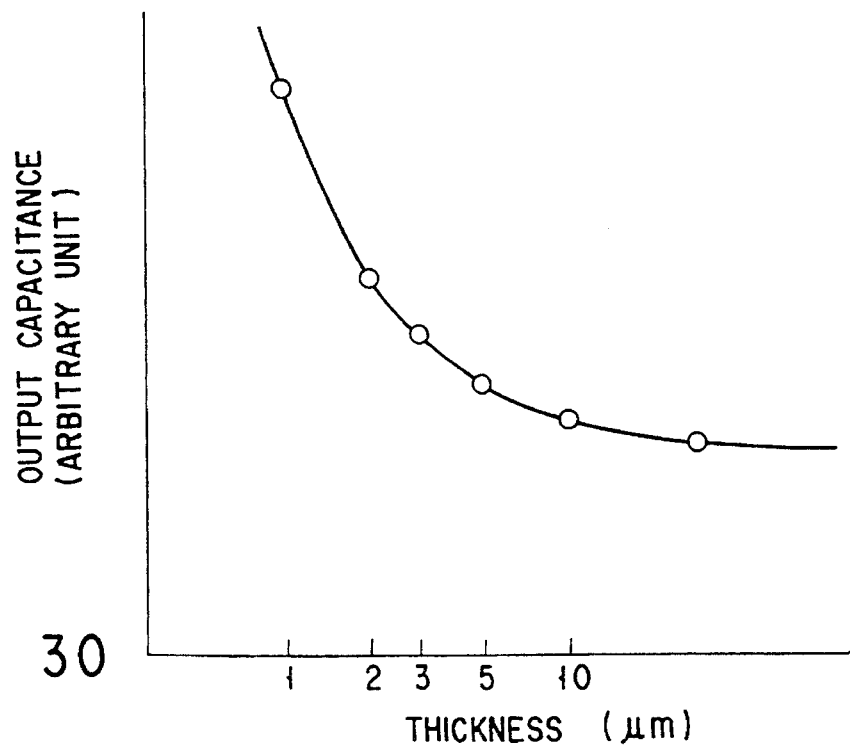
FIG. 30 is a graph showing the relationship between the thickness of a silicon oxide film and the output capacitance in the embodiment shown in FIGS. 25 and 26.

FIG. 30 is a graph showing the relationship between the thickness of a silicon oxide film on the SOI substrate and the output capacitance. As can be apparent from FIG. 30, if the thickness of the silicon oxide film is less than 2 μm, the output capacitance abruptly increases. Therefore, the thickness of the silicone film is set to be 2 μm or more to obtain a high-speed MOSFET.

A MOSFET according to other embodiments of the present invention will be described below. The same reference numerals in the following drawings denote the same parts as in FIGS. 25 and 26, and a detailed description thereof will be omitted.

FIG. 31 is a plan view showing a MOSFET according to still another embodiment of the present invention.

This MOSFET is obtained by partially modifying the MOSFET shown in FIGS. 25 and 26. Dimensions of the $n^+$-diffusion layer 203 and the n-source diffusion layer 204 in a channel width direction are larger than that of the $p^+$-short-circuiting diffusion layer 212.

According to the MOSFET having the above structure, since an effective channel length is larger than those of the previous embodiments, a larger current can flow.

FIG. 32 is a plan view showing a MOSFET according to still another embodiment of the present invention.

This MOSFET is obtained by partially modifying the MOSFET shown in FIGS. 25 and 26. The dimension of the p$^+$-shortening diffusion layer 212 in a channel length direction is reduced, and the region of the p-diffusion layer 205 extends by a distance corresponding to the reduction of the layer 212.

According to the MOSFET having the above structure, since the p$^+$-short-circuiting diffusion layer 212 does not extend to the channel region ch, the fluctuation of a threshold voltage by diffusion of a p-impurity in the p$^+$-short-circuiting diffusion layer 212 to the channel region ch can be prevented.

Figure 33:
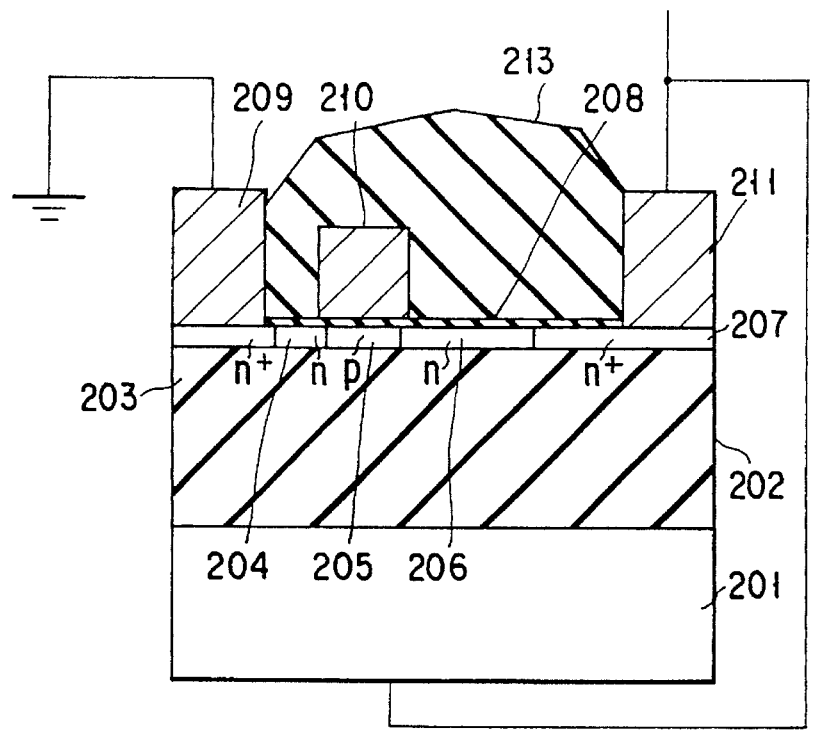
FIG. 33 is a sectional view showing a MOSFET according to still another embodiment of the present invention.

FIG. 33 is a sectional view showing a MOSFET according to still another embodiment of the present invention.

In this embodiment, the potential of a silicon support substrate 201 is equal to that of a drain electrode 211. By selecting the potential of the drain electrode 211 in this manner, when an n-drain diffusion layer 206 and an n$^+$-diffusion layer 207 are formed larger to increase a breakdown voltage, a parasitic capacitance does not increase. Referring to FIG. 33, reference numeral 213 denotes an insulating film.

Figure 34:
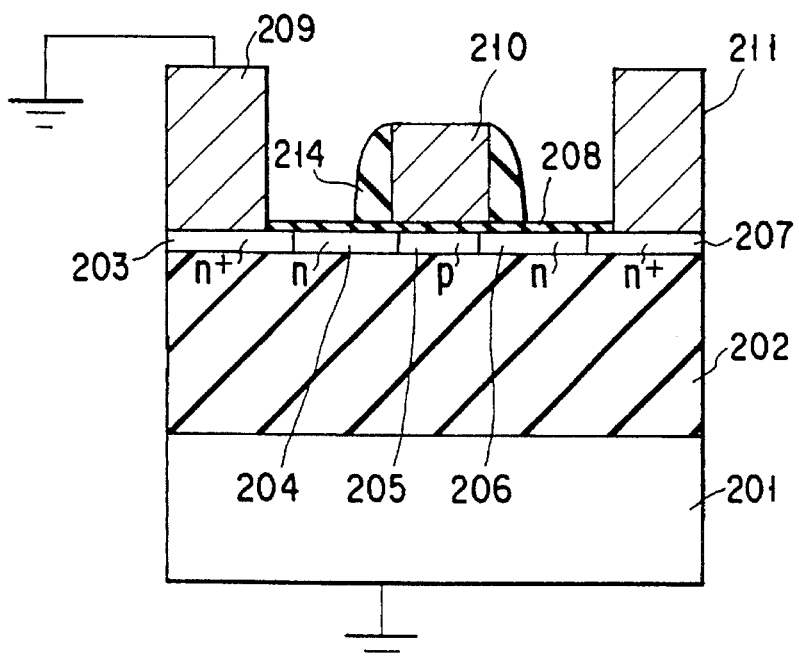
FIG. 34 is a sectional view showing a MOSFET according to still another embodiment of the present invention.

FIG. 34 is a sectional view showing a MOSFET according to still another embodiment of the present invention.

This MOSFET is obtained by partially modifying the MOSFET shown in FIGS. 25 and 26. In this embodiment, the side wall of the gate electrode 210 is covered with a side-wall gate insulating film 214.

According to the MOSFET having the above structure, the spaces between the side-wall gate insulating film 214 and the drain electrode 211, and between the side-wall gate insulating film 214 and the source electrode 209 are set vacuum or filled with a gas such as air to decrease a dielectric constant, thereby reducing a parasitic capacitance.

FIG. 35 is a sectional view showing a MOSFET according to still another embodiment of the present invention.

This MOSFET is obtained by partially modifying the MOSFET in FIGS. 25 and 26. The p-diffusion layer 205 of the gate electrode (channel portion) is reduced. This gate electrode portion can be formed by, e.g., the following method.

As shown in FIG. 37A, a thick oxide film 215 is formed on the n-drain diffusion layer 206.

As shown in FIG. 37B, p-impurity ions 216 are implanted in the n-drain diffusion layer 206 by oblique ion implantation using the oxide film 215 as a mask. At this time, the p-impurity ions 216 are not implanted in the n-drain diffusion layer 206 near the oxide film 215, thereby forming the illustrated p-diffusion layer 205 which does not extend below the oxide film 215.

As shown in FIG. 37C, after a first gate electrode 210a comprising a polysilicon film is formed on the oxide film 215, a second gate electrode 210b comprising a polysilicon film is formed on the side wall of the gate electrode 210a on the p-diffusion layer 205 side.

As shown in FIG. 37D, p-impurity ions 216a are implanted in the p-diffusion layer 206 by conventional ion implantation using the gate electrodes 210a and 210b as masks to widen the area of the p-diffusion layer 205. Then, n-impurity ions 217 are implanted in the p-diffusion layer 205 to form the n-source diffusion layer 204.

As shown in FIG. 37E, a side-wall gate insulating film 214 is formed to completely form the gate electrode portion.

Instead of forming the p-diffusion layer 205 by the method shown in FIGS. 37A and 37B, a p-impurity 216b is ion-implanted to the n-drain diffusion layer 206 by conventional ion implantation to form the p-diffusion layer 205 extending below the oxide film 215, as shown in FIG. 38A. Then, the oxide film 215 is side-etched as shown in FIG. 38B.

FIG. 36 is a sectional view showing a MOSFET according to still another embodiment of the present invention.

This MOSFET is obtained by partially modifying the MOSFET shown in FIG. 35. The p-diffusion layer 205 on the drain side is reduced.

FIG. 39A is a plan view showing a MOSFET according to still another embodiment of the present invention, and FIG. 39B is a sectional view taken along the line B—B' of FIG. 39A.

In the MOSFET of this embodiment, a trench groove 219 reaching a silicon support substrate 201 is formed below a source electrode 209. This trench groove 219 is filled with a conductive material (e.g., Al) having a high thermal conductivity. Reference numeral 220 denotes a gate electrode contact hole.

According to the MOSFET having the above structure, a ground wiring at the surface portion of the silicon layer for setting a potential of the source electrode 209 to be equal to that of the silicon support substrate 201 is not needed, so that the parasitic capacitance caused by the source electrode 209 and the ground wiring at the surface portion of the silicon layer can be reduced. In addition, heat generated in the silicon layer during the operation can be dissipated to the silicon supporting substrate 201 through a conductive material (e.g., Al) with a high thermal conductivity embeded in the trench groove 219.

FIG. 40 is a sectional view showing a MOSFET according to still another embodiment of the present invention.

This MOSFET is obtained by partially modifying the MOSFET shown in FIGS. 39A and 39B. The gate electrode 210 extends above the source electrode 9. The gate electrode 210 is electrically isolated from the source electrode 9 by an oxide film 221. The gate electrode 210 is formed by, e.g., polysilicon, and the surface of the gate electrode 210 is converted into a silicide surface.

According to this MOSFET, the gate resistance is decreased to such a degree that the gate electrode 210 extends. In this embodiment, the gate electrode 210 extends to cover the entire surface of the source electrode 209. However, if the gate electrode 210 extends only to the n$^+$-diffusion layer 203, the parasitic capacitance between the source electrode 209 and the gate electrode 210 can be reduced.

FIG. 41A is a plan view showing the structure of a MOSFET according to still another embodiment of the present invention, and FIG. 41B is a sectional view taken along the line C—C' of FIG. 41A.

The MOSFET of this embodiment is the same as that of the embodiment in FIGS. 39A and 39B except that a trench groove 222 reaching a silicon support substrate 201 is formed below a drain electrode 211. This trench groove 222 is filled with a conductive material (e.g., Al) having a high thermal conductivity, as in the embodiment in FIGS. 39A and 39B.

In the MOSFET having the above structure, the same effect as in FIGS. 39A and 39B can be obtained. Furthermore, since heat is generated at the drain side, this MOSFET is advantageous in a heat dissipation measure.

Figure 42:
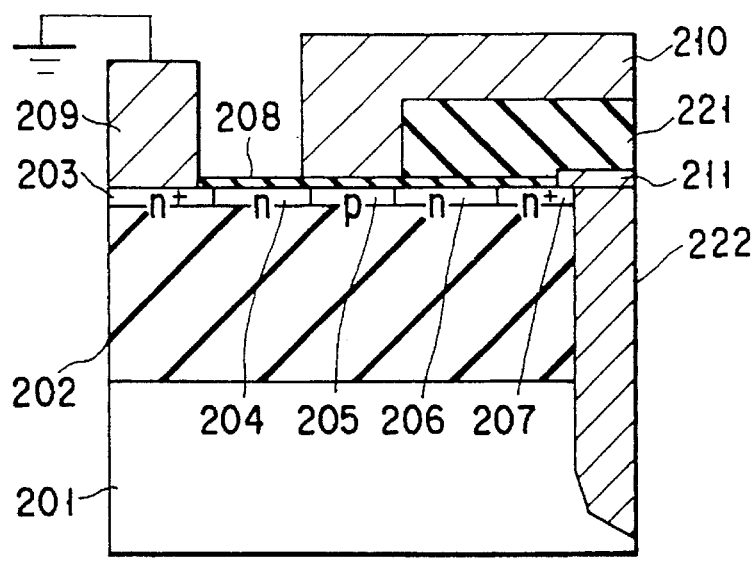
FIG. 42 is a sectional view showing a MOSFET according to still another embodiment of the present invention.

FIG. 42 is a sectional view showing a MOSFET according to still another embodiment of the present invention.

This MOSFET is obtained by partially modifying the MOSFET shown in FIGS. 41A and 41B. A gate electrode 210 extends above a drain electrode 211. More specifically, the structures on the source and drain sides in the MOSFET shown in FIG. 40 are reversed. To reduce a parasitic capacitance, the gate electrode 210 may be shortened so as not to cover the drain electrode 211.

Figure 43:
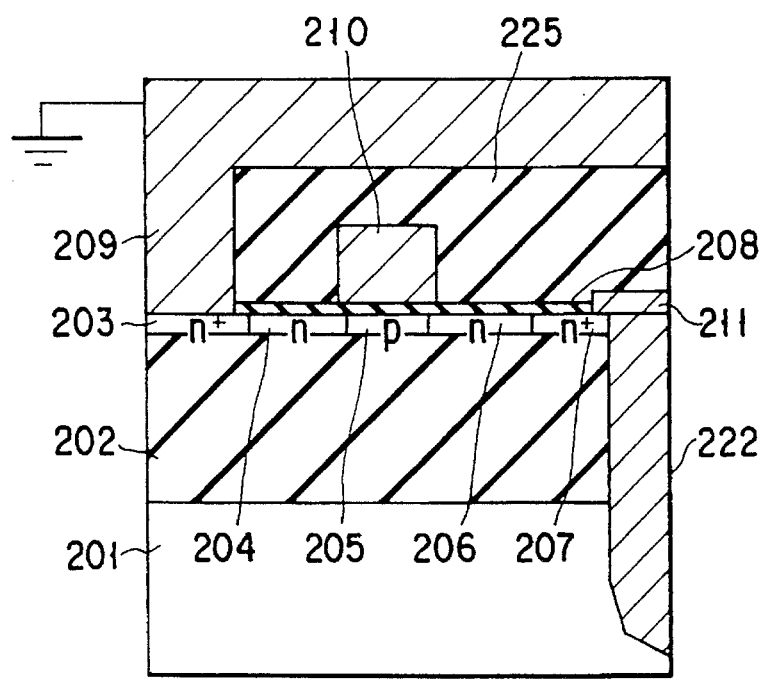
FIG. 43 is a sectional view showing a MOSFET according to still another embodiment of the present invention.

FIG. 43 is a sectional view showing a MOSFET according to still another embodiment of the present invention.

This MOSFET is obtained by partially modifying the MOSFET shown in FIGS. 41A and 41B. A source electrode 209 extends above a drain electrode 211. The source electrode 209 is electrically isolated from a gate electrode 210 and the drain electrode 211 by an oxide film 225.

According to the MOSFET having the above structure, the source resistance is reduced to such a degree that the source electrode 209 extends. In addition, since the source electrode 209 is formed by a conductive material having a high thermal conductivity, the temperature distribution can be made uniformly, and heat in the devices can be dissipated from the source electrode 209.

FIG. 44 is a sectional view showing a MOSFET according to still another embodiment of the present invention.

This MOSFET is obtained by partially modifying the MOSFET shown in FIG. 42. A gate electrode 210 is shortened to reduce the parasitic capacitance between the gate electrode 210 and a drain electrode 211.

FIG. 45 is a sectional view showing a MOSFET according to still another embodiment of the present invention.

This MOSFET is obtained by partially modifying the MOSFET shown in FIG. 43. A source electrode 209 is shortened to reduce the parasitic capacitance between the source electrode 209 and a drain electrode 211.

Figure 46:
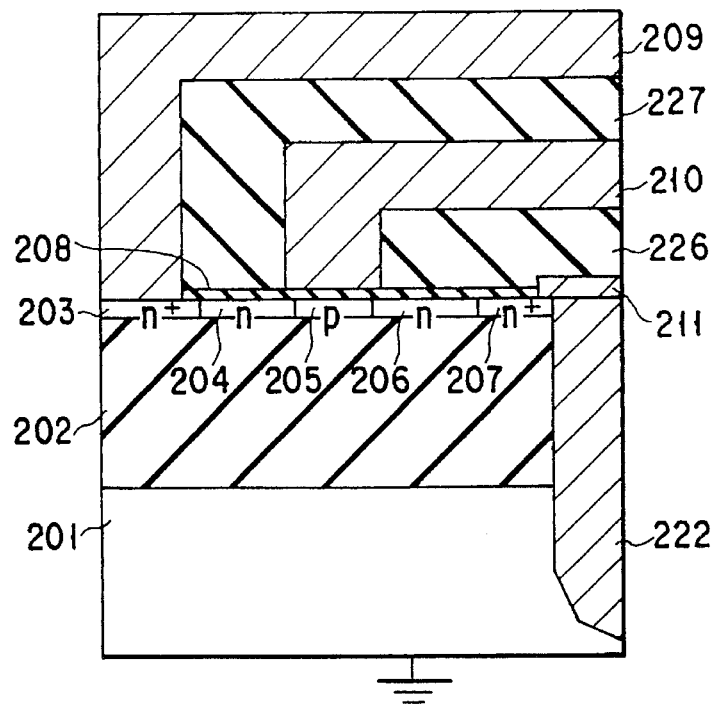
FIG. 46 is a sectional view showing a MOSFET according to still another embodiment of the present invention.

FIG. 46 is a sectional view showing a MOSFET according to still another embodiment of the present invention.

In this MOSFET, a source electrode 209 and a gate electrode 210 extend above a drain electrode 211. The gate electrode 210 and the drain electrode 211 are electrically isolated by an oxide film 226, and the source electrode 209 and the gate electrode 210 are electrically isolated by an oxide film 227.

According to the MOSFET having the above structure, both a gate resistance and the source resistance can be reduced at the same time.

Figure 47:
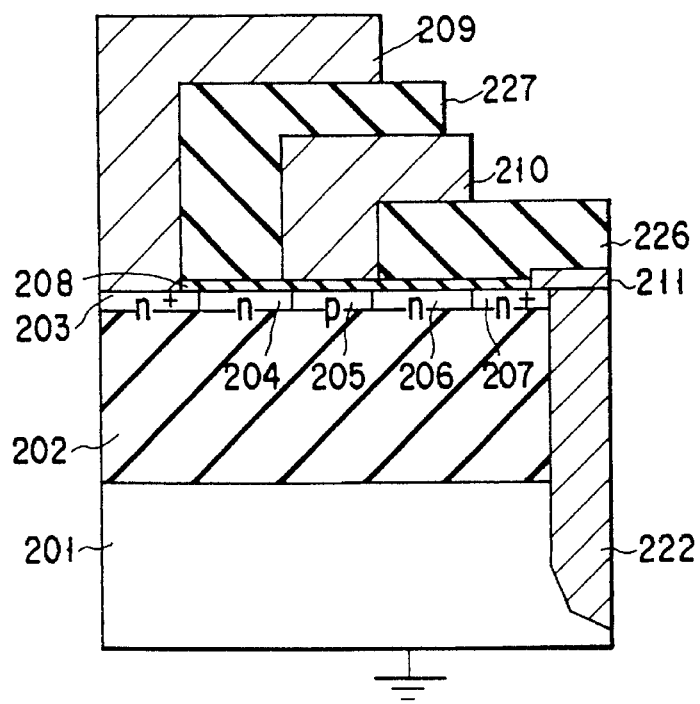
FIG. 47 is a sectional view showing a MOSFET according to still another embodiment of the present invention.

FIG. 47 is a sectional view showing a MOSFET according to still another embodiment of the present invention.

This MOSFET is obtained by partially modifying the MOSFET shown in FIG. 46. Source and drain electrodes 209 and 211 are shortened to reduce a parasitic capacitance. In addition, the upper portion of a gate electrode 210 is converted into a silicide portion to reduce a gate resistance.

FIG. 48 is a sectional view showing a MOSFET according to still another embodiment of the present invention.

This MOSFET is obtained by partially modifying the MOSFET shown in FIG. 46. A gate electrode 210 extends above a drain electrode 211, as in the MOSFET shown in FIG. 42. In the MOSFETs shown in FIGS. 41A to 48, the structures on the drain and source sides may be reversed.

FIG. 49 is a sectional view showing a MOSFET according to still another embodiment of the present invention.

This MOSFET is obtained by partially modifying the MOSFET shown in FIGS. 41A and 41B. A wider trench groove 222 is formed, and a drain electrode 211 is also formed in the trench groove. A drain electrode 211 contacts an n$^+$-diffusion layer 207 in the trench groove 222, and is formed in the side wall of the trench groove 222. The trench groove 222 is not fully filled with a conductive material (e.g., Al) having a high thermal conductivity.

In the MOSFET having this structure, the contact area between the silicon layer, and the drain electrode 211 and the filling material increases to more effectively dissipate heat 229 generated in the silicon layer.

FIG. 50 is a sectional view showing a MOSFET according to still another embodiment of the present invention.

In this MOSFET, the structures on the drain and source sides are reversed in the MOSFET shown in FIG. 49.

In the MOSFET having the above structure, the same effect as in FIG. 49 can be obtained. Furthermore, since the source electrode 209 comes close to a channel region, this MOSFET further has an advantage in that punch-through breakdown voltage increases.

FIG. 51 is a plan view showing a wiring structure according to still another embodiment of the present invention, and FIGS. 52A and 52B are sectional views taken along the lines D—D' and E—E', respectively.

Referring to FIGS. 51, 52A and 52B, reference numeral 231 denotes a silicon support substrate. A silicon oxide film 232 and a silicon layer 233 are sequentially formed on this silicon support substrate 231. An SOI structure is constituted by the silicon oxide film 232 and the silicon layer 233.

An n$^+$-diffusion layer 234 is selectively formed in the surface of the silicon layer 233. This n$^+$-diffusion layer 234 is surrounded by a trench groove 235 reaching the silicon oxide film 232. The trench groove 235 is filled with an insulating oxide film, so that the n$^+$-diffusion layer 234 is isolated from other semiconductor layers (not shown) formed in the silicon layer 233.

An oxide film 236 is formed in the surface of the silicon layer 233, and the n$^+$-diffusion layer 234 contacts a first wiring layer 237 and a third wiring layer 239 through contact holes 240 and 241 formed in the oxide film 236. In addition, a second wiring layer 238 is disposed between the first and third wiring layers 237 and 239.

With this wiring structure, a second wiring layer need not be formed on the first and third wiring layers 237 and 239 through an insulating film, unlike a conventional two-layered wiring structure, thereby reducing the number of wiring steps. In addition, with this wiring structure, since the n$^+$-diffusion layer 234 is dielectrically isolated from other semiconductor layers formed in the silicon layer 233 by the trench groove 235 and the silicon oxide film 232, the parasitic device of, e.g., a pn junction can be eliminated.

Figure 53:
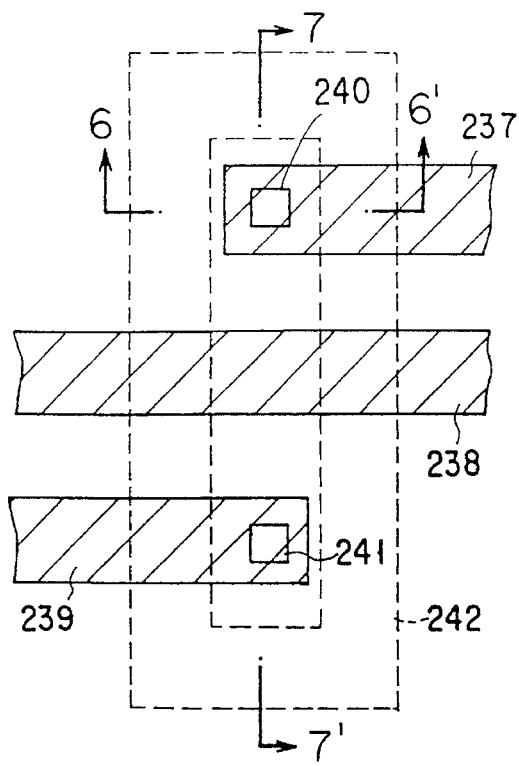
FIG. 53 is a plan view showing a wiring structure according to still another embodiment of the present invention.
Figure 54A:
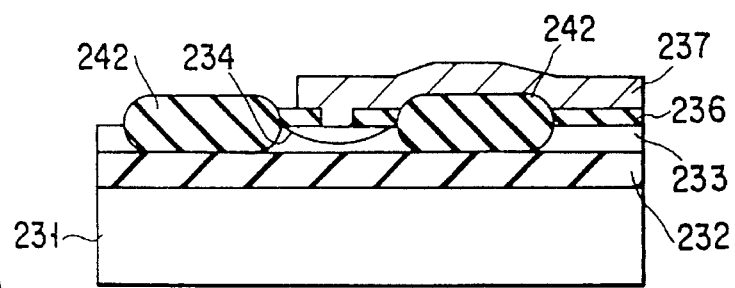
FIGS. 54A and 54B are sectional views taken along the lines F—F' and G—G' of FIG. 53, respectively.
Figure 54B:
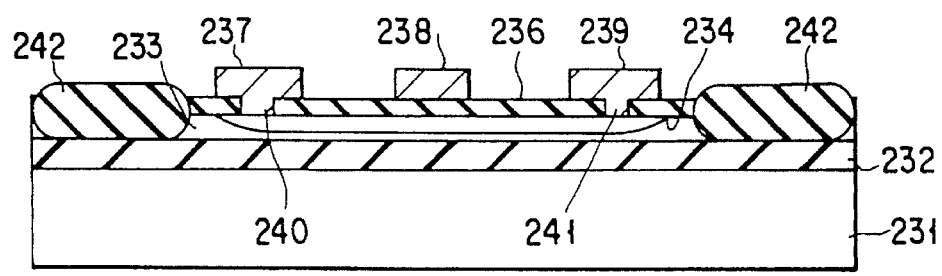

FIG. 53 is a plan view showing a wiring structure according to still another embodiment of the present invention. FIGS. 54A and 54B are sectional views taken along the lines F—F' and G—G' of FIG. 53.

The wiring structure of this embodiment is the same as that in the previous embodiment except that an n$^+$-diffusion layer is dielectrically isolated by an insulating film instead of a trench groove.

More specifically, an n$^+$-diffusion layer 234 is surrounded by a thick silicon oxide film 242 which reaches a silicon oxide film 232 and is formed by LOCOS, thus isolating the n$^+$-diffusion layer 234 from other semiconductor layers.

This wiring structure has the same effect as in the previous embodiment. Since the silicon oxide film 242 can be formed easier than the trench groove 235, the production cost can advantageously decrease. This wiring structure is particularly convenient when the silicon layer 233 is thin.

Figure 55:
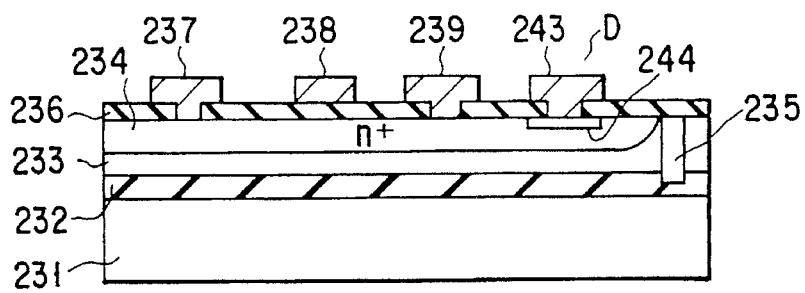
FIG. 55 is a sectional view showing a wiring structure according to still another embodiment of the present invention.

FIG. 55 is a sectional view showing a wiring structure according to still another embodiment of the present invention.

In this wiring structure, a protective diode D is formed in the wiring region. This protective diode D is constituted by an n$^+$-diffusion layer 234 and a p$^+$-diffusion layer 244 selectively formed in the surface of the n$^+$-diffusion layer 234. This p$^+$-diffusion layer 244 is connected to an electrode 243 through a contact hole formed in an oxide film 236. This electrode 243 is connected to ground or a power supply as a reference potential.

Figure 56:
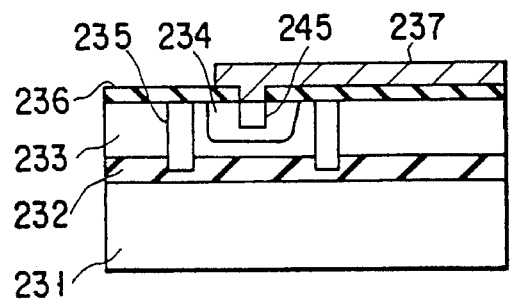
FIG. 56 is a sectional view showing a wiring structure according to still another embodiment of the present invention.

FIG. 56 is a sectional view showing a wiring structure according to still another embodiment of the present invention.

The wiring structure of this embodiment aims at reducing the contact resistance and is the same as that in FIG. 51 except that a trench groove is formed in an $n^+$-diffusion layer 234, the trench groove is filled with a conductive material 245 such as Al, polysilicon, or the like, and a wiring layer 237 is connected to the electrode 243 through this conductive material 245.

Figure 57:
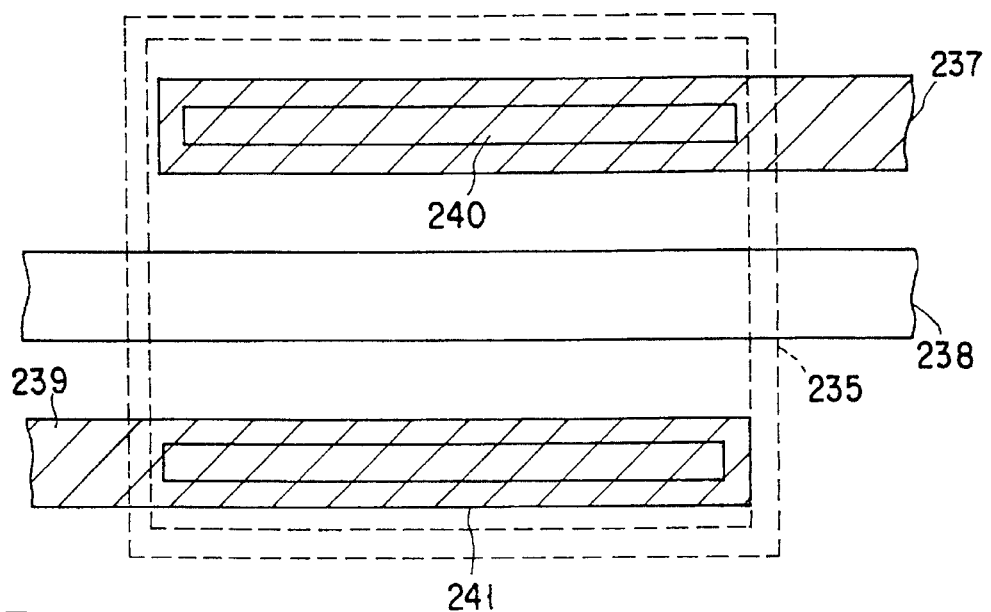
FIG. 57 is a plan view showing a wiring structure according to still another embodiment of the present invention.

FIG. 57 is a plan view showing a wiring structure according to still another embodiment of the present invention.

The wiring structure of this embodiment aims at reducing the contact resistance and is the same as the embodiment in FIG. 51 except that the size of a trench groove 235 increases along the longitudinal direction of wiring layers 237, 238, and 239, thereby increasing the contact area.

Figure 58:
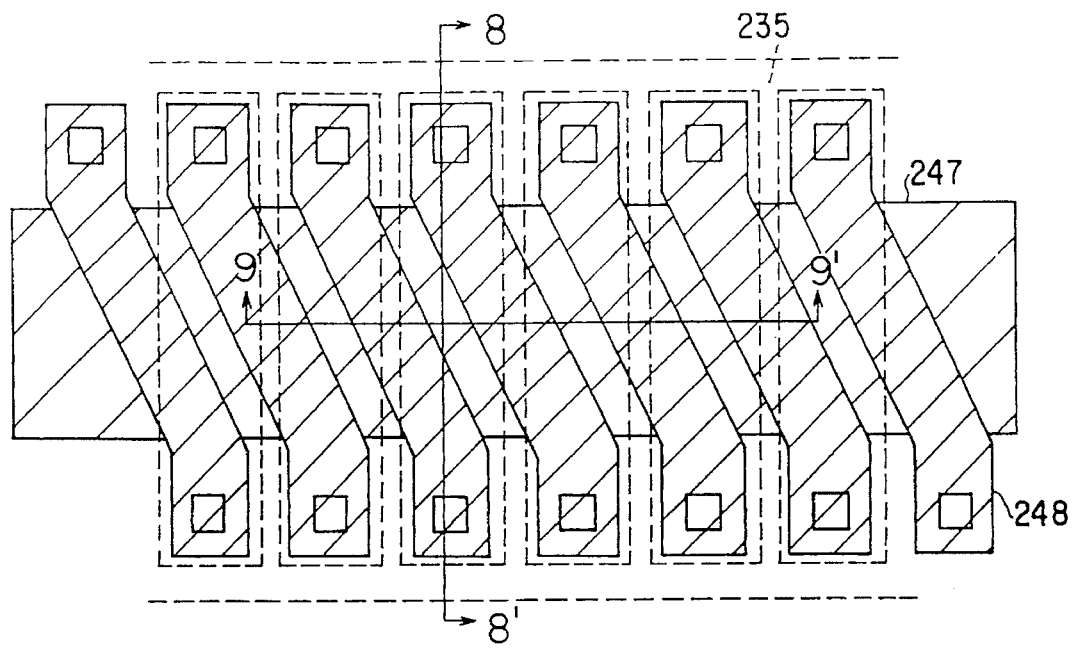
FIG. 58 is a plan view showing an inductor formed in an SOI substrate according to still another embodiment of the present invention.
Figure 59A:
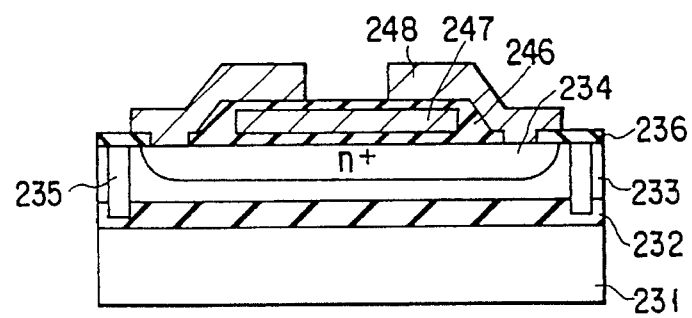
FIGS. 59A and 59B are sectional views taken along the lines H—H' and I—I' of FIG. 58, respectively.
Figure 59B:
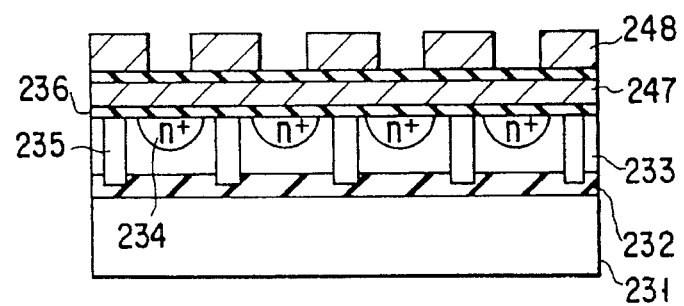

FIG. 58 is a plan view showing the structure of an inductor formed on an SOI substrate according to still another embodiment of the present invention. FIGS. 59A and 59B are sectional views taken along the lines H—H' and I—I' of FIG. 58.

A plurality of $n^+$-diffusion layers 234 isolated from each other by trench grooves 235 are selectively formed in the surface of a silicon layer 233. The plurality of $n^+$-diffusion layers 234 have a ladder-like shape as a whole such that the longitudinal direction corresponds to a lateral ladder-like shape. A high magnetic permeability layer 247 having a higher magnetic permeability than that of the oxide film 236 is formed on the oxide film 236. This high magnetic permeability layer 247 is covered with the oxide film 246. A plurality of wiring layers 248 are formed on this high magnetic permeability layer 247. Two ends of each wiring layer 248 are connected the different $n^+$-diffusion layers 234 adjacent to and isolated from each other.

More specifically, the high magnetic permeability layer 247 has an inductor having a structure in which a helical wiring is substantially formed (i.e., the plurality of wiring layers 248 are substantially helically arranged). As in the previous embodiment, a trench groove filled with a conductive material may be formed in the $n^+$-diffusion layer 234, and each wiring layer 248 may be connected to the $n^+$-diffusion layer 234 through the conductive material embeded in the trench groove.

Figure 60A:
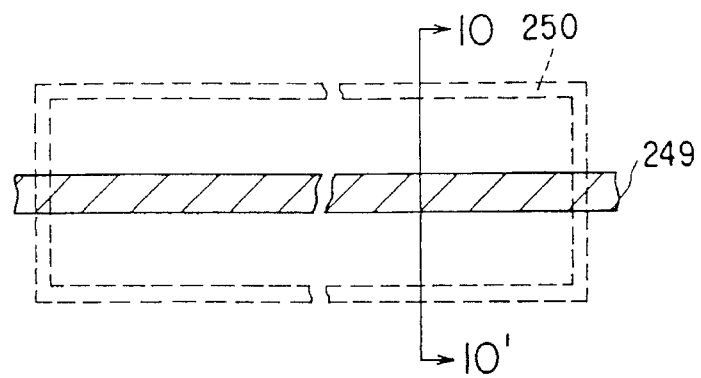
FIG. 60A is a plan view showing a wiring structure according to still another embodiment of the present invention.
Figure 60B:
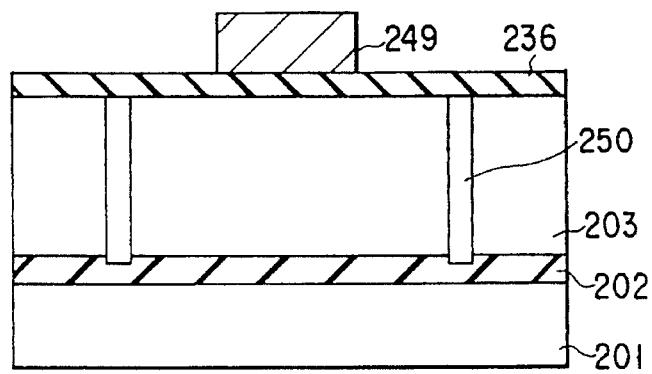
FIG. 60B is a sectional view taken along the line J—J' of FIG. 60A.

FIG. 60A is a plan view showing a wiring structure according to still another embodiment of the present invention, and FIG. 60B is a sectional view taken along the line J—J' of FIG. 60A.

Part of a silicon layer 203 below a wiring layer 249 is electrically isolated from the other part of the silicon layer 203 outside a trench groove 250 by the trench groove 250 and a silicon oxide film 202. For this reason, the interference between the wiring layer 249 in the trench groove 250 and other wiring layers or devices outside the trench groove 250 can be reduced. A silicon oxide film by LOCOS may be used instead of the trench groove.

Figure 61:
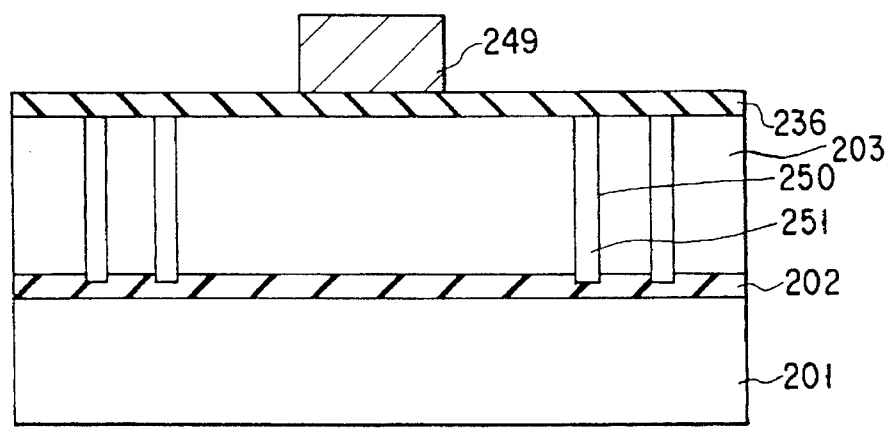
FIG. 61 is a sectional view showing a wiring structure according to still another embodiment of the present invention.

FIG. 61 is a sectional view showing a wiring structure according to still another embodiment of the present invention.

This MOSFET is obtained by partially modifying the MOSFET shown in FIGS. 60A and 60B. Part of the silicon layer 203 below the wiring 249 is dielectrically isolated by two trench grooves 250 and 251.

FIG. 62A is a plan view showing a structure of an inductor formed on an SOI substrate according to still another embodiment of the present invention. FIG. 62B is a sectional view taken along the line K—K' of FIG. 62A. FIG. 63 shows an equivalent circuit of this inductor.

A silicon layer 233 is divided into a plurality of regions potentially independent of each other by trench grooves 235. Spiral wiring layers 252 are formed on the silicon layer 233 through a silicon oxide film 236.

Figure 64A:
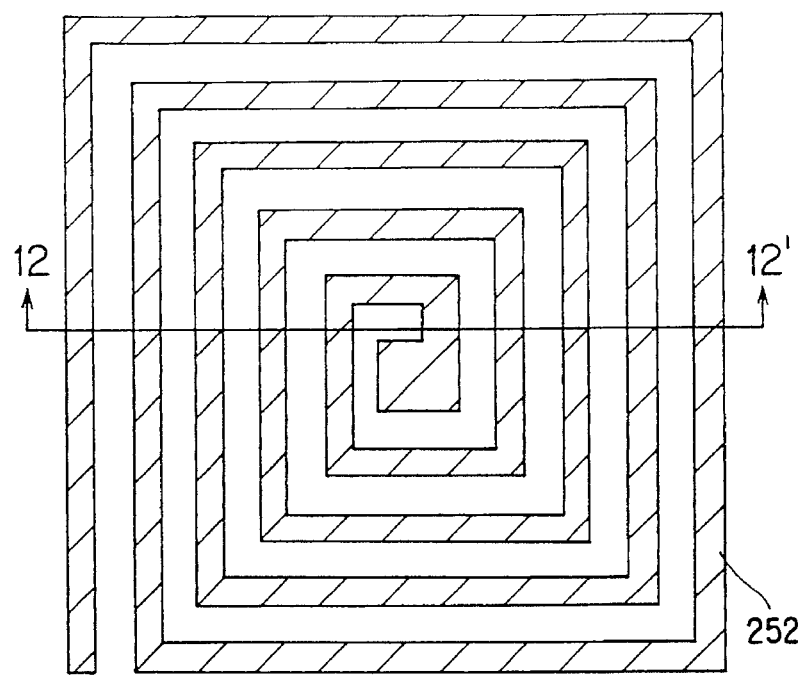
FIG. 64A is a view showing a conventional inductor formed in an SOI substrate.
Figure 64B:
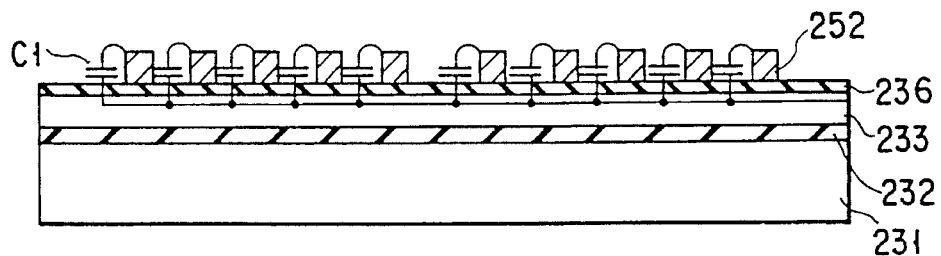
FIG. 64B is a sectional view taken along the line L—L' of FIG. 64A.
Figure 65:
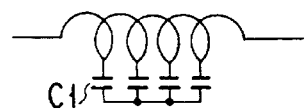
FIG. 65 is an equivalent circuit diagram of the inductor shown in FIG. 64A.

According to the inductor having the above structure, since the silicon layer 233 is divided into a plurality of regions potentially independent of each other, capacitive coupling $C_1$ between wiring layers 252 through the silicon layer 233 decreases, as compared with a conventional inductor shown in FIGS. 64A, 64B and 65.

In this embodiment, although capacitive coupling $C_2$ inside the silicon layer 233 occurs, the capacitive coupling $C_2$ is very small not to increase substantial capacitive coupling.

Figure 66A:
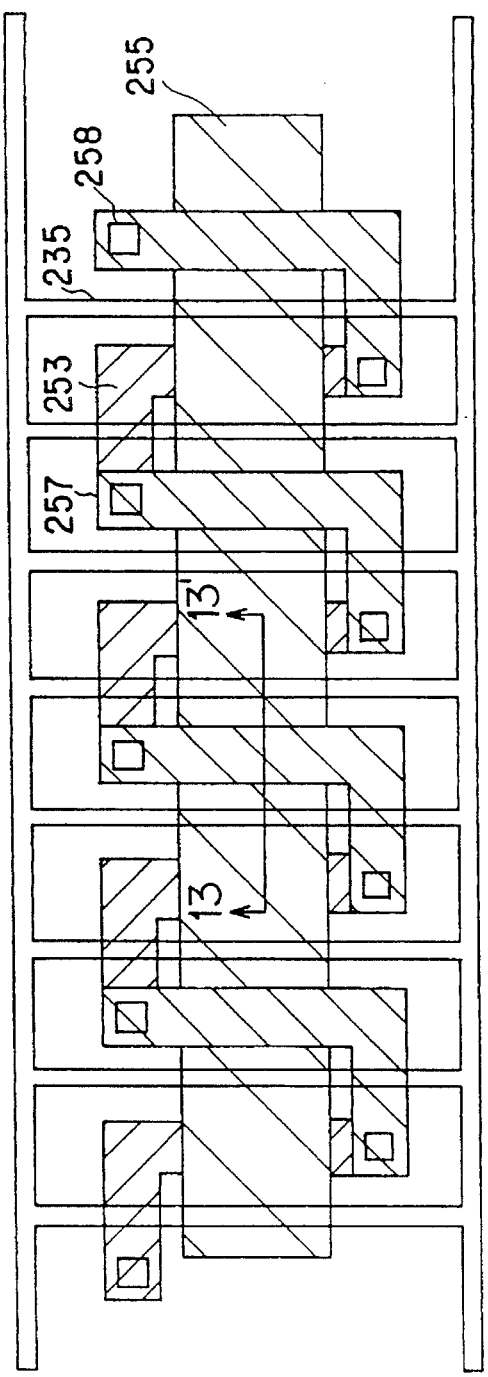
FIG. 66A is a plan view showing an inductor formed in an SOI substrate according to still another embodiment of the present invention.
Figure 66B:
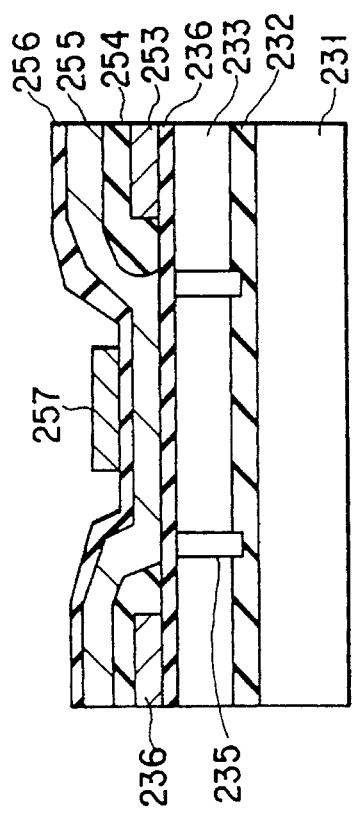
FIG. 66B is a sectional view taken along the line M—M' of FIG. 66A.

FIG. 66A is a plan view showing a structure of an inductor formed on an SOI substrate according to still another embodiment of the present invention. FIG. 66B is a sectional view taken along the line M—M' of FIG. 66A.

A silicon layer 233 is divided into a plurality of regions potentially independent of each other by trench grooves 235. A first L-shaped electrode 253 is formed on the silicon layer 233 through a silicon oxide film 236. Two ends of each first L-shaped electrode 253 are connected to silicon layers 233 in different regions adjacent to and potentially independent of each other.

A high magnetic permeability layer 255 not directly contacting the first L-shaped electrode 253 is formed of an oxide film 254 on the L-shaped electrode 253. A second L-shaped electrode 257 is formed on the high magnetic permeability layer 255 through an oxide film 256. Two ends of each second L-shaped electrode 253 are connected to corresponding ends of the first L-shaped electrodes 253 in different regions adjacent to and potentially independent of each other in the silicon layer 233.

According to the inductor having the above structure, since the silicon layer 233 is divided into a plurality of regions potentially independent of each other, capacitive coupling between the L-shaped electrodes 253 and 257 through the silicon layer 233 decreases.

Figure 67:
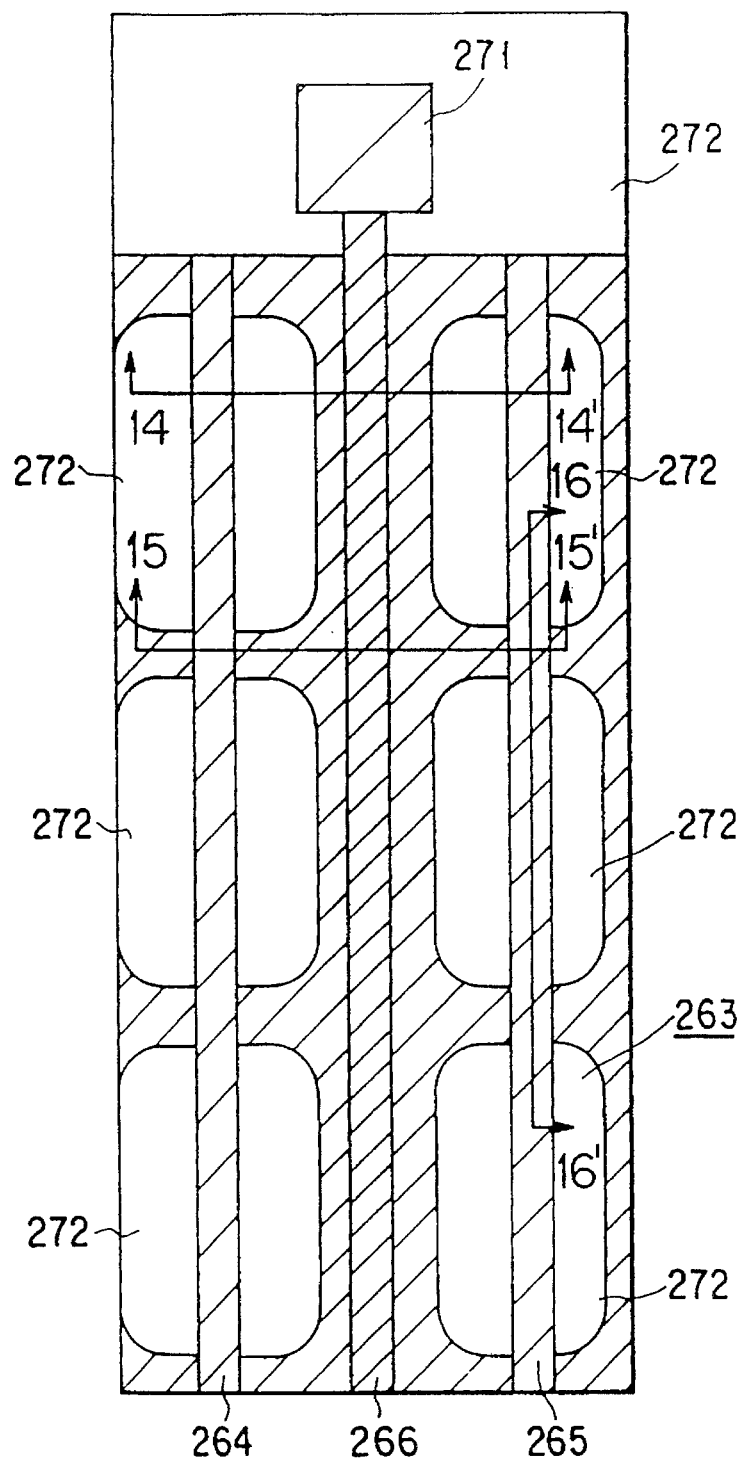
FIG. 67 is a plan view showing a MOSFET according to still another embodiment of the present invention.

FIG. 67 is a plan view showing the structure of a MOSFET according to still another embodiment of the present invention. FIGS. 68A, 68B, and 68C are sectional views taken along the lines N—N', O—O', and P—P' of FIG. 67.

Referring to FIGS. 68A, 68B, and 68C, reference numeral 261 denotes a silicon support substrate. A silicon oxide film 262 and a silicon layer 263 are subsequently formed on this silicon support member 261. The silicon oxide film 262 and the silicon layer 263 constitute an SOI structure.

A thick silicon oxide film 272 reaching the silicon oxide film 262 is selectively formed as island regions on the silicon layer 263 by LOCOS, and number of regions of the silicon layer 263 is small as compared with a normal MOSFET.

More specifically, most regions of the silicon layer 263 not serving as active regions (device operation regions) of the MOSFETs are converted into the thick silicon oxide film 272.

A p-diffusion layer 267, an n-source diffusion layer 268, and an n-drain diffusion layer 269, serving as a channel region, are formed in the residual silicon layer 263, as in a normal MOSFET.

A gate electrode 266 is formed on the p-diffusion layer 267 between the n-source diffusion layer 268 and the drain diffusion 263 through a gate insulating film 270. In addition, a source electrode 264 and a drain electrode 265 are formed on the n-source diffusion layer 268 and the n-drain diffusion layer 269, respectively, and an extraction electrode 271 of the gate electrode 266 is formed on the thick silicon oxide film 272.

The device operation region and the electrodes partially contact with each other like a contact between, e.g., the drain electrode 265 and the residual silicon layer 263 as shown in FIG. 68C.

In the MOSFET having the structure described above, the silicon layer 263 which does not directly contribute to the device operation is replaced with the thick silicon oxide film 272, and the parasitic capacitances between the electrodes and between the electrode and the substrate can be reduced. Therefore, a MOSFET having a higher speed than the conventional MOSFET can be obtained.

FIGS. 69A and 96B are sectional view showing the structure of a bipolar transistor, and correspond to the sectional views of FIGS. 68A and 68B.

A silicon layer 263 which constitutes an SOI structure not directly contributing to the device operation is replaced with a thick silicon oxide film 272 by LOCOS, and an $n^+$-collector diffusion layer 276, an n-offset diffusion layer 275, a p-base diffusion layer 274, and an n-emitter diffusion layer 273 are formed in the residual silicon layer 263.

An oxide film 277 is formed on the region extending from the $n^+$-collector diffusion layer 276 to the n-offset diffusion layer 275, and a base electrode 279 consisting of polysilicon is formed to cover this oxide film 277. The base electrode 279 has an upper silicide portion. Side-wall insulating films 278 are formed on the side portions of the base electrode 279 and the oxide film 277. An emitter electrode 280 and a collector electrode 281 are formed to cross island-like thick silicon oxide films 272.

In the bipolar transistor having the above structure, since number of the silicon layers 263 which cause a parasitic capacitance decreases, an operation speed also becomes higher than a conventional bipolar transistor.

FIG. 70A is a plan view showing a MOSFET according to still another embodiment of the present invention, and FIG. 70B is a sectional view taken along the line Q—Q' of FIG. 70A.

The MOSFET of this embodiment is the same as that of the embodiment shown in FIG. 67 except that not island-like thick silicon oxide films 272, but thick silicon oxide films 272 which surround the silicon layer 263 of the active region are formed by LOCOS.

A source electrode 264 is connected to an n-source diffusion layer 268 through an arm-like electrode 283. Similarly, a drain electrode 265 is connected to an n-drain diffusion layer 269 through an arm-like electrode 282.

The MOSFET having the above structure aims at reducing the parasitic capacitance. Furthermore, since the entire source and drain electrodes 264 and 265 are formed on the thick silicon oxide film 272, and do not contact the silicon layer, the parasitic capacitance of this MOSFET becomes smaller than that of FIG. 67.

Figure 71A:
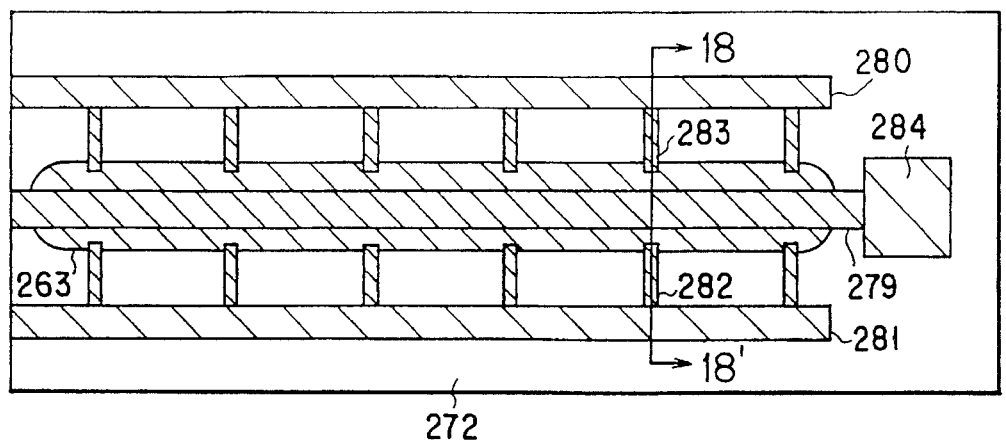
FIG. 71A is a plan view showing a bipolar transistor according to still another embodiment of the present invention.
Figure 71B:
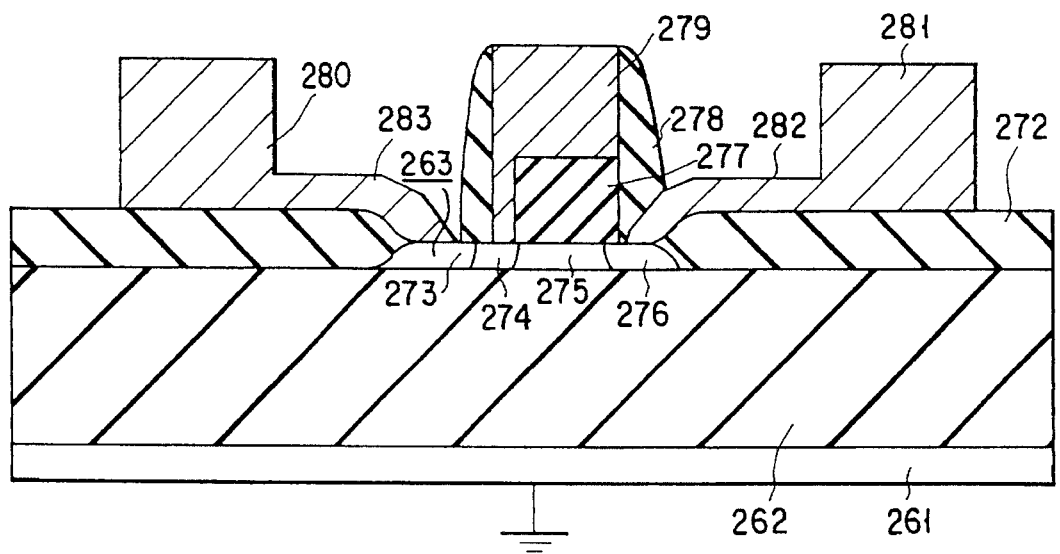
FIG. 71B is a sectional view taken along the line R—R' of FIG. 71A.

FIG. 71A is a plan view showing the structure of a bipolar transistor according to the present invention, and FIG. 71B is a sectional view taken along the line R—R' of FIG. 71A.

In the bipolar transistor of this embodiment, a thick silicon oxide film 272 which surrounds a silicon layer 263 serving as a device operation region is formed by LOCOS, similar to the MOSFET shown in FIGS. 70A and 70B. An emitter electrode 280 is connected to an n-emitter diffusion layer 273 through an arm-like electrode 283, and a collector electrode 281 is connected to an $n^+$-collector diffusion layer 276 through an arm-like electrode 282. Referring to FIG. 71A, reference numeral 284 denotes an extraction electrode of a base electrode 279.

In the bipolar transistor having the above structure, due to the same reason as in the MOSFET shown in FIGS. 70A and 70B, a parasitic capacitance becomes smaller than that of the bipolar transistor shown in FIGS. 69A and 69B.

Figure 72A:
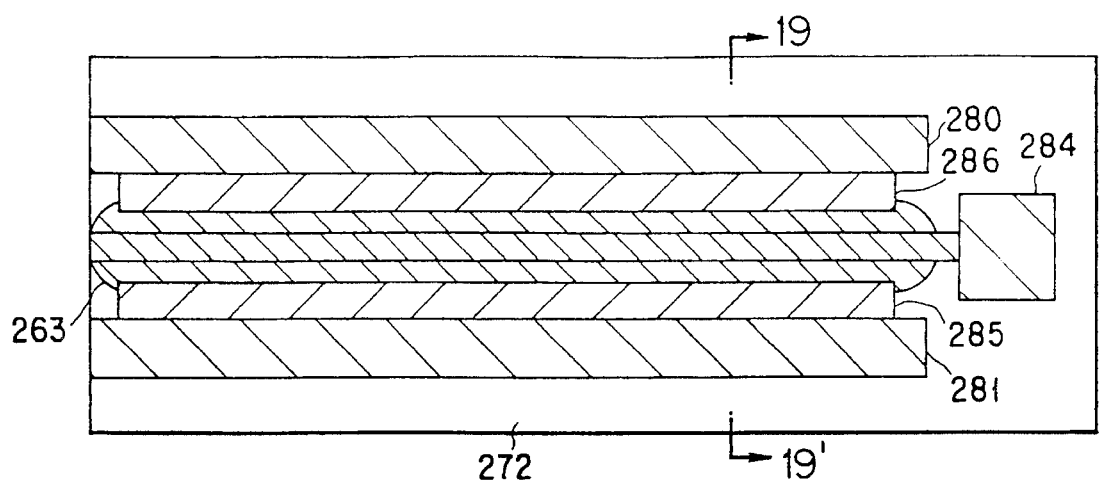
FIG. 72A is a plan view showing a bipolar transistor according to still another embodiment of the present invention.
Figure 72B:
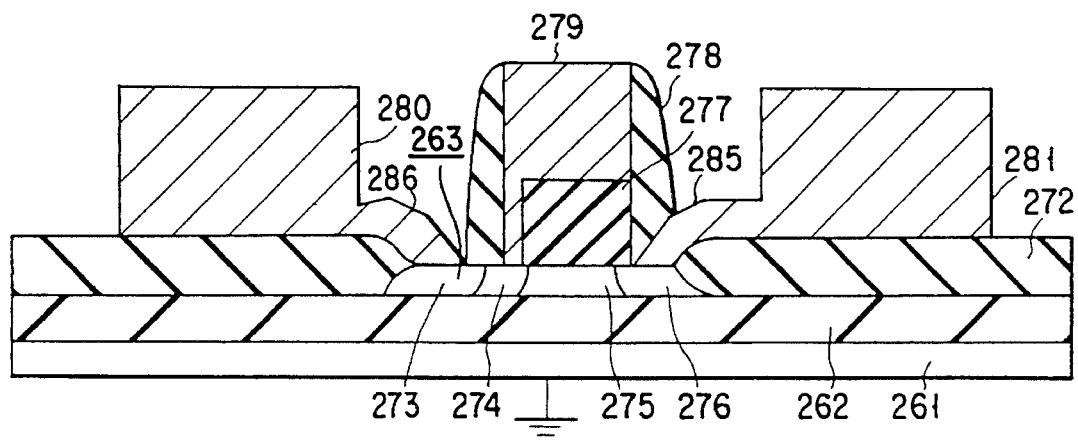
FIG. 72B is a sectional view taken along the line S—S' of FIG. 72A.

FIG. 72A is a plan view showing a bipolar transistor according to the present invention, and FIG. 72B is a sectional view taken along the line S—S' of FIG. 72A.

This bipolar transistor can be obtained by partially modifying that shown in FIGS. 71A and 71B. A silicon oxide film 262 of an SOI substrate is formed of a thin film e.g., SIMOX. An emitter electrode 280 is connected to an n-emitter diffusion layer 273 through a band-like electrode 286 instead of an arm-like electrode 283, and a collector electrode 281 is connected to an $n^+$-collector diffusion layer 276 through a band-like electrode 285.

In the bipolar transistor having the above structure, a parasitic capacitance becomes smaller than that of a conventional bipolar transistor using, e.g., SIMOX.

Figure 73:
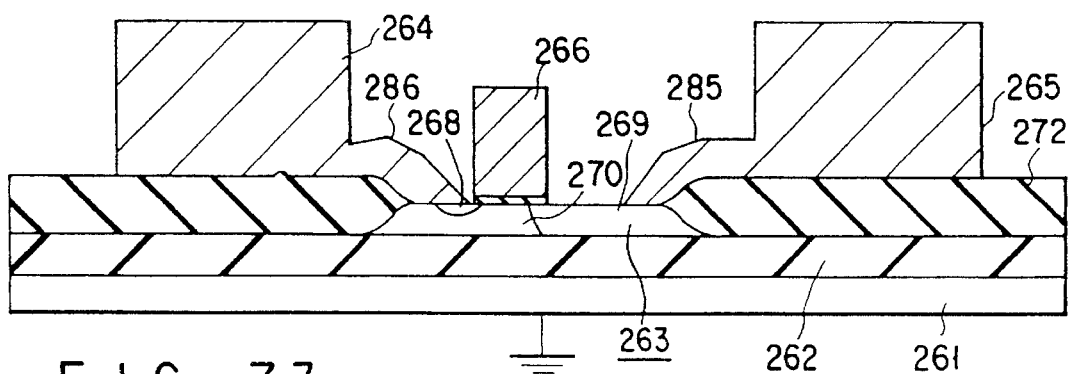
FIG. 73 is a plan view showing a MOSFET according to still another embodiment of the present invention.

FIG. 73 is a sectional view showing a MOSFET according to still another embodiment of the present invention.

This MOSFET can be obtained by partially modifying that shown in FIGS. 70A and 70B. A silicon oxide film 262 of an SOI substrate is formed of a thin film, e.g., SIMOX. A source electrode 264 is connected to an n-source diffusion layer 268 through a band-like electrode 286, and a drain electrode 265 is connected to an n-drain diffusion layer 269 through a band-like electrode 285.

In the MOSFET having the above structure, since the area of the silicon layer which causes a parasitic capacitance becomes smaller than that of the conventional MOSFET using, e.g., SIMOX, the operation speed increases.

FIGS. 74A to 74E are sectional views showing a method of forming an SOI substrate according to still another embodiment of the present invention.

Figure 74A:
FIGS. 74A to 74E are sectional views showing steps of forming an SOI substrate in order according to still another embodiment of the present invention.
Figure 74B:
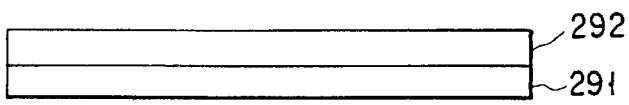

As shown in FIG. 74A, a silicon support substrate 291 consists of a silicon wafer having a p-conductivity type, an orientation of (100) plane, and a mirror-finished upper surface. The silicon support substrate 291 is anodized to form a porous silicon layer 292 on the surface of the silicon support substrate 291, as shown in FIG. 74B.

More specifically, an electrode is formed on the lower surface of the silicon support substrate 291 and connected to a lead wire. After the electrode is protected with an antioxidation tape or wax, the silicon support substrate 291 is anodized in a solution mixture of hydrofluoric acid and ethanol.

For example, when anodization is performed at a current density of 20 mA/cm$^2$, a porous silicon layer 292 having a thickness of about 10 μm can be obtained. The thickness of this porous silicon layer 292 can change with a change in anodization condition, thereby performing adjustment in a wide range. For example, the thickness of the porous silicon layer 292 may exceed 100 μm.

Figure 75:
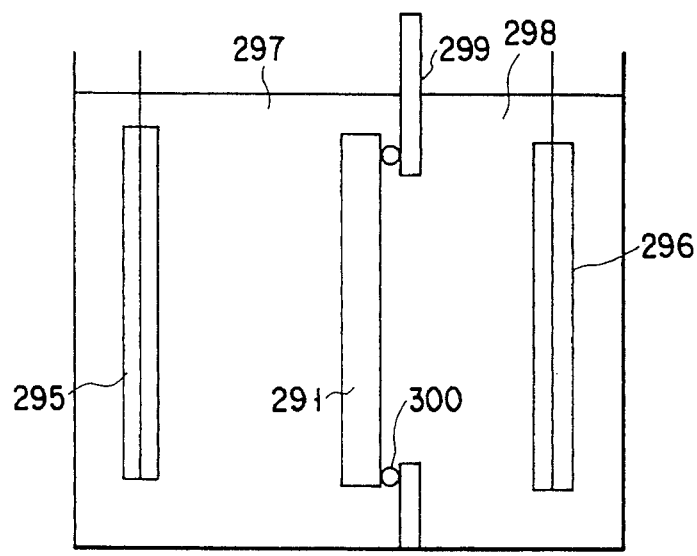
FIG. 75 is a view for explaining a method of forming a porous silicon layer by a liquid back contact scheme.

Anodization may be performed by a liquid back contact scheme in place of the above scheme using the electrode. More specifically, as shown in FIG. 75, the front and rear surfaces of the silicon support substrate 291 are isolated from each other through a partitioning plate 299 and an O-ring 300, and a back contact electrolyte 298 is contained in a space between the rear surface of the silicon support substrate 291 and an anode electrode (back contact electrode) 296. A solution mixture of hydrofluoric acid and ethanol is contained in a space between the front surface of the silicon support substrate 291 and a cathode electrode 295. In this state, when anodization is performed, the above electrode can be omitted.

Figure 74C:
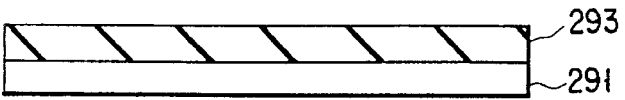

As shown in FIG. 74C, thermal oxidation is then performed in, e.g., a dry or wet oxygen atmosphere at 1,100° C. to convert the porous silicon layer 292 into an insulating film 293. This oxidation process continues until the porous silicon layer 292 has a sufficiently high resistance. The porous silicon layer 292 need not be converted into a perfect insulating film.

In this case, the surface of the insulating film 293 may not have satisfactory flatness and may be polished as needed.

Figure 74D:
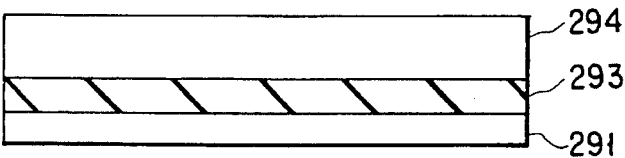

As shown in FIG. 74D, an element formation silicon substrate 294 is bonded to the insulating film 293. To minimize the contamination at the bonded interface, an oxide film is preferably formed on the bonding surface of the silicon substrate 294.

Figure 74E:
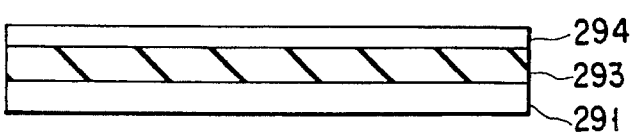

Finally, as shown in FIG. 74E, the surface of the silicon substrate 294 is polished to obtain an SOI substrate having an element formation silicon layer having a desired thickness.

According to the above formation method, the large thickness of the insulating film 293 is determined by the porous silicon film 292 which can be easily formed. The insulating film 293 having a thickness of 100 μm or more can be obtained.

On the other hand, according to the conventional method, an insulating film is formed by thermal oxidation of silicon. In this case, the thickness of the insulating film is a maximum of 3 μm.

For this reason, according to this embodiment, the insulating film 293 having a thickness larger than that by the conventional method, thereby reducing the parasitic capacitance between the silicon substrate 294 and the silicon support member 291. Therefore, the SOI substrate of this embodiment is used for a transistor which requires a high-speed operation like the high-frequency MOSFET described in the previous embodiments to realize a higher speed operation.

In addition, when the SOI substrate of this embodiment is used for a device, so-called a power device, having a high voltage and a large current, a power device having a high insulating breakdown voltage can be obtained.

Figure 76:
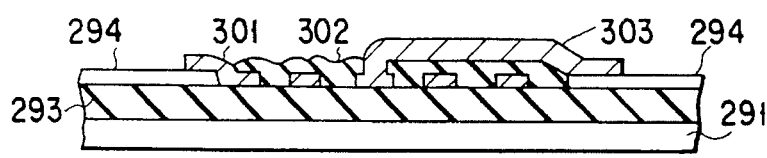
FIG. 76 is a sectional view showing a coil structure formed in an SOI substrate according to still another embodiment of the present invention.

FIG. 76 is a sectional view showing a coil structure according to still another embodiment of the present invention.

A coil is formed on a micro-signal process circuit chip using the SOI substrate obtained by the above method.

This structure will be described in accordance with formation steps. First, a device (not shown), e.g., a transistor is formed on a device formation silicon substrate 294, and a predetermined portion of a coil formation region on the silicon substrate 294 is etched to expose an insulating film 293.

After a metal film is deposited on the coil formation region, this metal film is patterned to form a spiral-like coil 301.

Then, after an insulating film 302 is formed, a contact hole is formed at a portion of the insulating film 302 corresponding to the other end of the coil 301.

Finally, an extraction electrode 303 which contacts the coil through this contact hole is formed.

FIGS. 77A to 77F are sectional views showing a method of forming an SOI substrate according to still another embodiment of the present invention.

Figure 77A:
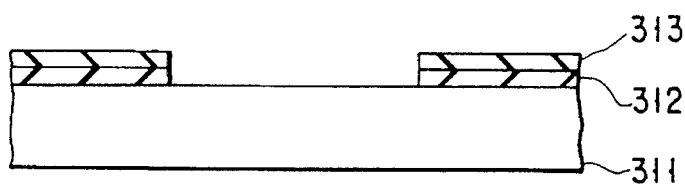
FIGS. 77A to 77F are sectional views showing steps of forming an SOI substrate in order according to still another embodiment of the present invention.

As shown in FIG. 77A, a silicon oxide film 312 and a silicon nitride film 313 are subsequently formed on a silicon support member 311, and these insulating films are patterned to expose a desired region of the silicon support substrate 311.

Figure 77B:
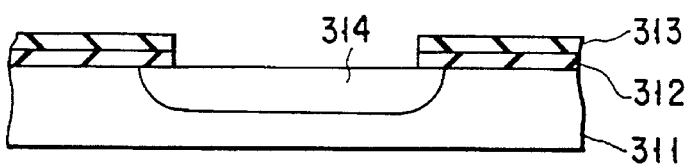

As shown in FIG. 77B, anodization is performed using the silicon oxide film 312 and the silicon nitride film 313 as masks to selectively form a porous silicon layer 314 only in the exposed portion of the silicon support member 311.

Figure 77C:
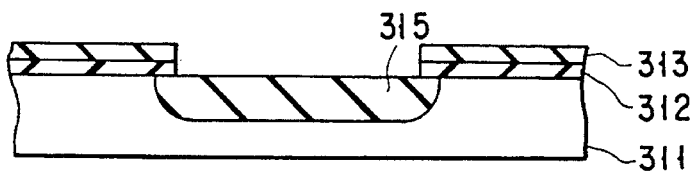

Then, as shown in FIG. 77C, the porous silicon layer 314 is converted into an insulating film 315 by thermal oxidation. As a result, the insulating film 315 can be formed only in a desired region.

Figure 77D:
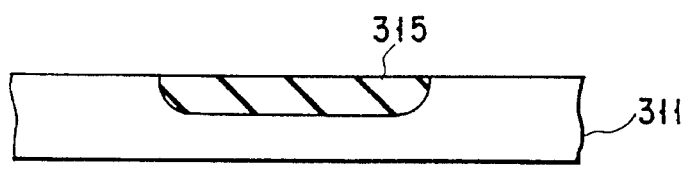
Figure 77E:
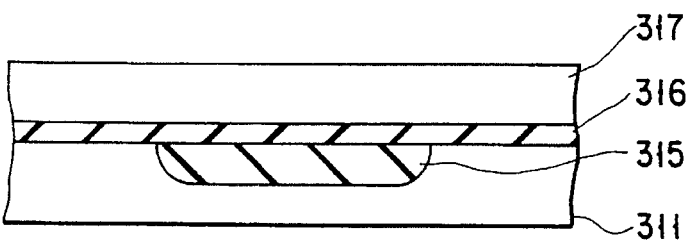

The silicon oxide film 312 and the silicon nitride film 313 are removed as shown in FIG. 77D. Thereafter, an element formation silicon substrate 317 is bonded to the insulating film 315, as shown in FIG. 77E.

Figure 77F:
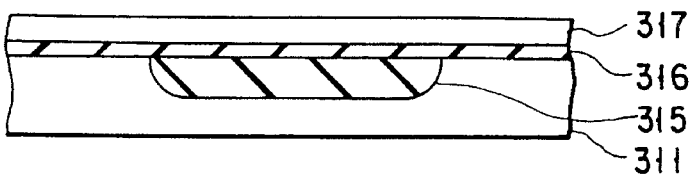

Finally, as shown in FIG. 77F, the surface of the silicon substrate 317 is polished to obtain an SOI substrate having an element formation silicon layer having a desired thickness.

According to the above formation method, the capacitance and insulating breakdown voltage between the silicon support member 311 and the silicon substrate 317 can be changed, so that an integrated device having a high degree of freedom can be designed.

FIG. 78 is a sectional view showing the main part of a semiconductor integrated circuit using an SOI substrate according to an embodiment of the present invention.

Referring to FIG. 78, reference numeral 321 denotes a silicon support substrate, and a silicon oxide film 322 is formed on the silicon support substrate 321.

Referring to FIG. 78, a silicon layer 324 is formed on the silicon oxide film 322 in a left-side region 327. Active elements, e.g., a transistor (MOSFET) Tr1, and transistors (bipolar transistors) Tr2 and Tr3 are formed in this silicon layer 324. These transistors Tr1, Tr2, and Tr3 are dielectrically isolated from each other by trench grooves 325.

On the other hand, a porous silicon layer 323 is formed in the silicon oxide film 322 on a right-side region 326. Passive elements, e.g., a wiring and a planar inductor are formed on this porous silicon layer 323.

According to the semiconductor integrated circuit having the above structure, since the porous silicon layer 323 is used for an insulating film on the silicon oxide film 322 in the region 326 on which a wiring, a planar inductor, and the like, which cause a parasitic capacitance, are formed, the capacitance between the substrate and the wiring, and the parasitic capacitance between the substrate and the inductor can be greatly reduced.

FIG. 79 is a sectional view showing the main part of a semiconductor integrated circuit using an SOI substrate according to still another embodiment of the present invention.

This semiconductor integrated circuit can be obtained by partially modifying that shown in FIG. 78. The layer 323 and silicon oxide film 322 on a region 326 are removed, an exposed silicon support member 321 is converted into a porous silicon layer 323a, and a wiring, a planar inductor, and the like are formed on this porous silicon layer 323a. In the case of this embodiment, the thicker porous silicon layer 323a can be obtained, thereby further reducing a parasitic capacitance.

FIG. 80 is a sectional view showing the main part of a semiconductor integrated circuit using an SOI substrate according to still another embodiment of the present invention.

In this embodiment, a silicon oxide film 322 is not formed in a region 326, but a porous silicon layer 323b is formed from the surface of a silicon layer. In the case of this embodiment, the step portion between the region 326 and a region 327 can be eliminated, which exists in the semiconductor integrated circuit shown in FIG. 79, and this circuit does not have the silicon oxide film 322 to thicken the porous silicon layer 323b, thereby greatly reducing a parasitic capacitance.

FIG. 81 is a sectional view showing the main part of a semiconductor integrated circuit using an SOI substrate according to still another embodiment of the present invention.

This semiconductor integrated circuit can be obtained by partially modifying that shown in FIG. 80. A transistor (bipolar transistor) Tr4 as an active element is formed on a region 326, similar to a region 327, in addition to a passive element, e.g., a planar inductor.

If a high-speed transistor among the transistors on the region 327 is formed on the region 326, the performance of the semiconductor integrated circuit can be greatly improved because a parasitic capacitance is small in the porous silicon layer 323b.

Figure 94:
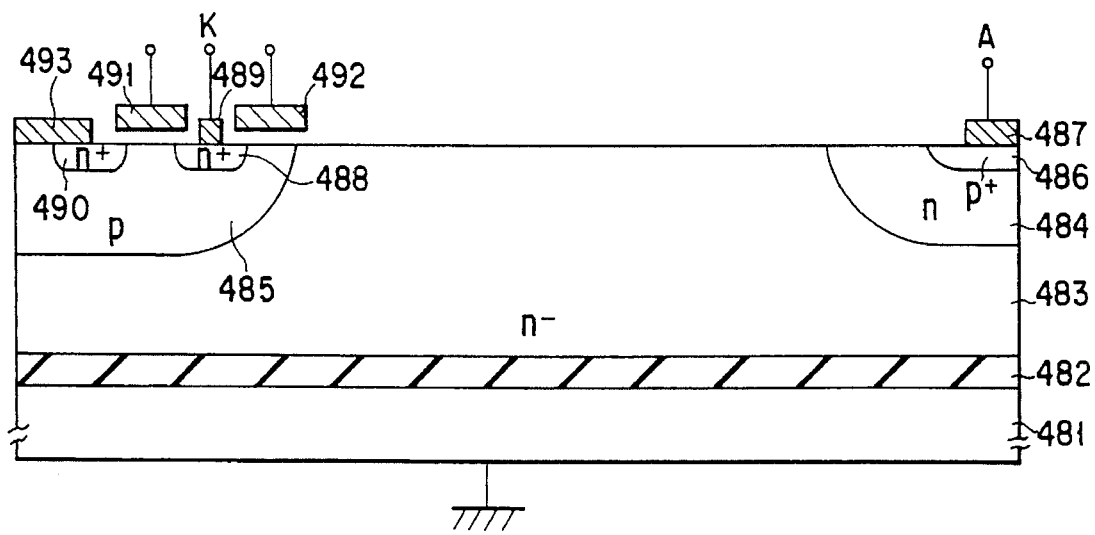
FIG. 94 is a sectional view showing a conventional lateral MCT.

FIG. 94 is a sectional view showing a conventional lateral MCT (MOS Controlled Thyristor). Referring to FIG. 94, reference numeral 481 denotes a support substrate. An insulating film 482 is formed on this support substrate 481. An $n^-$-base layer 483 is formed on this insulating film 482, and an n-buffer layer 484 and a p-base layer 485 are selectively formed in the surface of this $n^-$-base layer 483.

A $p^+$-emitter layer 486 is selectively formed in the surface of the n-buffer layer 484, and an anode electrode 487 is formed on this $p^+$-emitter layer 486. On the other hand, an $n^+$-emitter layer 488 is selectively formed in the surface of the p-base layer 485, and a cathode electrode 489 is formed on this $n^+$-emitter layer 488. The $n^+$-emitter layer 488, the p-base layer 485, the $n^-$-base layer 483, and the $p^+$-emitter layer 486 constitute a pnpn thyristor structure.

An $n^+$-well layer 490 is selectively formed in the surface of the p-base layer 485. An OFF gate electrode 491 is formed on the p-base layer 485 of the region between the $n^+$-well layer 490 and the $n^+$-emitter layer 488 through a gate insulating film (not shown). In addition, an ON gate electrode 492 is formed on the p-base layer 485 of the region between the $n^+$-emitter layer 488 and the $n^-$-base layer 483 through a gate insulating film (not shown). Referring to FIG. 94, reference numeral 493 denotes a floating electrode.

To turn on a lateral MCT having the above structure, a positive voltage is applied to the ON gate electrode 492 while a positive voltage is applied to the anode electrode 487 and a negative voltage is applied to the cathode electrode 489. As a result, a channel is formed in the surface of the p-base layer 485 below the ON gate electrode 489. Electrons flow from the $n^+$-emitter layer 488 to the $n^-$-base layer 483 through the channel. On the other hand, positive holes flow from the $p^+$-emitter layer 486 to the p-base layer 485 through the n-buffer layer 484 and the $n^-$-base layer 483.

The electrons and holes flow in the thyristor as described above. The collector currents of a transistor constituted by the $p^+$-emitter layer 486, the $n^-$-base layer 483, and the p-base layer 485 and a transistor constituted by the $n^-$-base layer 483, the p-base layer 485, and the $n^+$-emitter layer 488 are amplified to each other to turn on the thyristor.

On the other hand, to turn off the thyristor, a negative voltage is applied to the ON gate electrode 492, and the channel below the ON gate electrode 492 disappears. A positive voltage is applied to the OFF gate electrode 491, and a channel is formed below this OFF gate electrode 491 to short-circuit the p-base layer 485 and the cathode electrode 489. As a result, since electron supply to the $n^-$-base layer 483 is stopped, the thyristor is turned off.

The lateral MCT, however, has the following problem. The hole current flows in the cathode electrode 489 through the p-base layer 485, the floating electrode 493, the channel below the OFF gate electrode 491, and the $n^+$-emitter layer 488. For this reason, a voltage drop occurs in the p-base layer 485 due to the resistance of the p-base layer 485 and the resistance of the channel, and the p-base layer 485 is positively biased with respect to the cathode electrode 489. For this reason, when a positive bias exceeds a predetermined level, electrons are injected from the cathode electrode 489 to the $n^-$-base layer 483 to turn on the thyristor again.

Figure 83A:
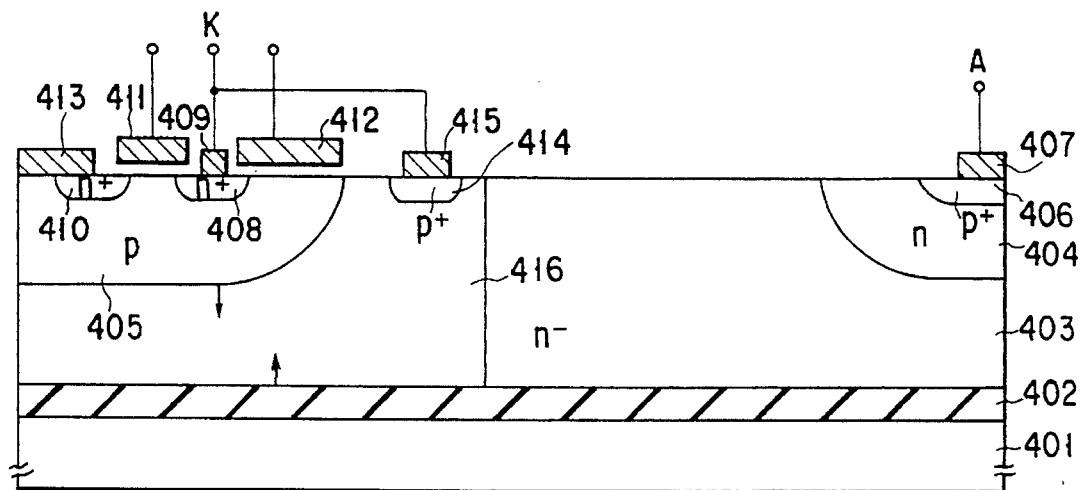
FIG. 83A is a sectional view showing a lateral MCT according to still another embodiment of the present invention.

FIG. 83A is a sectional showing a lateral MCT according to still another embodiment of the present invention. Referring to FIG. 83A, reference numeral 401 denotes a support substrate. An insulating film 402 is formed on this support substrate 401. An $n^-$-base layer 403 is formed on this insulating film 402. An n-buffer layer 404 and a p-base layer 405 are selectively formed in the surface of this $n^-$-base layer 403. In addition, a $p^+$-well layer 414 is selectively formed in the surface of the $n^-$-base layer 403 of the region between the n-buffer layer 404 and the p-base layer 405.

A $p^+$-emitter layer 406 is selectively formed in the surface of the n-buffer layer 404, and an anode electrode 407 is formed on the $p^+$-emitter layer 406. An $n^+$-emitter layer 408 is selectively formed in the surface of the p-base layer 405, and a cathode electrode 409 is formed on the $n^+$-emitter layer 408. This cathode electrode 409 is connected to a hole discharge electrode 415 formed on the $p^+$-well layer 414. The $n^+$-emitter layer 408, the p-base layer 405, the $n^-$-base layer 403, and the $p^+$-emitter layer 406 constitute a pnpn thyristor structure.

An $n^+$-well layer 410 is selectively formed in the surface of the p-base layer 405. An OFF gate electrode 411 is formed on the p-base layer 405 of the region between the $n^+$-well layer 410 and the $n^+$-emitter layer 408 through a gate insulating film (not shown). In addition, an ON gate electrode 412 is formed on the p-base layer 405 in the region between the $n^+$-emitter layer 408 and the $n^-$-base layer 403 through the gate insulating film (not shown). Referring to FIG. 83A, reference numeral 413 denotes a floating electrode.

To turn on the lateral MCT having the above structure, while a positive voltage is applied to the anode electrode 407, a positive voltage is applied to the ON gate electrode 412. As a result, a channel is formed in the surface of the p-base layer 405 below the ON gate electrode 412, thus causing electrons to flow from the $n^+$-emitter layer 408 to the $n^-$-base layer 403 through the above channel and positive holes to flow from the $p^+$-emitter layer 406 to the p-base layer 405 through the n-buffer layer 404 and the $n^-$-base layer 403.

The electrons and positive holes flow in the thyristor as described above. The collector currents of a transistor constituted by the $p^+$-emitter layer 406, the $n^-$-base layer 403, and the p-base layer 405 and a transistor constituted by the $n^-$-base layer 403, the p-base layer 405, and the $n^+$-emitter layer 408 are amplified to each other to turn on the thyristor.

On the other hand, to turn off the thyristor, a negative voltage is applied to the ON gate electrode 412, and the channel below the ON gate electrode 412 disappears. A positive voltage is applied to the OFF gate electrode 411, and a channel is formed below this OFF gate electrode 411 to short-circuit the p-base layer 405 and the $n^+$-emitter layer 408. As a result, since electron supply to the $n^-$-base layer 403 is stopped, the thyristor is turned off.

Since the p-base layer 405 and the $n^+$-emitter layer 408 are short-circuited at this time, a depletion layer extends from the p-base layer 405 to the n⁻-base layer 403. In addition, a depletion layer also extends from the lower portion of the n⁻-base layer 403 to the p-base layer 405. An anode voltage increases as the turn-off operation progresses. As a result, a depletion layer 416 is formed in the n⁻-base layer 403 at the p-base layer 405.

As a result, the discharge path toward the cathode electrode 409 through a p⁺-well layer 414 and the hole discharge electrode 415 has a lower resistance than that toward the cathode electrode 409 through the p-base layer 405, the floating electrode 413, the n⁺-well layer 410, the channel below the OFF gate electrode 411, and the n⁺-emitter electrode 408. For this reason, when the depletion layer 416 as described above is formed, the holes stored in the n⁻-base layer 403 are discharged from the cathode electrode 409 through the p⁺-well layer 414 and the hole discharge electrode 415. That is, the holes in the n⁻-base layer 403 are discharged outside the device without going through the p-base layer 405.

Therefore, since a voltage drop in the p-base layer 405 by a hole current does not occur, the p-base layer 405 is not positively biased with respect to the cathode electrode 409, and electrons are not injected from the cathode electrode 409 to the n⁻-base layer 403 again.

According to the lateral MCT of this embodiment, electron supply to the n⁻-base layer 403 is certainly stopped upon turn-off operation, thereby improving turn-off performance.

Figure 83B:
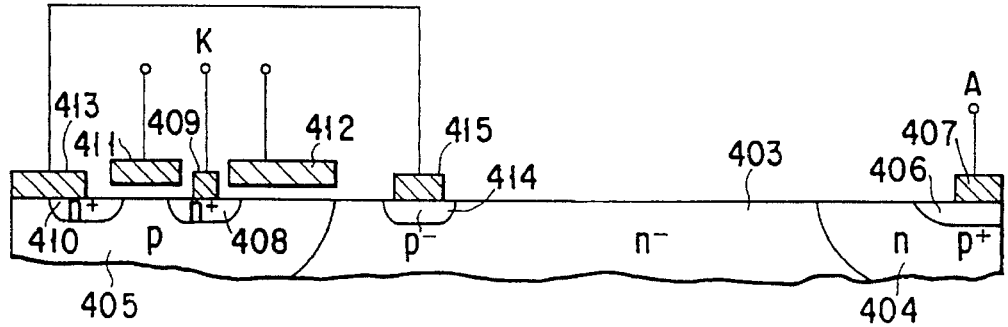
FIG. 83B is a sectional view showing part of a modification of the embodiment shown in FIG. 83A.

FIG. 83B is a sectional view showing part of a modification of the embodiment shown in FIG. 83A. The structure in this modification is the same as that shown in FIG. 83A except that the hole discharge electrode 415 is directly connected not to the cathode electrode 409, but to the floating electrode 413. The same reference numerals denote the same parts as in FIG. 83A, and a detailed description thereof will be omitted.

According to FIG. 83B, as in FIG. 83A, a negative voltage is applied to the ON gate electrode 412 and a positive voltage is applied to the OFF gate electrode 411 upon turn-off operation. As a result, since electron supply to the n⁻-base layer 403 is stopped, the thyristor is turned off. During turn-off operation, holes extracted from the p⁺-well layer 414 to the hole discharge electrode 415 flow in the cathode electrode 409 through the electrode 413, the well layer 410, the channel below the gate electrode 411, and the emitter layer 408, and are discharged outside the device.

The hole discharge electrode 415 is kept floating until a positive voltage is applied to the OFF gate electrode 411 and a channel is formed below the OFF gate electrode 411. That is, according to this modification, since the hole discharge electrode 415 does not influence the device during the ON operation of the device, a predetermined ON operation can be certainly obtained.

Lateral high-breakdown-voltage semiconductor devices according the still other embodiments of the present invention will be described below with reference to FIGS. 84A to 93. In these embodiments, the same reference numerals denote the same parts as in FIG. 83A, and a detailed description thereof will be omitted.

Figure 84A:
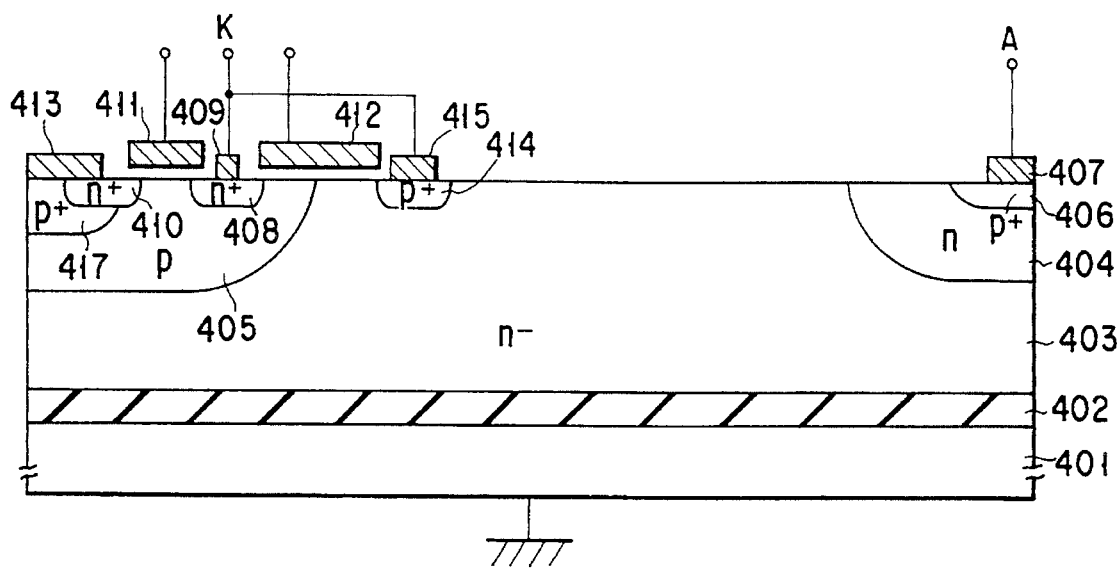
FIG. 84A is a sectional view showing a lateral MCT according to still another embodiment of the present invention.

FIG. 84A is a sectional view showing a lateral MCT according to still another embodiment of the present invention.

The lateral MCT of this embodiment is different from the embodiment in FIG. 83A in that a p⁺-contact layer 417 is formed on the surface of the p-base layer 405 below a floating electrode 413. The lateral MCT having the above structure has the same effect as in the embodiment of FIG. 83A. In addition, the resistance of a p-base layer 405 from the p⁺-contact layer 417 to the floating electrode 413 can be reduced.

A method of manufacturing the lateral MCT according to this embodiment will be described below. A high-resistant n-wafer as the n⁻-base layer 403 is oxidized to form an insulating film 402.

The n⁻-wafer is directly connected to a support substrate 401. Then, the n⁻-wafer is lapped to a predetermined thickness, such as about 4 to 15 μm.

After an n-buffer layer 404 having a thickness of about 4 μm is formed, a gate oxide film (not shown) is formed by thermal oxidation.

Then, a polysilicon film is deposited on the entire surface, and this polysilicon film is etched to form gate electrodes 411 and 412. Ion implantation is performed using the gate electrodes 411 and 412 as masks to form the p-base layer 405 having a depth of about 4 μm.

The high-concentration p⁺-contact layer 417 is formed by diffusion in the p-base layer 405. Subsequently, a p⁺-emitter layer 406 is formed by diffusion in the n-buffer layer 404. In addition, a p⁺-well layer 414 for extracting holes is formed by diffusion in the surface of the n⁻-base layer 403 in the region between the n-buffer layer 404 and the p-base layer 405.

An n⁺-emitter layer 408 and an n⁺-well layer 410 are formed by diffusion in the p-base layer 405. Finally, electrodes 407, 409, 413, and 415 are formed, and the lateral MCT is completed.

Figure 84B:
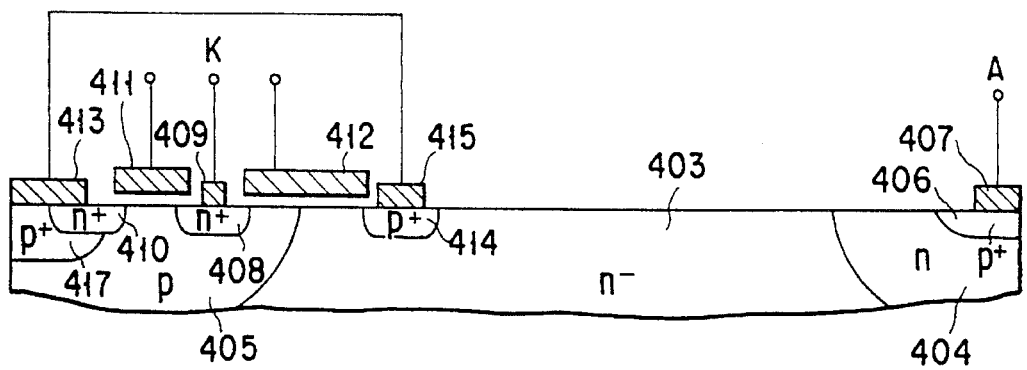
FIG. 84B is a sectional view showing part of a modification of the embodiment shown in FIG. 84A.

FIG. 84B is a partially sectional view showing the modification according to the embodiment shown in FIG. 84A. The structure in this modification is the same as that shown in FIG. 84A except that the hole discharge electrode 415 is directly connected not to the cathode electrode 409, but to the floating electrode 413. The same reference numerals denote the same parts as in FIG. 84A, and a detailed description thereof will be omitted.

In the modification shown in FIG. 84B, as in FIG. 83B, the hole discharge electrode 415 is kept floating until a positive voltage is applied to the OFF gate electrode 411 and a channel is formed below the OFF gate electrode 411. That is, according to this modification, since the hole discharge electrode 415 does not influence the device during ON operation of the device, a predetermined ON operation can be certainly obtained.

FIG. 85 is a sectional view showing a lateral high-breakdown-voltage semiconductor device according to still another embodiment of the present invention. The lateral high-breakdown-voltage semiconductor device of this embodiment is different from the embodiment in FIG. 83A in that the region of a p⁺-well layer 414 for extracting holes upon turn-off operation can operate as an IGBT.

That is, an n⁺-source layer 418 is formed in the p⁺-well layer 414, and the hole discharge electrode 415 connected to a cathode electrode 409 is formed on this n⁺-source layer 418. In addition, a gate electrode 419 connected to the ON gate electrode 412 is formed on the p⁺-well layer 414 in the region between the n⁺-source layer 418 and an n⁻-base layer 403 through an gate insulating film (not shown).

According to the lateral high-breakdown-voltage semiconductor device having the above structure, the IGBT is constituted by the n⁻-base layer 403, the p-base layer 405, the n⁺-emitter layer 408, the p⁺-well layer 414, and the n⁺-source layer 418. Therefore, the ON resistance can be reduced as compared with the lateral high-breakdown-voltage semiconductor devices shown in FIGS. 83A and 84A.

FIG. 86 is a sectional view showing a lateral high-breakdown-voltage semiconductor device according to still another embodiment of the present invention.

The lateral high-breakdown-voltage semiconductor device of this embodiment is different from the embodiment in FIG. 85 in that an n⁺-emitter layer 408 and a p-base layer 405 are short-circuited not by an n-MOS transistor, but by a p-MOS transistor.

That is, a p⁺-source layer 420 is selectively formed in the surface of the n⁺-emitter layer 408, and a gate electrode 421 is formed on the surface of the n⁺-emitter layer 408 in the region between the p⁺-source layer 420 and the p-base layer 405.

In the lateral high-breakdown-voltage semiconductor device wherein an IGBT and an MCT are formed together, if the MCT is turned off, and then the IGBT is turned on, a current concentration can be prevented upon turn-off operation and the turn-off capability can be greatly improved.

Figure 87:
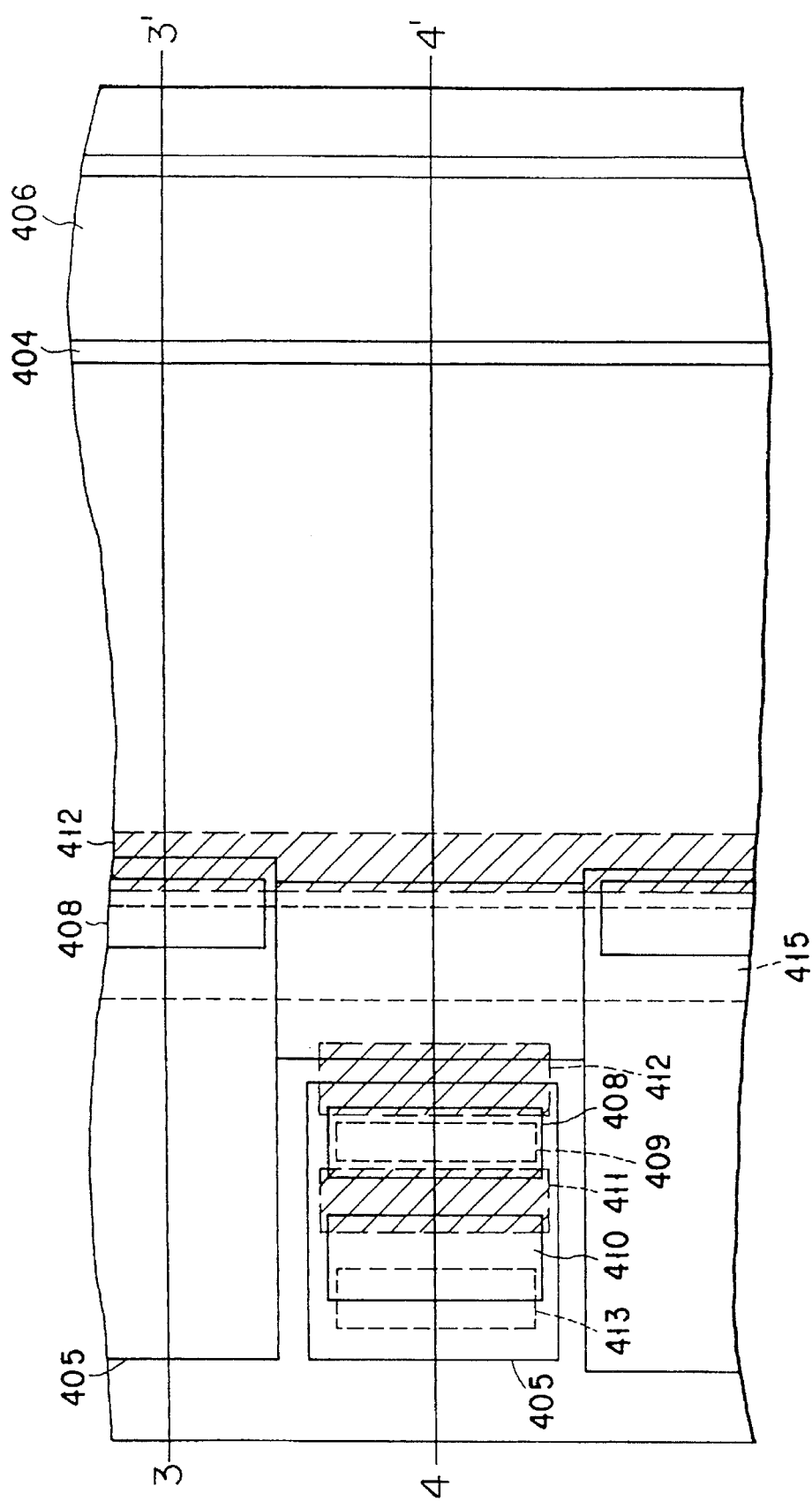
FIG. 87 is a plan view showing a lateral high-breakdown-voltage semiconductor device according to still another embodiment of the present invention.

FIG. 87 is a plan view showing a lateral high-breakdown-voltage semiconductor device according to still another embodiment of the present invention, and FIG. 88 is a sectional view taken along the line A—A' of FIG. 87. Note that a sectional view taken along the line B—B' of FIG. 87 is the same as shown in FIG. 83A.

In this embodiment, since IGBT portions and MCT portions are alternately arranged, the lateral high-breakdown-voltage semiconductor device combining the advantage of both the IGBT and the MCT can be realized.

Figure 89:
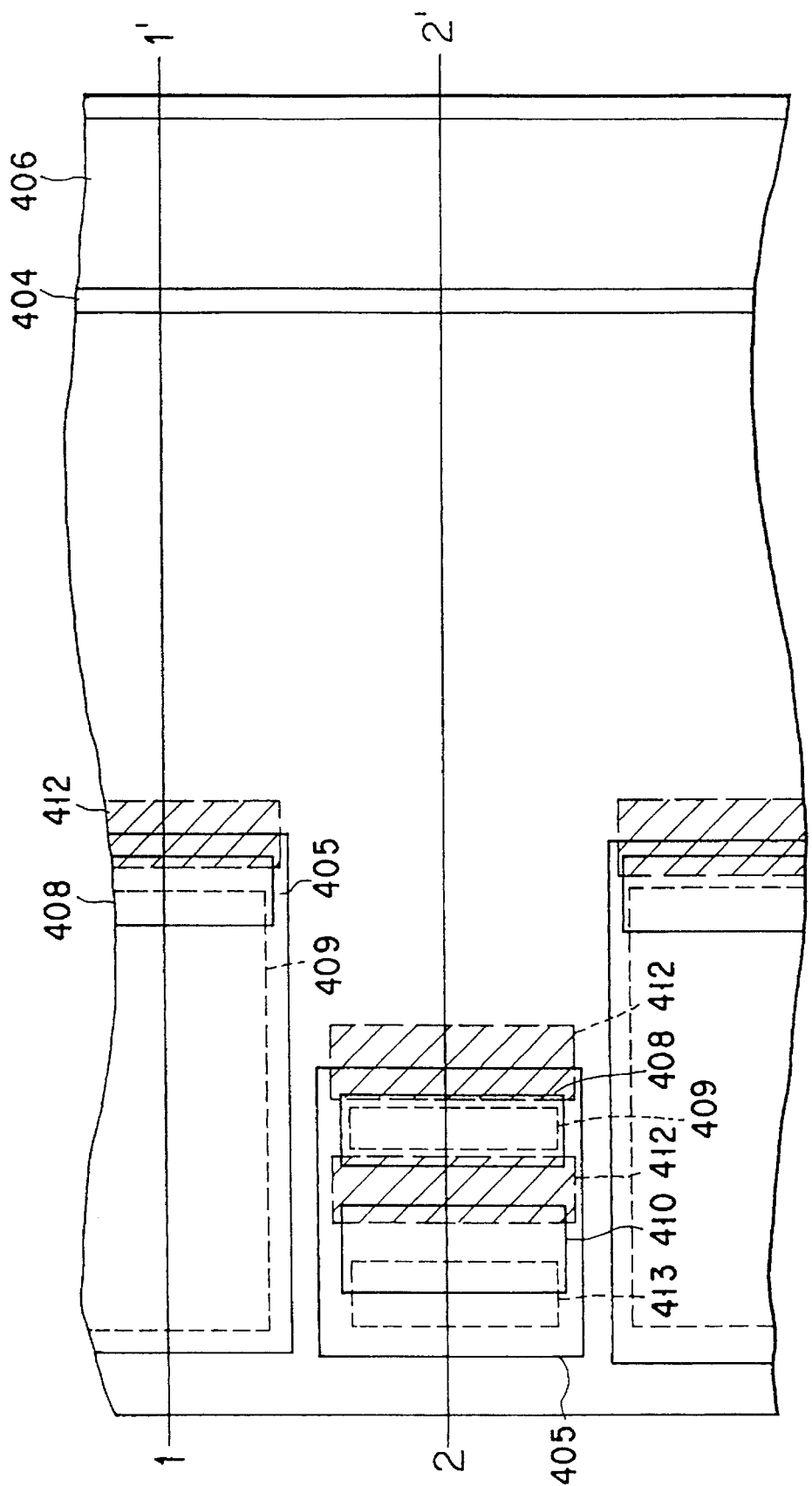
FIG. 89 is a plan view showing a lateral high-breakdown-voltage semiconductor device according to still another embodiment of the present invention.

FIG. 89 is a plan view showing a lateral high-breakdown-voltage semiconductor device according to still another embodiment of the present invention, and FIGS. 90 and 91 are sectional views taken along the lines C—C' and D—D' of FIG. 89, respectively.

In the lateral high-breakdown-voltage semiconductor device according to this embodiment, the n⁻-base layer 403 is made thin, and an IGBT for extracting a hole current and an MCT capable of flowing a large current are alternately formed in a two-dimensional pattern, thereby increasing the current capacity.

FIG. 92 is a sectional view showing a lateral high-breakdown-voltage semiconductor device according to still another embodiment of the present invention. In the lateral high-breakdown-voltage semiconductor device of this embodiment, holes injected from a p⁺-emitter layer 406 to an n⁻-base layer 403 are discharged outside the device through a p-base layer 405, a floating electrode 422, an n⁺-well layer 410, a channel below an OFF gate electrode 411, an n⁺-emitter layer 408, and a cathode electrode 409. In this case, the discharge path of holes is shortened as compared with a conventional discharge path, thereby improving the turn-off capability.

FIG. 93 is a sectional view showing a lateral high-breakdown-voltage semiconductor device according to still another embodiment of the present invention. In this embodiment, an n⁻-base layer 403 is formed on an insulating film not directly, but through a p⁻-semiconductor layer 423.

According to the embodiments shown in FIGS. 83A to 93, a semiconductor layer of a second conductivity type short-circuited to an emitter layer of a first conductivity type is formed in a base layer of the first conductivity type, so that a large number of majority carriers of the emitter layer of the second conductivity type, stored in the base layer of the first conductivity type, are discharged outside the device without going through a base layer of the second conductivity type, thereby improving the turn-off capability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high-frequency MOS field effect transistor comprising:
   a substrate comprising a first layer of an insulator material and a second layer of a semiconductor material;
   an active layer of said semiconductor material formed on a surface of said first layer;
   a source layer of a first conductivity type formed on a surface of said active layer and extending to said first layer;
   a source electrode connected to said source layer;
   a drain layer of the first conductivity type formed in said active layer and extending from said active layer surface to said first layer and not in contact with said source layer;
   a drain electrode connected to said drain layer;
   a base layer of a second conductivity type formed in said active layer extending from said surface of said active layer to said first layer so as to induce an inverted layer of the first conductivity type between said source and drain layers;
   a gate insulating film formed on said base layer;
   a gate electrode formed on a surface of said gate insulating film over said base layer;
   a short-circuiting layer formed in said active layer surface adjacent to said source layer to interconnect said base layer and said source electrode;
   a connecting member of an electrically and thermally conductive material extending through said first layer to electrically and thermally connect said source electrode to said second layer; and
   means for grounding said second layer.

2. The transistor according to claim 1, wherein said drain electrode has an extending portion opposite said source electrode with an insulating layer therebetween.

3. The transistor according to claim 1, wherein said source layer comprises a plurality of source layer portions and said short-circuiting layer comprises a plurality of short circuiting layer portions, said source layer portions and short-circuiting layer portions being alternately arranged.

4. The transistor according to claim 1, wherein said connecting member extends through a trench formed in said first layer, said trench being not completely filled with said connecting member.

5. A field effect transistor comprising:
   a substrate;
   an active layer arranged on said substrate and essentially consisting of a semiconductor material;
   first and second base layers of a second conductivity type formed in a surface of said active layer so as to be in contact with each other, said first base layer having an electrical resistance higher than that of said second base layer and being arranged on said substrate;
   a source layer of a first conductivity type formed in a surface of said second base layer;
   a source electrode connected to said source layer;
   a drain layer of the first conductivity type formed in a surface of said first base layer;
   a drain electrode connected to said drain layer; and
   a gate electrode facing said second base layer through a gate insulating film for inducing an inverted layer of the first conductivity type in said second base layer between said source and drain layers, wherein a depth, W, and an impurity concentration, N, of said first base layer between said drain layer and said substrate are such that a depletion layer formed in said first base layer extends from a junction between said drain and first base layers to said substrate in a thermal equilibrium state when a voltage, V, applied between said source and drain electrodes is zero volts and thus also in an operation state when said inverted layer is formed.

6. The transistor according to claim 5, wherein said depth, W, and impurity concentration, N, are determined according to:

$$W < \{2\epsilon(V_{bi} - 2kT/q + V)/(qN)\}^{1/2},$$

where $\epsilon$ is a dielectric constant of said active layer, q is an elementary electric charge, k is Boltzman's constant, V is said voltage applied between said source and drain electrodes, and $V_{bi}$ is a potential between said drain and first base layers.

7. The transistor according to claim 5, wherein said drain layer is arranged in a spaced relation with said second base layer, and said depletion layer extends from said drain layer to said second base layer in said operation state.

8. The transistor according to claim 7, wherein said depletion layer extends from said drain layer to said second base layer in said thermal equilibrium state.

9. The transistor according to claim 5, wherein said drain layer contacts said second base layer.

10. The transistor according to claim 5, wherein said substrate comprises a first layer essentially consisting of a material having a lower dielectric constant than that of said semiconductor material of said active layer, said first and second base layers being arranged on said first substrate layer.

11. The transistor according to claim 5, wherein said substrate comprises an insulative surface on which said first and second base layers are arranged.

12. The transistor according to claim 11, wherein said substrate comprises a first layer essentially consisting of an insulative material and a backside layer essentially consisting of a semiconductor material, said first layer having said insulative surface.

13. The transistor according to claim 12, further comprising a connecting member essentially consisting of a thermally conductive material extending through said first substrate layer into thermal connection with said active and backside layers.

14. The transistor according to claim 5, wherein said substrate comprises a first layer essentially consisting of a low-resistant semiconductor material of the second conductivity type, said first base layer being arranged on said first substrate layer.

15. A field effect transistor comprising:

a substrate, an active layer arranged on said substrate and essentially consisting of silicon;

first and second base layers of a second conductivity type formed in a surface of said active layer in contact with each other, said first base layer having an electrical resistance higher than that of said second base layer and arranged on said substrate;

a source layer of a first conductivity type formed in a surface of said second base layer;

a source electrode connected to said source layer;

a drain layer of the first conductivity type formed in a surface of said first base layer;

a drain electrode connected to said drain layer; and a gate electrode facing said second base layer through a gate insulating film for inducing an inverted layer of the first conductivity type in said second base layer between said source and drain layers, wherein a depth, W, and an impurity concentration, N, of said first base layer between said drain layer and said substrate are determined such that a depletion layer formed in said first base layer extends from a junction between said drain and first base layers to said substrate in a thermal equilibrium state when a voltage, V, applied between said source and drain electrodes is zero volts and thus also in an operation state when said inverted layer is formed.

16. The transistor according to claim 15, wherein said depth, W, and impurity concentration, N, are determined according to:

$$W^2 N/(0.8+V) < 2\epsilon/q,$$

where $\epsilon$ is a dielectric constant of said active layer, q is an elementary electric charge, V is said voltage applied between said source and drain electrodes, and $2\epsilon/q$ is about $1.25 \times 10^7$.

17. The transistor according to claim 15, wherein said drain layer is arranged in spaced relation with said second base layer, and said depletion layer extends from said drain layer to said second base layer in said operation state.

18. The transistor according to claim 17, wherein said depletion layer extends from said drain layer to said second base layer in said thermal equilibrium state.

19. The transistor according to claim 15, wherein said substrate comprises a first layer essentially consisting of an insulative material and a backside layer essentially consisting of a semiconductor material, said first base layer being arranged on said first and second layers.

20. The transistor according to claim 19, further comprising a connecting member essentially consisting of a thermally conductive material extending through said first layer into thermal connection with said active and backside layers.

* * * * *